US006797906B2

(12) United States Patent
Ohashi

(10) Patent No.: US 6,797,906 B2
(45) Date of Patent: Sep. 28, 2004

(54) MEMBRANE SWITCH, KEY SWITCH USING MEMBRANE SWITCH, KEYBOARD HAVING KEY SWITCHES, AND PERSONAL COMPUTER HAVING KEYBOARD

(75) Inventor: Kazuki Ohashi, Hashima (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 10/384,011

(22) Filed: Mar. 10, 2003

(65) Prior Publication Data

US 2003/0173201 A1 Sep. 18, 2003

(30) Foreign Application Priority Data

Mar. 15, 2002 (JP) ........................................ 2002-71761
Mar. 15, 2002 (JP) ........................................ 2002-71781
Mar. 22, 2002 (JP) ........................................ 2002-81157
Mar. 29, 2002 (JP) ........................................ 2002-94432

(51) Int. Cl.[7] ......................... H01H 13/702; H05K 7/00
(52) U.S. Cl. ....................... 200/517; 200/5 A; 200/306; 200/344; 361/679
(58) Field of Search ................................ 200/5 R, 5 A, 200/305, 304, 306, 344, 345, 512–517; 361/679–684; 400/472–496; 345/156–184

(56) References Cited

U.S. PATENT DOCUMENTS 3,898,421 A * 8/1975 Suzumura ................... 200/517
3,909,564 A * 9/1975 Scheingold et al. ........ 200/5 E
4,046,975 A * 9/1977 Seeger, Jr. .................. 200/515
4,492,838 A * 1/1985 Fukukura .................... 200/517
5,422,447 A * 6/1995 Spence ....................... 200/5 A
5,561,278 A * 10/1996 Rutten .................... 200/512 X
5,669,486 A * 9/1997 Shima .................... 200/512 X
5,895,900 A * 4/1999 Okada et al. ........... 200/306 X
6,504,120 B2 * 1/2003 Hsu ........................... 200/344
2001/0027914 A1 10/2001 Hsu

FOREIGN PATENT DOCUMENTS

JP 10-172380 6/1998

* cited by examiner

*Primary Examiner*—James R. Scott
(74) *Attorney, Agent, or Firm*—Oliff & Berridge, PLC

(57) ABSTRACT

A membrane switch is constituted of a lower membrane sheet, an upper membrane sheet and a spacer sheet which is inserted between both sheets, and a spring sheet which is formed of a thin metal plate arranged over the upper membrane sheet. A pair of slits formed in the spring sheet at positions corresponding to both sides of an upper electrode of the upper membrane sheet defines a switch portion in the spring sheet. When a key top is pushed down, the switch portion of the spring sheet is pushed down by a pushdown projection of the membrane switch to bring the upper electrode into contact with a lower electrode.

25 Claims, 35 Drawing Sheets

MEMBRANE SWITCH, KEY SWITCH USING MEMBRANE SWITCH, KEYBOARD HAVING KEY SWITCHES, AND PERSONAL COMPUTER HAVING KEYBOARD

BACKGROUND OF THE INVENTION

1. Field of the Invention (1) The present invention relates to a membrane switch having a so-called three-layered structure consisting of an upper membrane sheet, a lower membrane sheet and a spacer layer formed between both sheets, and more particularly to a membrane switch which can prevent plastic deformation of the upper membrane sheet which is pushed at the time of performing switching and can maintain a resilient restoring force for a long period, a key switch using such a membrane switch, a key board having such key switches, and a personal computer having the keyboard.

(2) Further, the present invention relates to a membrane switch which ensures stable pushing of an upper membrane sheet at the time of performing switching thus providing a stable switching operation, a key switch using such a membrane switch, a key board having such key switches, and a personal computer having the keyboard.

(3) Further, the present invention relates to a membrane switch which is capable of surely fixing a membrane sheet by adhesion to an adhesive surface of a support plate always in a flat posture without leaving bubbles between a lower surface of the lower membrane sheet of membrane switch and the adhesive surface of the support plate at the time of fixing the lower membrane sheet to the support plate, a key switch using such a membrane switch, a key board having such key switches, and a personal computer having the keyboard.

(4) Still further, the present invention relates to a key switch which guides the vertical movement of a key top by way of a pair of link members, and more particularly to a key switch which is configured to bias a key top upwardly by way of a spring member formed of a metal thin resilient plate, a key board having such key switches, and a personal computer having the keyboard.

2. Description of Related Art (1) Conventionally, there have been proposed various membrane switches each having a three-layered structure which is comprised of a lower membrane sheet forming a lower electrode on an upper surface thereof, an upper membrane sheet forming an upper electrode on a lower surface thereof corresponding to the lower electrode, and a spacer sheet interposed between both upper and lower membrane sheets and served for making the lower electrode and the upper electrode spaced apart from each other through a switching hole formed therein corresponding to the lower electrode and the upper electrode.

In this type of membrane switch, to perform a switching operation, the upper electrode portion of the upper membrane sheet is pushed down from above using a finger directly or indirectly by way of a rubber spring, a key top or the like. Due to this switching operation, the upper electrode formed on the lower surface of the upper membrane sheet is brought into contact with the lower electrode formed on the upper surface of the lower membrane sheet through the switching hole formed in the spacer sheet so that a given switching operation is performed.

Here, there may be a case that a situation in which goods are placed on the membrane switch or a situation in which a lid cover is mounted on the membrane switch while placing goods on the membrane switch is left as it is for a long time.

In such a case, the upper membrane sheet is constituted of a resin film made of polyethylene terephthalate or the like in general and hence, the upper membrane sheet is deformed by pushing with an extremely small load. Accordingly, when the goods are placed on the membrane switch, a switch portion which corresponds to the upper electrode of the upper membrane sheet is pushed by way of the goods. As a result, a state that the upper electrode of the upper membrane sheet and the lower electrode of the lower membrane sheet are brought into contact with each other, that is, a state that the switch is turned on is continued for a long period. Here, the switching portion corresponding to the upper electrode of the upper membrane sheet is in a state that the switch portion is pushed downwardly and deformed and hence, such deformed state by pushing is held for a long period.

When the deformed state of the switch portion by pushing in the upper membrane sheet is left as it is for a long period, the switch portion is subjected to the plastic deformation and maintains the deformed state by pushing and it is no more possible to restore the original state. In such a case, the upper electrode of the upper membrane sheet and the lower electrode of the lower membrane sheet assume a switch-on state in which they are always in contact with each other and hence, there arises a drawback that the membrane switch no more performs a switching function.

The present invention has been made to solve the above-mentioned drawback of the prior art and it is an object of the present invention to provide a membrane switch which can prevent the plastic deformation of an upper membrane sheet which is pushed at the time of performing switching thereby enabling the holding of the resilient restoring force for a long period, a key switch using such a membrane switch, a keyboard having the key switches, and a personal computer having the keyboard.

(2) Further, the membrane switch has a flat laminate sheet structure, wherein the upper membrane sheet is also formed flat in general. In such a membrane switch, when the upper membrane sheet is pushed directly using a finger, although a pushing portion is formed on an upper surface of the upper membrane sheet by printing or the like for facilitating finding of the pushing portion with eyes, it is not always possible to push an appropriate position of the pushing portion with the finger and hence, it is difficult to perform a stable switching operation.

Further, when the flat upper membrane sheet is indirectly pushed by way of a so-called rubber spring or a key top which is generally known, there exist the irregularities in the accuracy of size attributed to manufacturing thereof and such irregularities in the accuracy of size directly affects influences on the pushing characteristics of the membrane switch. Accordingly, although it is possible to push the appropriate position of the pushing portion of the upper sheet by way of the rubber spring or the key top so long as the accuracy in size of the rubber spring or the key top falls within proper range, when the accuracy in size does not fall within proper range, there may be a case that the upper sheet is pushed in a state that the rubber spring or the key top is inclined. In such a case, it is difficult to perform the stable switching operation in the manner as the above-mentioned case.

The present invention has been made to solve the above-mentioned drawback of the prior art and it is an object of the present invention to provide a membrane switch which can push the upper membrane sheet in a stable manner at the time of performing switching thereby ensuring the stable switching operation, a key switch using such a membrane switch, a keyboard having the key switches, and a personal computer having the keyboard.

(3) Further, the lower membrane sheet, the spacer sheet and the upper membrane sheet which constitute the membrane switch are formed of a polyethylene terephthalate film in general and their thickness is small. Accordingly, the membrane switch per se has large resiliency and hence, handling of the membrane switch is cumbersome and difficult in many case.

It is not often that such a membrane switch is used in a single form and the membrane switch is generally used in a state that the membrane switch is mounted on a support plate or the like. In many cases, the membrane switch is fixed by adhesion to the support plate or the like using an adhesive agent or a pressure sensitive adhesive double coated tape. To fix the membrane switch to the support plate or the like by adhesion, an adhesive agent is applied to the lower surface of the lower membrane sheet or a pressure sensitive adhesive double coated tape is laminated to the lower surface of the lower membrane sheet and then the lower membrane sheet is fixed by adhesion to the support plate or the like.

However, since the membrane switch has the large resiliency as mentioned previously, it is difficult to handle the membrane switch in a flat state. Accordingly, in fixing the membrane switch to the support plate or the like by adhesion, there exists a considerable fear that bubbles remain between the lower membrane sheet and the support plate or the like.

When the bubbles remain between the lower membrane sheet and an adhering surface of the support plate or the like, irregularities are formed on a surface of the membrane switch thus giving rise to an unstable switching operation.

Further, when bubbles remain below the lower membrane sheet corresponding to the switching hole formed in the spacer sheet, there may arise a state in which the upper electrode of the upper membrane sheet and the lower electrode of the lower membrane sheet are brought into contact with each other. In such a case, a switch-on state is continued and hence, the membrane switch can no more perform its function as a switch.

The present invention has been made to solve the above-mentioned drawback of the prior art and it is an object of the present invention to provide a membrane switch which can surely fix the membrane sheet by adhesion to the adhering surface of the support plate while always holding the membrane sheet in a flat state without leaving bubbles between the lower surface of the lower membrane sheet and the adhering surface of the support plate at the time of fixing the lower membrane sheet of the membrane switch by adhesion to the support plate or the like, a key switch using such a membrane switch, a keyboard having the key switches, and a personal computer having the keyboard.

(4) Further, conventionally, there have been proposed various types of key switches which are attached to a keyboard of a notebook type personal computer and are configured such that the vertical movement of each key top is guided by a pair of link members.

For example, Japanese Laid-open Patent Publication 172380/1998 discloses a key switch in which the vertical movement of a key top is guided by way of a pair of links having gears which are movably engaged with a lower surface of the key top on which a pushdown projection is formed and an upper surface of a base mold, and a rubber sheet formed of silicon rubber or the like is extended in a suspended manner between projections for suspending rubber sheet which are formed on respective links having gears.

In the above-mentioned key switch, in a state that the key top is not pushed down, the pushdown projection which is brought into contact with the rubber sheet is biased upwardly due to a resilient force of the rubber sheet so as to hold the key top in the non-pushdown state. When the switching operation is performed, along with the pushing down of the key top, the rubber sheet is pushed down by way of the pushdown projection so that, due to the pushdown projection, switching is performed by a switching portion of the membrane sheet which is disposed below the base mold along with the rubber sheet.

However, in the key switch described in the above-mentioned Japanese Laid-open Patent Publication 172380/1998, the rubber sheet is used as a spring member to bias the key top upwardly. This rubber sheet is liable to easily receive the influence attributed to the use environment such as temperature, humidity or the like and hence, the rubber sheet is degraded in a relatively short period and exhibits poor durability. Further, to hold the key top at the non-pushdown position, as shown in FIG. 2 of Japanese Laid-open Patent Publication 172380/1998, it is necessary to bias the key top upwardly using the resilient force of the rubber sheet by always bringing the pushdown projection of the key top into contact with an upper surface of the rubber sheet. In such a situation, the rubber sheet is always subjected to the elastic deformation. When the rubber sheet is always held in such an elastically deformed state, along with the fact that the rubber sheet exhibits poor durability, the rubber sheet is subjected to a permanent deformation and does not return to the original state (state in which the rubber sheet has an original elastic force). Accordingly, the elastic force of the rubber sheet is gradually decreased and hence, the non-pushdown position of the key top is also gradually moved to a downward position. As a result, there is a possibility that the characteristics of the key top such as the operability of the key or the like are changed.

In performing the switching operation with the switching portion of the membrane sheet disposed below the base mold, the constitution which pushes the switch portion together with the rubber sheet by way of the pushdown projection which is formed on the lower surface of the key top is adopted. To achieve such a constitution, as shown in FIG. 1 and FIG. 2 of Japanese Laid-open Patent Publication 172380/1998, it is necessary to set the length of the pushdown projection to a length approximately three times as large as a thickness of the key top such that the pushdown projection projects sufficiently downwardly from a lower end of the key top. Accordingly, the height of the key top at the non-pushdown position becomes inevitably large and hence, it is extremely difficult to reduce the thickness of the key switch.

The present invention has been made to solve the above-mentioned drawback of the prior art and it is an object of the present invention to provide a key switch which can ensure the stable characteristics such as key operability for a long period without receiving influence attributed to the use environment and, at the same time, can easily reduce the thickness thereof by using a spring member formed of a metal thin resilient plate in guiding the vertical movement of a key top, a keyboard having the key switch, and a personal computer having the keyboard.

SUMMARY OF THE INVENTION (1) To accomplish the above purposes, according to one aspect of the present invention, there is provided a membrane switch which comprises a lower membrane sheet which forms a lower electrode on an upper surface thereof, an upper membrane sheet which forms an upper electrode on a lower surface thereof corresponding to the lower electrode, and a spacer layer which is provided between the lower membrane sheet and the upper membrane sheet and in which a switching hole is formed corresponding to the lower electrode and the upper electrode, and makes the lower electrode and the upper electrode spaced apart from each other by way of the switching hole, wherein a spring sheet formed of a thin metal plate is arranged over the upper membrane sheet.

In the above-mentioned membrane switch, since the spring sheet formed of the thin metal plate is arranged over the upper membrane sheet, even when a state in which goods are placed on the upper membrane sheet is held for a long period, the upper membrane sheet is not plastically deformed due to a large resilient force of the spring sheet so that it is possible to perform the reliable switching operation while holding a resilient restoring force over a long period.

Here, the above-mentioned spacer layer may be formed between the upper membrane sheet and the lower membrane sheet, and may be constituted of an adhesive agent layer which adheres both membrane sheets in a laminated manner or is constituted of a spacer sheet which is formed of a sheet equal to the upper membrane sheet and the lower membrane sheet.

Further, it is preferable that a pair of slits are formed in the spring sheet corresponding to both sides of the upper electrode of the upper membrane sheet. In such a membrane switch, since a pair of slits are formed corresponding to both sides of the upper electrode of the upper membrane sheet, even when a pushdown load is applied to a switching portion of the spring sheet corresponding to the upper electrode by way of a finger, a rubber spring, a key top or the like, it is possible to concentrate the pushdown load to the switch portion by preventing the pushdown load from being dispersed over the whole spring sheet. Accordingly, it is possible to rapidly perform the switching operation by bringing the upper electrode of the upper membrane sheet and the lower electrode of the lower membrane sheet into contact with each other with a small pushdown load.

Further, according to another aspect of the present invention, there is provided key switches each of which comprises a key top which forms a pushdown projection on a lower surface thereof, a holder member which is arranged below the key top and forms an opening therein corresponding to the pushdown projection, a first link member and a second link member which are movably connected to and engaged with a lower surface of the key top and the holder member and guide the vertical movement of the key top, a spring member which biases the key top upwardly, and a membrane switch including a lower membrane sheet which is arranged below the holder member and forms a lower electrode on an upper surface thereof corresponding to the opening, an upper membrane sheet which forms an upper electrode on a lower surface thereof corresponding to the lower electrode, and a spacer layer which is disposed between the lower membrane sheet and the upper membrane sheet, forms a switching hole corresponding to the lower electrode and the upper electrode, and makes the lower electrode and the upper electrode spaced apart from each other by way of the switching hole, wherein the key switch performs a switching operation such that by pushing down the key top against a biasing force of the spring member, the upper electrode and the lower electrode are brought into contact with each other by way of the pushdown projection through the opening, and a spring sheet formed of a thin metal plate is arranged over the upper membrane sheet.

With respect to the above-mentioned key switch, by pushing down the key top against the biasing force of the spring member, the upper electrode of the upper membrane sheet and the lower electrode of the lower membrane sheet are brought into contact with each other by way of the pushdown projection through the opening member so as to perform the switching operation. Since the spring sheet made of metal thin plate is arranged over the upper membrane sheet in performing such a switching operation, even when a state in which goods are placed on the key top is held for a long period, the upper membrane sheet is not plastically deformed due to the large resilient force of the spring sheet whereby the elastic restoring force is maintained over a long period thus ensuring the reliable switching operation.

Further, according to another aspect of the present invention, there is provided a personal computer which comprises a key board which inputs various data such as characters, symbols or the like, the keyboard including key switches each of which comprises a key top which forms a pushdown projection on a lower surface thereof, a holder member which is arranged below the key top and forms an opening therein corresponding to the pushdown projection, a first link member and a second link member which are movably engaged and connected to a lower surface of the key top and the holder member and guide the vertical movement of the key top, a spring member which biases the key top upwardly, and a membrane switch which includes a lower membrane sheet which is arranged below the holder member and forms a lower electrode on an upper surface thereof corresponding to the opening, an upper membrane sheet which forms an upper electrode on a lower surface thereof corresponding to the lower electrode, and a spacer layer which is disposed between the lower membrane sheet and the upper membrane sheet, forms a switching hole corresponding to the lower electrode and the upper electrode, and makes the lower electrode and the upper electrode spaced apart from each other by way of the switching hole, wherein the key switch performs a switching operation such that by pushing down the key top against a biasing force of the spring member, the upper electrode and the lower electrode are brought into contact with each other by way of the pushdown projection through the opening, and the key switch includes a spring sheet made of a thin metal plate which is arranged over the upper membrane sheet; display means which displays characters and symbols or the like; and control means which makes the display means display the characters, symbols or the like based on input data from the keyboard.

In the above-mentioned personal computer, when various data such as characters, symbols or the like are inputted from the key switch of the keyboard, the characters, the symbols and the like are displayed by display means through the control by the control means. Here, the personal computer is provided with the keyboard which is attached with the above-mentioned key switch, an advantageous effect similar to that of the above-mentioned case can be obtained.

(2) Further, in the above-mentioned membrane switch, it is preferable that a semispherical bulging portion is formed in the spring sheet corresponding to the upper electrode. In such a membrane switch, the spring sheet formed of a thin metal plate is arranged over the upper membrane sheet. Since the semispherical bulging portion is formed on the spring sheet corresponding to the upper electrode, when the bulging portion is pushed using a finger, a rubber spring, a key top or the like at the time of performing the switching operation, the upper membrane sheet is pushed by means of a connecting portion with the spring sheet which is present around the bulging portion, and the upper electrode of the upper membrane sheet is brought into contact with the lower electrode of the lower membrane sheet through the switching hole of the spacer layer thus performing the switching operation. Here, the upper membrane sheet is pushed by a connecting portion between the bulging portion and the spring sheet, even when the pushing position of the bulging portion due to a finger, a rubber spring, a key top or the like is disposed at a portion other than a center portion of the bulging portion, it is possible to bring the upper electrode of the upper membrane sheet and the lower electrode of the lower membrane sheet into contact with each other reliably and in a stable manner. Due to such a constitution, it is possible to perform the switching operation in a stable manner.

Further, it is preferable that a pair of slits are formed at both sides of the bulging portion in the above-mentioned spring sheet. In such a membrane switch, since a pair of slits are formed at both sides of the bulging portion formed on the spring sheet, even when a pushdown load is applied to the bulging portion of the spring sheet corresponding to the upper electrode by way of a finger, a rubber spring, a key top or the like, it is possible to concentrate the pushdown load to a connecting portion between the bulging portion and the spring sheet by preventing the pushdown load from being dispersed over the whole spring sheet. Accordingly, it is possible to perform the switching operation rapidly by bringing the upper electrode of the upper membrane sheet and the lower electrode of the lower membrane sheet into contact with each other with a small pushdown load.

Further, it is preferable that a pair of resilient cut-and raised lugs are formed in the spring sheet corresponding to the upper electrode. In such a membrane switch, a spring sheet formed of a thin metal plate is arranged over the upper membrane sheet and a pair of resilient cut-and-raised lugs are formed in the spring sheet corresponding to the upper electrode and hence, when respective resilient cut-and-raised lugs are pushed by a finger, a rubber spring, a key top or the like at the time of performing the switching operation, the upper membrane sheet is pushed by way of the connecting portion between the resilient cut-and-raised lugs and spring sheet, and the upper electrode of the upper membrane sheet is brought into contact with the lower electrode of the lower membrane sheet through the switching hole of the spacer layer thus performing the switching operation. Here, since the upper membrane sheet is pushed by the connection portions formed between respective resilient cut-and-raised lugs and the spring sheet, even when both of the resilient cut-and-raised lugs are simultaneously pushed or when only one resilient cut-and-raised lug is pushed by a finger, a rubber spring, a key top or the like, it is possible to bring the upper electrode of the upper membrane sheet and the lower electrode of the lower membrane sheet into contact with each other surely and in a stable manner. Accordingly, the switching operation can be performed in a stable manner.

Here, it is preferable that a pair of slits are formed in the spring sheet at both sides of the resilient cut-and-raised lugs. In such a membrane switch, since a pair of slits are formed at both sides of the resilient cut-and-raised lugs formed on the spring sheet, even when a pushdown load is applied to the respective resilient cut-and-raised lugs of the spring sheet corresponding to the upper electrode by way of a finger, a rubber spring, a key top or the like, it is possible to concentrate the pushdown load to connecting portions between the resilient cut-and-raised lugs and the spring sheet by preventing the pushdown load from being dispersed over the whole spring sheet. Accordingly, it is possible to perform the switching operation rapidly by bringing the upper electrode of the upper membrane sheet and the lower electrode of the lower membrane sheet into contact with each other with a small pushdown load.

(3) Further, according to another aspect of the present invention, there is provided a membrane switch which comprises a lower membrane sheet which forms a lower electrode on an upper surface thereof, an upper membrane sheet which forms an upper electrode on a lower surface thereof corresponding to the lower electrode, and a spacer layer which is disposed between the lower membrane sheet and the upper membrane sheet, forms a switching hole therein corresponding to the lower electrode and the upper electrode, and makes the lower electrode and the upper electrode spaced apart from each other by way of the switching hole, wherein air grooves are formed in the spacer layer and, at the same time, air bleeding holes are formed in the lower membrane sheet such that the air bleeding holes are positioned inside the air grooves.

In the above-mentioned membrane switch, the air grooves are formed in the spacer layer and, at the same time, the air bleeding holes are formed in the lower membrane sheet such that the air bleeding holes are positioned inside the air grooves. Accordingly, at the time of fixing the lower membrane sheet by adhesion to the support plate or the like using an adhesive agent or a pressure sensitive adhesive double-sided tape, even when bubbles remain between a lower surface of the lower membrane sheet and an adhesive surface of the support plate, it is possible to leak such bubbles to the air grooves through the air bleeding holes. Accordingly, it is possible to surely fix the membrane sheet by adhesion to an adhesive surface of the support plate always in a flat state.

Here, the spacer layer may be formed between the upper membrane sheet and the lower membrane sheet and may be constituted of an adhesive agent layer which adheres both membrane sheets in a laminated manner. In such a case, the air grooves are formed in the adhesive agent layers. Further, the spacer layer may be constituted of a spacer sheet which is formed of a sheet used for forming the upper membrane sheet or the lower membrane sheet. In such a case, the air grooves are formed in the adhesive agent layer which is formed on the spacer sheet by coating.

Further, it is preferable that the air grooves formed in the spacer layer are communicated with the outside of the membrane switch. In such a case, bubbles which remain between a lower surface of the lower membrane sheet and an adhesive surface of the support plate leaks to the outside of the membrane switch through the air bleeding holes and the air grooves. Here, the air grooves formed in the spacer layer do not cause any problems even when the air grooves are not communicated with the outside of the membrane switch. In such a case, the bubbles which pass the air bleeding holes of the lower membrane sheet dwell in the inside of the air grooves and are alleviated by the whole air grooves.

Further, it is preferable that the air grooves are communicated with the outside and the switching hole and, at the same time, the air grooves are formed in a plural number using the switching hole as a start point, and the air bleeding holes are continuously formed in a plural number in and along respective air grooves. In such a membrane switch, the air grooves which are communicated to the outside as well as to the switching hole are formed in a plural number using the switching hole as a start point and, at the same time, the air bleeding holes are continuously formed in a plural number along respective air grooves. Accordingly, at the time of fixing the lower membrane sheet of the membrane switch by adhesion to a support plate or the like using an adhesive agent or a pressure sensitive adhesive double-sided tape, even when bubbles remain between a lower surface of the lower membrane sheet and an adhesive surface of the support plate in a broad range, it is possible to leak such bubbles to the outside through the air bleeding holes and the air grooves. Further, in performing the switching operation by pushing an upper surface of the upper electrode of the upper membrane sheet, it is possible to leak air in the inside of the switching hole to the outside through the air grooves and hence, it is possible to always perform the switching operation in a stable manner.

Further, it is preferable that the switching hole is formed larger than the lower electrode and at least one of a plurality of air bleeding holes is arranged in the inside of the switching hole. In such a membrane switch, the switching hole is formed larger than the lower electrode and at least one of a plurality of air bleeding holes is arranged in the inside of the switching hole and hence, at the time of fixing the lower membrane sheet of the membrane switch by adhesion to the support plate or the like using an adhesive agent or a pressure sensitive adhesive double-sided tape, even when bubbles remain in a portion which corresponds to the switching hole between a lower surface of the lower membrane sheet and an adhesive surface of the support plate, such bubbles can be rapidly and surely leaked to the outside through the air bleeding hole which is arranged in the inside of the switching hole, the switching hole and the air grooves.

Further, according to another aspect of the present invention, there is provided a key switch which comprise a key top which forms a pushdown projection on a lower surface thereof, a holder member which is arranged below the key top and forms an opening therein corresponding to the pushdown projection, a first link member and a second link member which are movably engaged with and connected to a lower surface of the key top and the holder member and guide the vertical movement of the key top, a spring member which biases the key top upwardly, and a membrane switch including a lower membrane sheet which is arranged below the holder member and forms a lower electrode on an upper surface thereof corresponding to the opening, an upper membrane sheet which forms an upper electrode on a lower surface thereof corresponding to the lower electrode, and a spacer layer which is disposed between the lower membrane sheet and the upper membrane sheet, forms a switching hole corresponding to the lower electrode and the upper electrode, and makes the lower electrode and the upper electrode spaced apart from each other by way of the switching hole, wherein the key switch performs a switching operation such that by pushing down the key top against a biasing force of the spring member, the upper electrode and the lower electrode are brought into contact with each other by way of the pushdown projection through the opening, and air grooves are formed in the spacer layer, and air bleeding holes are formed in the lower membrane sheet such that the air bleeding holes are arranged in the inside of the air grooves.

In the above-mentioned key switch, the previously-mentioned membrane switch is used as the membrane switch arranged below the holder member. Accordingly, in the same manner as the above-mentioned case, the air grooves are formed in the spacer layer and, at the same time, the air bleeding holes are formed in the lower membrane sheet such that the air bleeding holes are positioned inside the air grooves. Accordingly, at the time of fixing the lower membrane sheet of the membrane switch by adhesion to the support plate or the like using an adhesive agent or a pressure sensitive adhesive double-sided tape, even when bubbles remain between a lower surface of the lower membrane sheet and an adhesive surface of the support plate, it is possible to leak such bubbles to the air grooves through the air bleeding holes. Accordingly, it is possible to surely fix the membrane sheet by adhesion to an adhesive surface of the support plate always in a flat state.

Further, according to another aspect of the present invention, there is provided a personal computer which comprises a keyboard which inputs various data such as characters, symbols or the like, the keyboard including key switches each of which comprises a key top which forms a pushdown projection on a lower surface thereof, a holder member which is arranged below the key top and forms an opening therein corresponding to the pushdown projection, a first link member and a second link member which are movably engaged with and connected to a lower surface of the key top and the holder member and guide the vertical movement of the key top, a spring member which biases the key top upwardly, and a membrane switch including a lower membrane sheet which is arranged below the holder member and forms a lower electrode on an upper surface thereof corresponding to the opening, an upper membrane sheet which forms an upper electrode on a lower surface thereof corresponding to the lower electrode, and a spacer layer which is disposed between the lower membrane sheet and the upper membrane sheet, forms a switching hole corresponding to the lower electrode and the upper electrode, and makes the lower electrode and the upper electrode spaced apart from each other by way of the switching hole, wherein the key switch performs a switching operation such that by pushing down the key top against a biasing force of the spring member, the upper electrode and the lower electrode are brought into contact with each other by way of the pushdown projection through the opening, and air grooves are formed in the spacer layer and air bleeding holes are formed in the lower membrane sheet such that the air bleeding holes are positioned in the inside of the air grooves; display means which displays characters and symbols or the like; and control means which makes the display means display the characters, symbols or the like based on input data from the keyboard.

In the above-mentioned personal computer, when various data such as characters, symbols or the like are inputted from the key switch of the keyboard, the symbols and the like are displayed by display means through the control by the control means. Here, the personal computer is provided with the keyboard which is attached with the above-mentioned key switch, advantageous effect similar to that of the above-mentioned case can be obtained.

(4) Further, according to an other aspect of the present invention, there is provided a key switch which comprises a key top which forms a plurality of slide engaging portions on a lower surface thereof, a holder member which is arranged below the key top and forms a plurality of rotary engaging portions thereon, first and second link members which are engaged with the slide engaging portions of the key top and the rotary engaging portions of the holder member respectively, cross each other in an X shape as viewed from a side, and guides a vertical movement of the key top, a switching portion which performs a switching operation based on a pushdown operation of the key top, and a spring member which is formed of a thin resilient metal plate, biases the key top upwardly, and includes a pushing portion which performs the switching operation by acting on the switch portion at the time of pushing down the key top at a center portion thereof, wherein at least pushing portion of the spring member and a peripheral portion thereof are arranged in a concave shape as viewed from a side, and deformation action portions which deform the spring member in a U-shape at the time of pushing down the key top are provided to portions of the first link member and the second link member at sides thereof disposed closer to the rotary engaging portion sides than a crossing portion of both link members as viewed from a side.

In the above-mentioned key switch, with respect to the spring member which biases the key top upwardly and is formed of the thin resilient metal plate, at least the pushing portion and the peripheral portion thereof are arranged in a concave shape as viewed from a side and hence, it is possible to ensure the deformation direction of the spring member. Further, with respect to the first link member and the second link member, since the deformation action portions are provided to the portions closer to the rotary engaging portions of the holder member than the crossing portion of both link members as viewed from a side, at the time of pushing down the key top, the spring member is deformed in a U-shape due to the deformation action portions of the link members and, at the same time, the pushing portion of the spring member is lowered thus enabling the reliable switching operation. Further, since the spring member is formed of the thin resilient metal plate and hence, it is possible to ensure the stable characteristics such as key operability without receiving the influence of the use environment due to the high durability held by the thin resilient metal plate.

Here, in the above-mentioned key switch, it is preferable that a first holding portion is formed on the first link member and a second holding portion is formed on the second link member, and the spring member is extended between the first holding portion and the second holding portion so as to form the deformation action portions. In such a key switch, since the first holding portion and the second holding portion which are served for extending the spring member are also commonly used as the deformation action portions which deform the spring member, it is not necessary to especially provide the deformation action portions of the spring member so that the constitution of the first link member and the second link member can be simplified.

Further, it is preferable that a first holding hole into which the first holding portion is loosely fitted and a second holding hole into which the second holding portion is loosely fitted are formed in the spring member, and the spring member is formed such that a width thereof is gradually increased toward a center portion thereof from the first holding hole and the second holding hole. In such a key switch, since the width of the spring member is increased toward the center portion thereof from the first holding hole and the second holding hole, a stress generated in the spring member due to the pushdown operation of the key top is dispersed at the center portion having the large width and hence, the concentration of the pushdown stress in the center portion can be surely prevented. Accordingly, the durability of the spring member can be enhanced.

Further, it is preferable that the above-mentioned spring member is formed in an approximately circular shape in a plan view. In such a key switch, since the spring member is formed in an approximately circular shape in a plan view, it is possible to uniformly disperse the stress which is generated in the spring member due to the pushdown operation of the key top over the whole spring member. Accordingly, the durability of the spring member can be further remarkably enhanced.

Further, it is preferable that the switching portion is constituted of a membrane switch which is arranged below the holder member and the spring member is curved downwardly along with the pushdown operation of the key top so as to operate the membrane switch. In such a key switch, the membrane switch is operated by way of the spring member which is curved downwardly along with the pushdown operation of the key top and hence, it is totally unnecessary to form a pushdown projection for pushing the membrane switch to the key top whereby the reduction of the thickness of the key switch can be easily achieved.

Further, according to another aspect of the present invention, there is provided a personal computer which comprises: a keyboard which inputs various data such as characters, symbols or the like, the keyboard including key switches each of which comprises a key top which forms a plurality of slide engaging portions on a lower surface thereof, a holder member which is arranged below the key top and forms a plurality of rotary engaging portions thereon, first and second link members which are engaged with the slide engaging portions of the key top and the rotary engaging portions of the holder member respectively, cross each other in an X shape as viewed from a side, and guide a vertical movement of the key top, a switching portion which performs a switching operation based on a pushdown operation of the key top, and a spring member which is formed of a thin resilient metal plate, biases the key top upwardly, and includes a pushing portion which performs the switching operation by acting on the switch portion at the time of pushing down the key top at a center thereof, wherein at least the pushing portion of the spring member and a peripheral portion thereof are arranged in a concave shape as viewed from a side, and deformation action portions which deform the spring member in a U-shape at the time of pushing down the key top are provided to portions of the first link member and the second link member at sides thereof disposed closer to the rotary engaging portion sides than a crossing portion of both link members as viewed from a side; display means which displays characters and symbols or the like; and control means which makes the display means display the characters, symbols or the like based on input data from the keyboard.

In the above-mentioned personal computer, when various data such as characters, symbols or the like are inputted from the key switch of the keyboard, the characters, the symbols and the like are displayed by display means through the control by the control means. Here, the personal computer is provided with the keyboard which is attached with the above-mentioned key switches, an advantageous effect similar to that of the above-mentioned case can be obtained.

BRIEF DESCRIPTION OF THE DRAWINGS

The accompanying drawings, which are incorporated in and constitute a part of this specification illustrate embodiments of the invention, and together with the description, serve to explain the objects, advantages and principles of the invention.

In the drawings,

FIG. 30 shows a portion of the membrane switch, wherein

FIG. 55 are explanatory views for explaining a notebook type personal computer, wherein

DETAILED DESCRIPTION OF THE PREFERRRED EMBODIMENTS (1) Hereinafter, a membrane switch, a key switch using the membrane switch, a keyboard having the key switch, and a personal computer having the keyboard according to the present invention are explained in detail based on the first to sixth embodiments which embody the present invention in conjunction with attached drawings. First of all, the notebook type persona computer is explained in conjunction with FIG. 55(A) and FIG. 55(B). Here, FIG. 55(A) is a perspective view of the notebook type persona computer and FIG. 55(B) is a block diagram showing the electrical constitution of the notebook type persona computer.

In FIG. 55(A), a notebook type persona computer 101 is basically constituted of a body part 102 which incorporates a CPU which performs various arithmetic processing and a display 103 which is supported on the body part 102 such that the display 103 can be opened and closed with respect to the body part 102. The display 103 is rotatably supported on a connection part 104 of the body part 102 and hence, the display part 103 can be opened or closed with respect to the body part 102. A keyboard 105 on which a plurality of key switches are arranged is mounted on the body part 102.

Figure 55A:
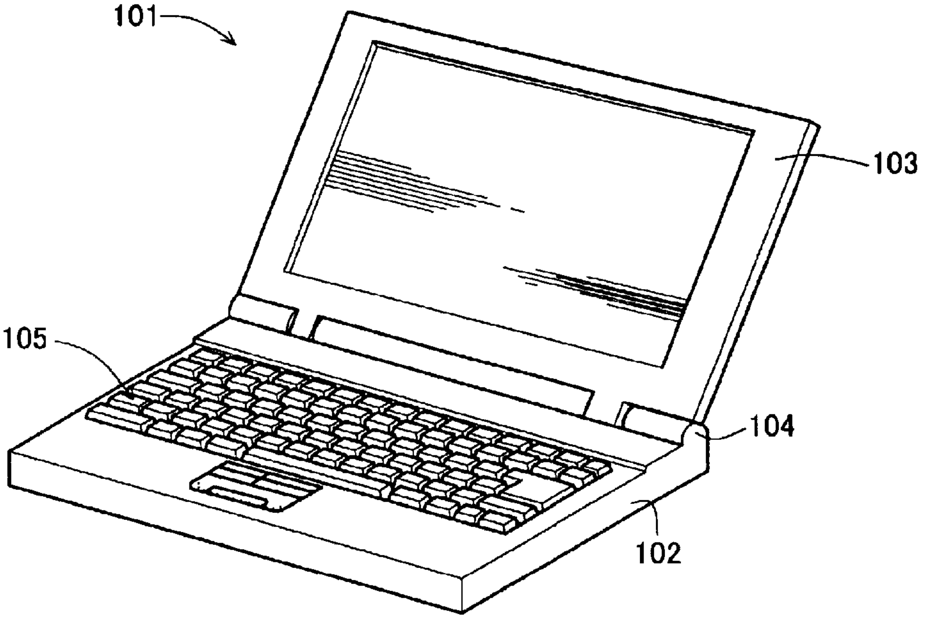
FIG. 55(A) is a perspective view of the notebook type personal computer and FIG. 55(B) is a block diagram showing the electric constitution of the notebook type personal computer.
Figure 55B:
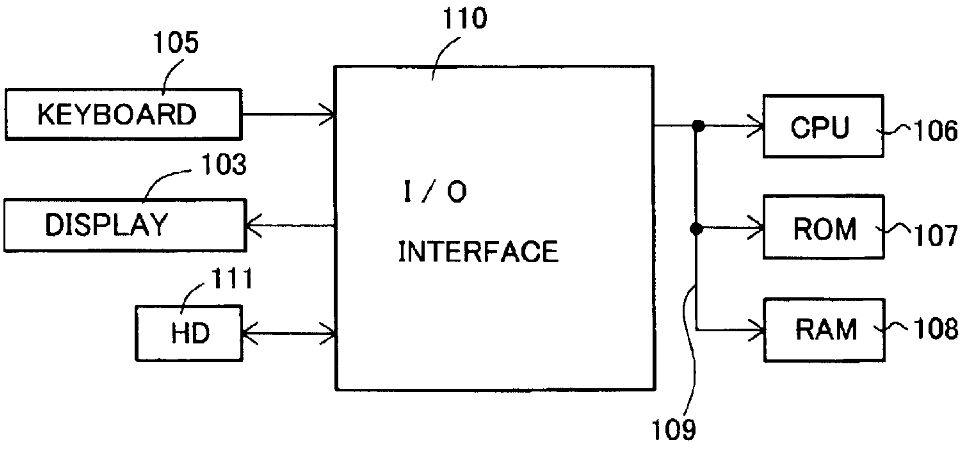

Further, in FIG. 55(B), to the CPU 106, a ROM 107 in which a program for controlling various parts of the personal computer is stored and a RAM 108 which stores various types of data are connected through a bus 109. Further, to the CPU 106, an input/output interface 110 is connected through the bus 109. To this input/output interface 110, the above-mentioned display 103, the above-mentioned keyboard 105 and a hard disc device 111 in which a program for documentation, chart calculation and the like is stored are connected. In response to input data from the keyboard 105, the above-mentioned CPU 106 reads out the program for documentation, chart calculation and the like from the hard disc device 111 and executes the program and displays characters, symbols and the like on the display 103.

Figure 2:
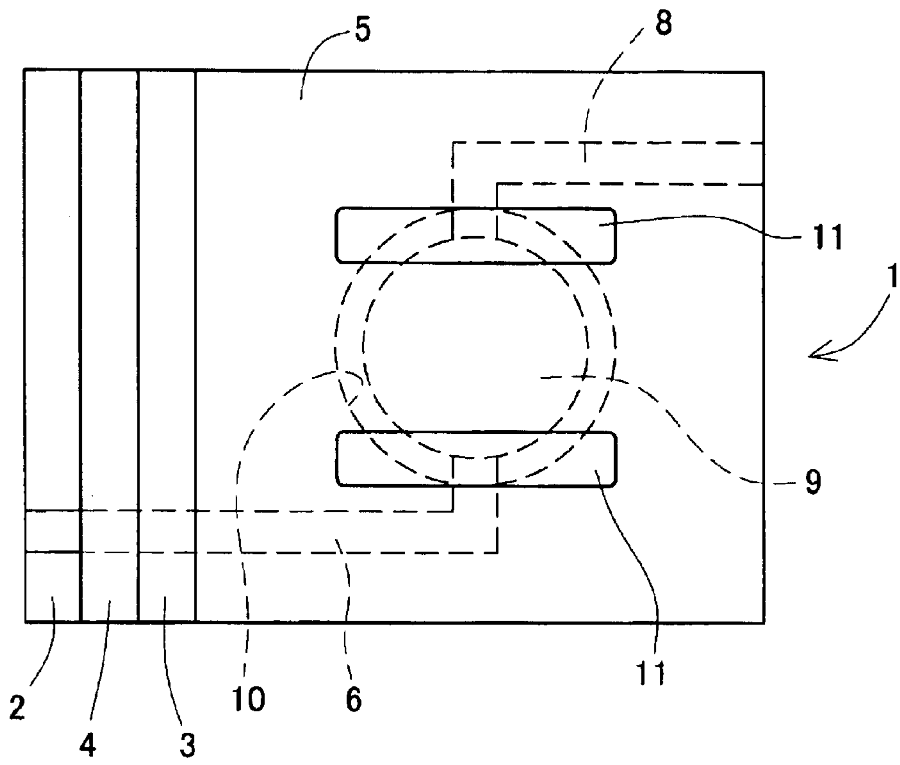
FIG. 2 is a plan view showing a portion of the membrane switch.
Figure 3:
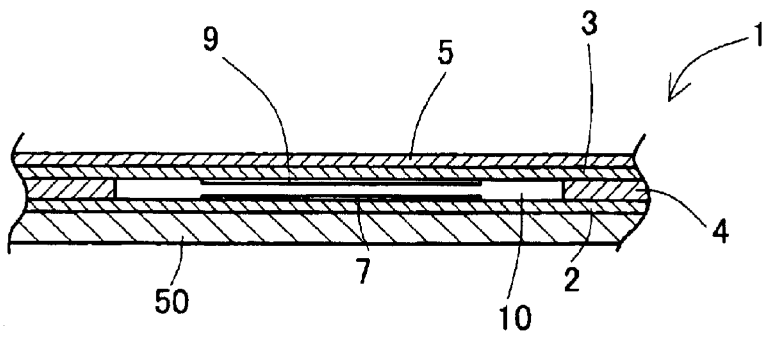
FIG. 3 is a cross-sectional side view of the membrane switch.

Subsequently, a membrane switch according to the first embodiment which is used in a key switch attached to the keyboard 105 of the above-mentioned notebook type personal computer 101 is explained in conjunction with FIG. 1 to FIG. 3. Here, FIG. 1 is an exploded perspective view showing a portion of the membrane switch in an exploded manner, FIG. 2 is a plan view showing a portion of the membrane switch, and FIG. 3 is a cross-sectional side view of the membrane switch.

Figure 1:
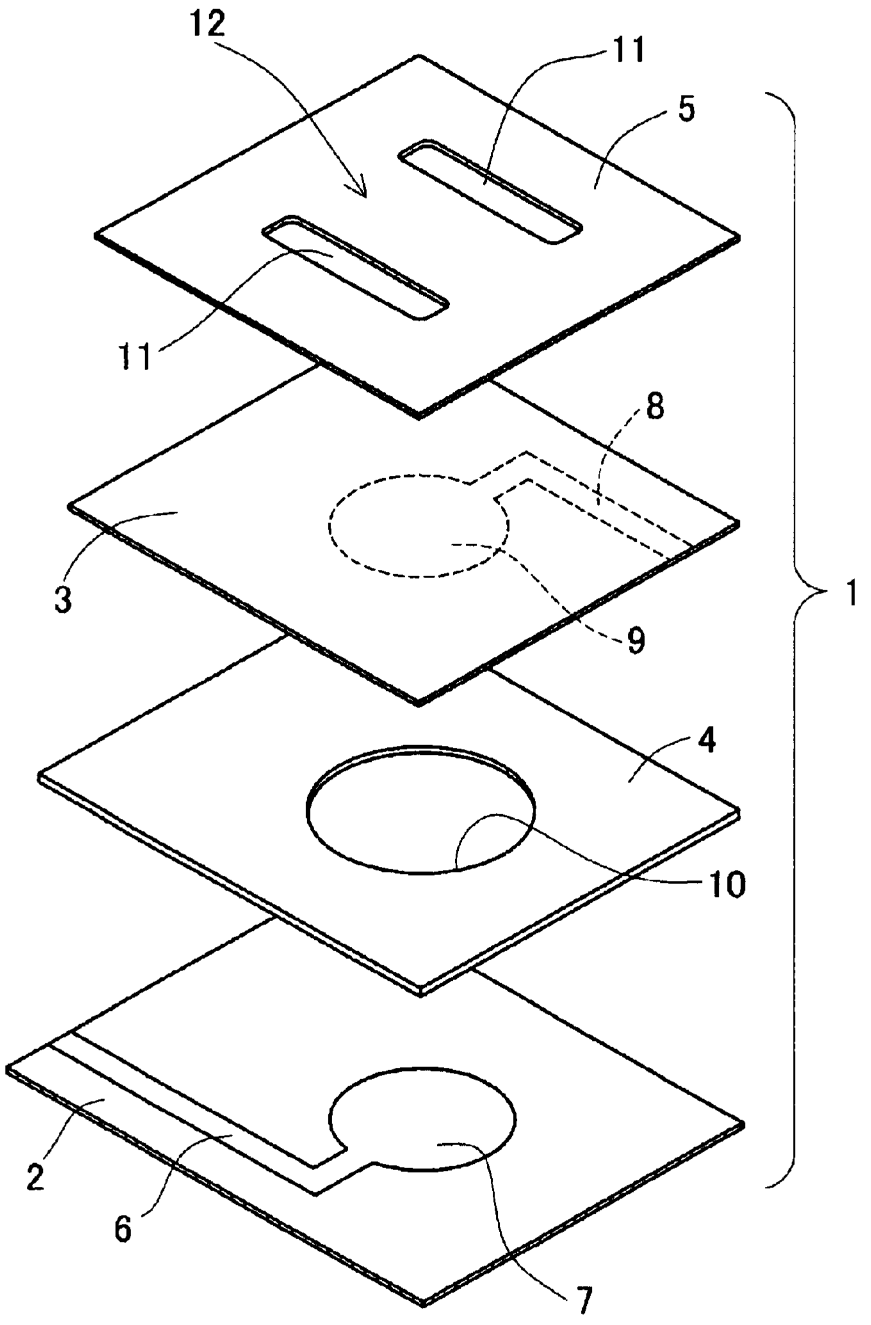
FIG. 1 is an exploded perspective view showing a portion of a membrane switch according to the first embodiment in an exploded manner.

In FIG. 1, the membrane switch 1 is basically constituted of a lower membrane sheet 2, an upper membrane sheet 3, a spacer sheet 4 which is interposed between the lower membrane sheet 2 and the upper membrane sheet 3, and a spring sheet 5 which is laminated to the upper membrane sheet 3. The membrane switch 1 is, as shown in FIG. 3, supported on a support plate 50.

Here, the lower membrane sheet 2 is formed of a film sheet made of polyethylene terephthalate (hereinafter abbreviated as "PET) and a lower switch electrode 7 which is connected to a circuit pattern 6 is formed on an upper surface of the lower membrane sheet 2. Further, the upper membrane sheet 3 is formed of a PET film sheet in the same manner as the lower membrane sheet 2. An upper switch electrode 9 which is connected to a circuit pattern 8 is formed on a lower surface of the upper membrane sheet 3 at a position corresponding to the lower switch electrode 7 of the lower membrane sheet 2.

Here, the circuit pattern 6 and the lower switch electrode 7 formed on the lower membrane sheet 2 and the circuit pattern 8 and the upper switch electrode 9 formed on the upper membrane sheet 3 can be formed by a known method. For example, they may be formed into given patterns by coating using a conductive paint containing carbon particles and silver particles or the like. Further, a copper foil adhered to a PET film sheet may be etched into given patterns.

The spacer sheet 4 is formed of a PET film sheet in the same manner as the lower membrane sheet 2 and the upper membrane sheet 3. A switching hole 10 is formed in the spacer sheet 4 at a position corresponding to the lower switch electrode 7 and the upper switch electrode 9. Such a switching hole 10 is served for making the lower switch electrode 7 and the upper switch electrode 9 spaced apart from each other at the non-switching operation and for moving the upper switch electrode 9 when an upper surface of the upper membrane sheet 3 which corresponds to the upper switch electrode 9 is pushed thus bringing the upper switch electrode 9 into contact with the lower switch electrode 7 at the time of performing the switching operation.

The spring sheet 5 is constituted of a thin metal plate made of stainless steel or the like and has large resiliency. A pair of parallel slits 11 are formed in the spring sheet 5 and portions of respective slits 11 are, as shown in FIG. 2, overlapped to both sides of the upper electrode 9 of the upper membrane sheet 3. Respective slits 11 perform a function of concentrating a pushdown load to the switch portion 12 by preventing the pushdown load from being dispersed over the entire body of the spring sheet 5 even when the pushdown load is applied to a switch portion 12 of the spring sheet 5 corresponding to the upper electrode 9 by way of a finger, a rubber spring, a key top or the like. Accordingly, it is possible to rapidly perform the switching operation by bringing the upper electrode 9 of the upper membrane sheet 3 and the lower electrode 7 of the lower membrane sheet 2 into contact with each other with a small pushdown load.

In the membrane switch 1 according to the above-mentioned embodiment, the spring sheet 5 formed of the thin metal plate is arranged above the upper membrane sheet 3. Accordingly, even when the upper membrane sheet 3 is held for a long period in a state that goods are placed on the upper membrane sheet 3, due to the large resiliency of the spring sheet 5, there is no possibility that the upper membrane sheet 3 is plastically deformed so that it is possible to perform the reliable switching operation while maintaining a resiliency restoring force for a long period.

Further, since a pair of slits 11 are formed in the spring sheet 5 corresponding to both sides of the upper electrode 9 of the upper membrane sheet 3, it is possible to concentrate the pushdown load to the switch portion 12 by preventing the pushdown load from being dispersed over the entire body of the spring sheet 5 even when the pushdown load is applied to the switch portion 12 of the spring sheet 5 corresponding to the upper electrode 9 by way of a finger, a rubber spring, a key top or the like. Accordingly, it is possible to rapidly perform the switching operation by bringing the upper electrode 9 of the upper membrane sheet 3 and the lower electrode 7 of the lower membrane sheet 2 into contact with each other with a small pushdown load.

Figure 4:
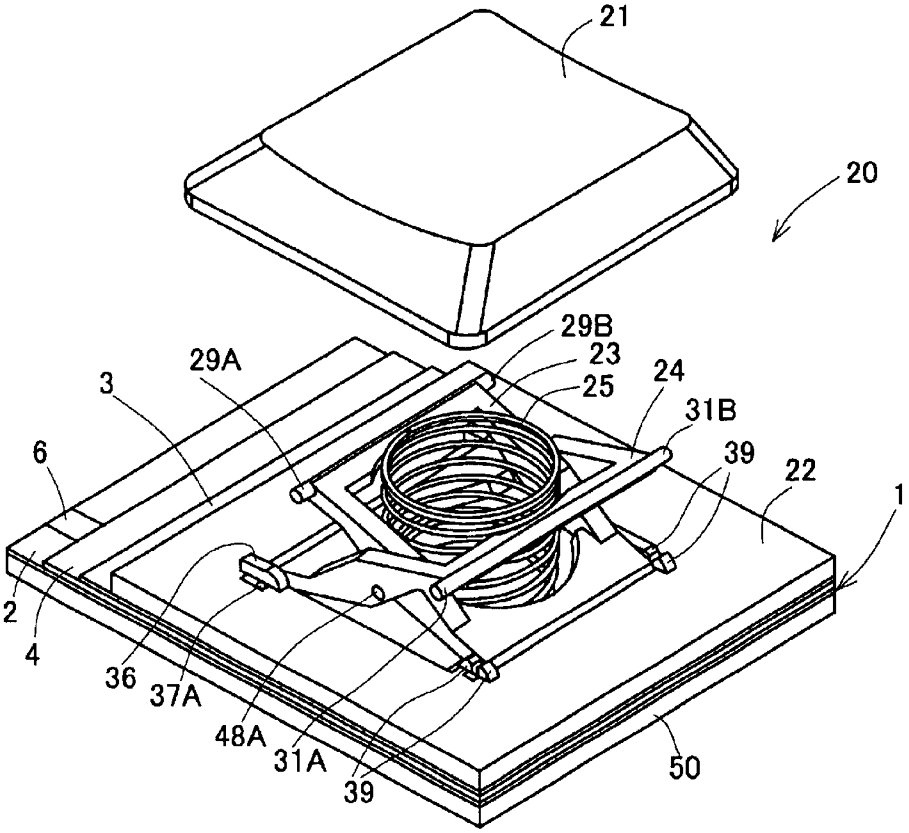
FIG. 4 is a perspective view of a key switch in a state that a key top is removed.
Figure 5:
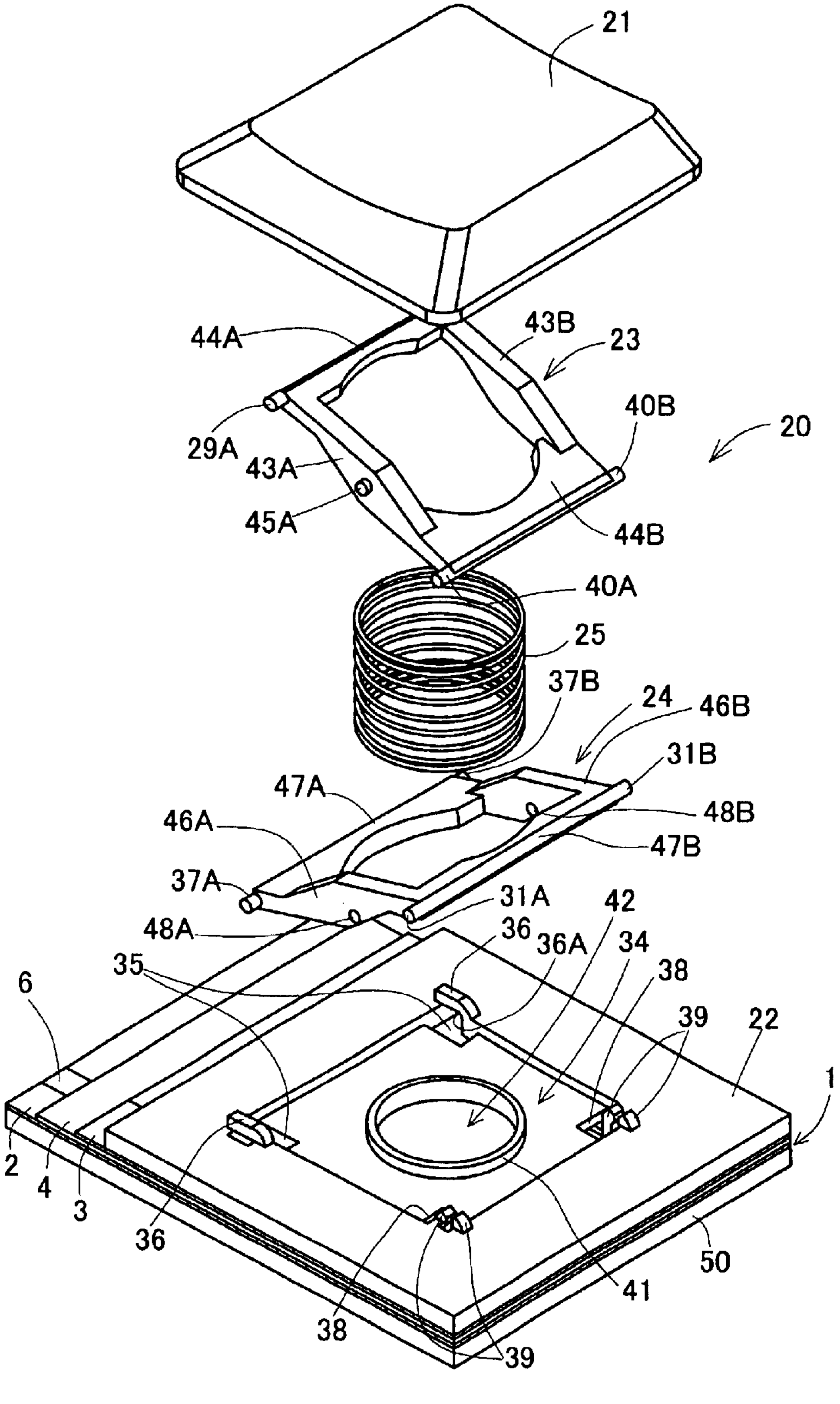
FIG. 5 is an exploded perspective view of the key switch.
Figure 6:
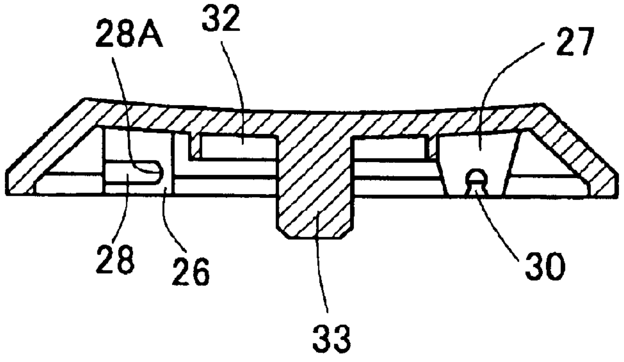
FIG. 6 is a cross-sectional side view of the key top.
Figure 7:
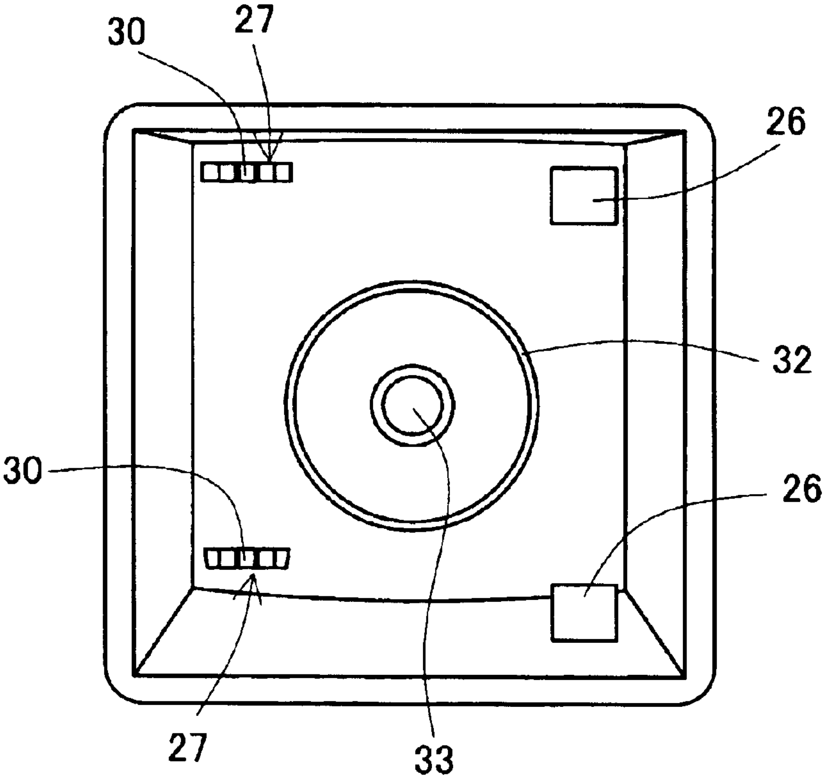
FIG. 7 is a rear view of the key top.
Figure 8:
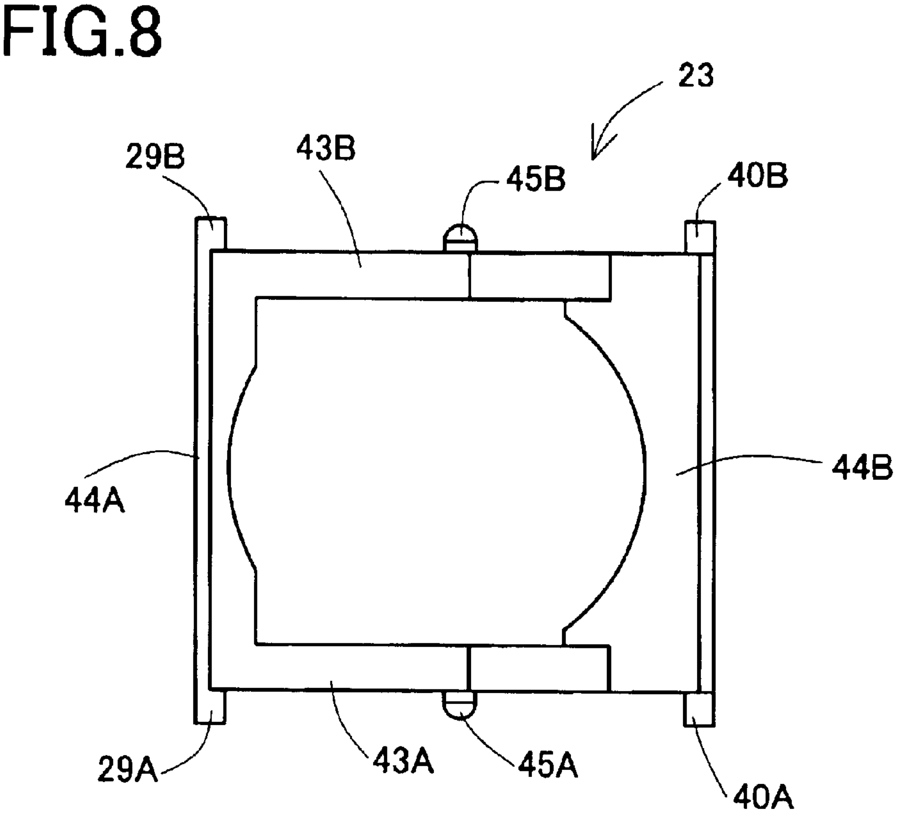
FIG. 8 is a plan view of a first link member.
Figure 9:
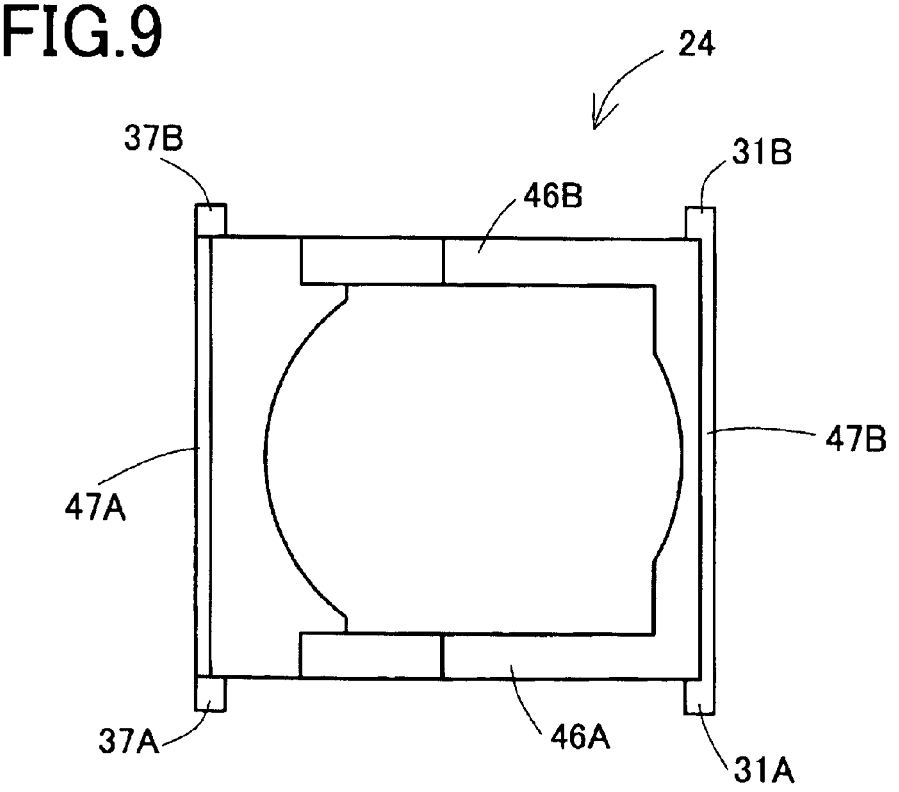
FIG. 9 is a plan view of a second link member.

Then, the key switch which uses the membrane switch 1 having the above-mentioned constitution is explained in conjunction with FIG. 4 to FIG. 9. Here FIG. 4 is a perspective view of the key switch in a state that the key top is removed, FIG. 5 is an exploded perspective view of the key switch, FIG. 6 is a cross-sectional side view of the key top, FIG. 7 is a rear view of the key top, FIG. 8 is a plan view of a first link member, and FIG. 9 is a plan view of a second link member.

First of all, the schematic constitution of the key switch is explained in conjunction with FIG. 4 and FIG. 5. In FIG. 4 and FIG. 5, the key switch 20 is substantially constituted of a key top 21, a holder member 22 disposed below the key top 21, a first link member 23 and a second link member 24 which are connected and engaged with a back surface of the key top 21 and the holder member 21 and guide the vertical movement of the key top 21, a coil spring 25 which biases the key top 21 upwardly, a membrane switch 1 which is arranged below the holder member 22, and a support plate 50 disposed below the membrane switch 1 for supporting the whole key switch 20.

Here, the key top 21 is formed of synthetic resin such as ABS resin or the like, and characters, symbols and the like are formed on an upper surface there of by a known method such as printing. Further, on the back surface of the key top 21, as shown in FIG. 6 and FIG. 7, a pair of slide engaging portions 26 and a pair of rotary engaging portions 27 are integrally formed. Slide grooves 28 are formed in respective slide engaging portions 26 and respective engaging pins 29A, 29B of the first link member 23 which will be explained later are slidably engaged in respective slide grooves 28. Here, closed end faces 28A are formed in the slide grooves 28. Further, rotary grooves 30 which open downwardly are formed in respective rotary engaging portions 27. Respective engaging pins 31A, 31B of the second link member 34 which will be explained later are rotatably engaged with these rotary grooves 30.

Further, on the back surface of the key top 21 and at a position disposed between respective slide engaging portions 26 and the rotary engaging portions 27 present at four corners of the back surface, a cylindrical spring holding portion 32 (see FIG. 10, FIG. 11) which is fitted on an upper end portion of the coil spring 25 and holds the coil spring 25 is formed. Further, at an approximately center position of the spring holding portion 32, a pushdown projection 33 which pushes down the switch portion 12 of the spring sheet 5 in the membrane switch 1 is provided such that the pushdown projection 33 extends downwardly. As shown in FIG. 7, the pushdown projection 33 has a length larger than a thickness of the key top 21 and extends downwardly from lower end face of the key top 21. As will be explained later, the pushdown projection 33 performs an action to push down the switch portion 12 formed on the spring sheet 5 of the membrane switch 1 at the time of pushing down the key top 21.

The holder member 22 disposed below the key top 21 is made of synthetic resin such as ABS resin or the like. In such a holder member 22, a key station portion 34 is formed for every membrane switch 1, wherein the key station portion 34 has a film thickness smaller than a film thickness of a peripheral portion around the key station portion 34. Corner holes 35 are respectively formed in two corners at one side (left side in FIG. 5) of the key station portion 34. Slide engaging lugs 36 are integrally formed with the holder member 22 in such a manner that the slide engaging lugs 36 project from side ends of respective corner holes 35 and overhang above respective corner holes 35. Engaging pins 37A, 37B of the second link member 24 which will be explained later are slidably engaged with respective slide engaging lugs 36. Here, closed end faces 36A are formed on the slide engaging lugs 36. Further, corner holes 38 are respectively formed in two corners at another side (right side in FIG. 5) of the key station portion 34. A pair of sandwiching walls 39 are formed in the vicinity of each corner hole 38. Engaging pins 40A and 40B of the first link member 23 which will be explained later are rotatably held by the respective sandwiching walls 39.

Further, at an approximately center position of the key station portion 34, a cylindrical spring holding portion 41 (see FIG. 10, FIG. 11) which is fitted on and holds a lower end portion of the coil spring 25 is formed. Inside the spring holding portion 41, an opening 42 which penetrates the holder member 22 is formed. The opening 42 corresponds to the pushdown projection 33 of the key top 21. At the time of pushing down the key top 21, the pushdown projection 33 moves downwardly through the opening 42 and pushes down the switch portion 12 of the spring sheet 5 in the membrane switch 1 so as to bring the upper electrode 9 of the upper membrane sheet 3 and the lower electrode 7 of the lower membrane sheet 2 into contact with each other.

As shown in FIG. 8, the first link member 23 is formed in an approximately “square” shape in a plan view and includes a pair of plate-like portions 43A, 43B and connecting portions 44A, 44B which respectively connect both end portions of the respective plate-like portions 43A, 43B. Further, the engaging pins 29A, 29B are extended outwardly from corner portions of one connecting portion 44A (left-side connecting portion in FIG. 8), while the engaging pins 40A, 40B are extended outwardly from corner portions of another connecting portion 44B (right-side connecting portion in FIG. 8). Respective engaging pins 29A, 29B are slidably engaged with the slide grooves 28 formed in respective slide engaging portions 26 of the key top 21, while respective engaging pins 40A, 40B are rotatably engaged in a pair of sandwiching walls 39, 39 of the holder member 22. Further, shaft portions 45A, 45B are formed on approximately center portions of respective plate-like portions 43A, 43B in a projected manner.

As shown in FIG. 9, the second link member 24 is formed in an approximately “square” shape in a plan view in the same manner as the first link member 23 and includes a pair of plate-like portions 46A, 46B and connecting portions 47A, 47B which respectively connect both end portions of the respective plate-like portions 46A, 46B. Further, the engaging pins 37A, 37B are extended outwardly from corner portions of one connecting portion 47A (left-side connecting portion in FIG. 9), while the engaging pins 31A, 31B are extended outwardly from corner portions of another connecting portion 47B (right-side connecting portion in FIG. 9). Respective engaging pins 31A, 31B are rotatably engaged with the rotary grooves 30 formed in respective rotary engaging portions 27 of the key top 21, while respective engaging pins 37A, 37B are slidably engaged with respective slide engaging lugs 36 of the holder member 22. Further, shaft holes 48A, 48B are formed in approximately center portions of respective plate-like portions 46A, 46B (see FIG. 5). The shaft portions 45A, 45B of the first link member 23 are respectively rotatably pivoted by respective shaft holes 48A, 48B. Accordingly, the first link member 23 and the second link member 24 are connected in a relatively rotatable manner based on the pivotal relationship between the shaft portions 45A, 45B and the shaft holes 48A, 48B.

The coil spring 25 is provided for performing a function of biasing the key top 21 upwardly. The upper end portion of the coil spring 25 is fitted on and held by the outside of the spring holding portion 32 formed on the key top 21, while the lower end portion of the coil spring 25 is fitted on and held by the outside of the spring holding portion 41 formed on a key station portion 34 of the holder member 22.

Figure 10:
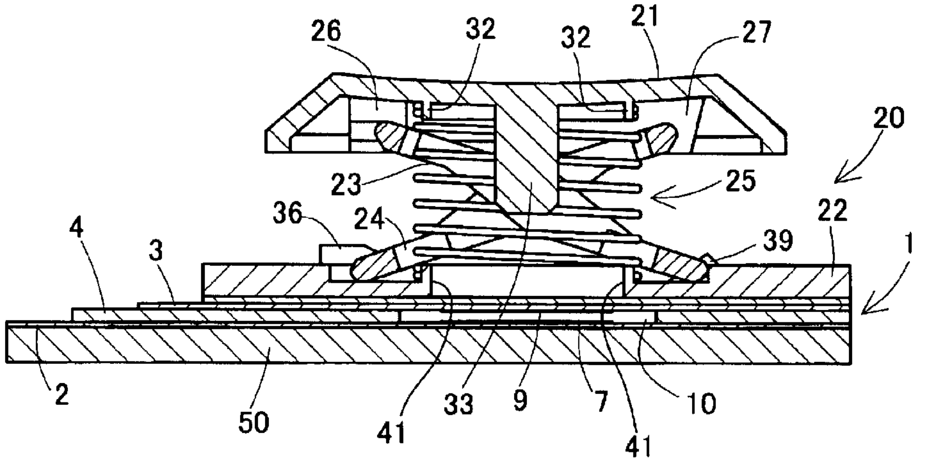
FIG. 10 is a cross-sectional side view of the key switch when the key top is in a non-pushdown state.
Figure 11:
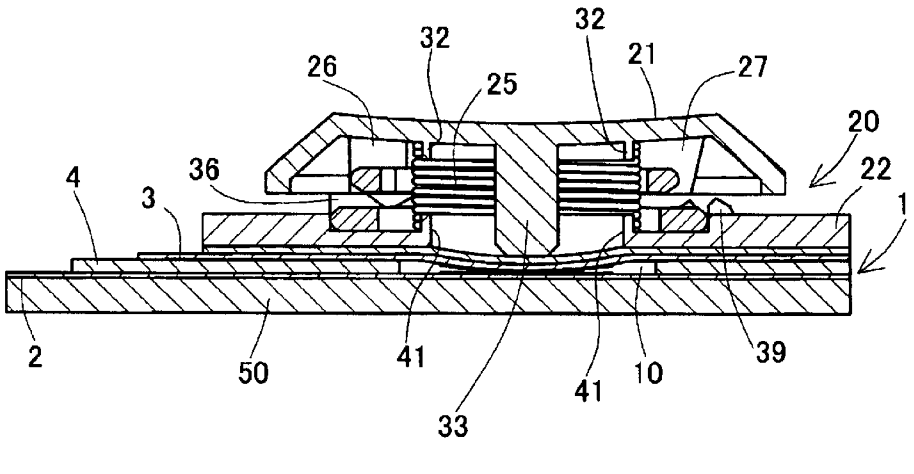
FIG. 11 is a cross-sectional side view of the key switch when the key top is in a pushdown state.

The manner of operation of the key switch 20 having the above-mentioned constitution is explained in conjunction with FIG. 10 and FIG. 11. FIG. 10 is a cross-sectional side view of the key switch in a state that the key top is not pushed down and FIG. 11 is a cross-sectional side view of the key switch in a state that the key top is pushed down.

In the state that the key top 21 is not pushed down, as shown in FIG. 10, the key top 21 is biased upwardly based on a biasing force of the coil spring 25 so that the key top 21 is held in the non-pushdown position. In such a non-pushdown position, respective engaging pins 29A, 29B of the first link member 23 which are engaged with the slide grooves 28 of slide engaging portions 26 in the key top 21 are brought into contact with the closed end faces 28A of the slide grooves 28, while respective engaging pins 37A, 37B of the second link member 24 which are engaged with the slide engaging lugs 36 in the holder member 22 are brought into contact with the closed end faces 36A of the slide engaging lugs 36. Accordingly, the upward movement of the key top 21 is restricted.

When the key top 21 is pushed downwardly against the biasing force of the coil spring 25, respective engaging pins 29A, 29B of the first link member 23 are made to gradually slide in the right direction in the inside of the slide grooves 28 of slide engaging portions 26 and respective engaging pins 40A, 40B are rotated in a counterclockwise direction in the inside of sandwiching walls 39, 39. Simultaneously, respective engaging pins 37A, 37B of the second link member 24 are made to gradually slide in the right direction in the inside of the slide engaging lugs 36 and respective engaging pins 31A, 31B are rotated in the inside of the rotary grooves 30 of the rotary engaging portions 27 of the key top 21. Corresponding to such rotation, the pushdown projection 33 of the key top 21 is gradually moved downwardly.

When the key top 21 is further pushed down, the pushdown projection 33 of the key top 21 passes the opening 42 in the inside of the spring holding portion 41 formed in the key station portion 34 and pushes down the switch portion 12 of the spring sheet 5 of the membrane switch 1. Accordingly, as shown in FIG. 11, the upper electrode 9 of the upper membrane sheet 3 and the lower electrode 7 of the membrane sheet 2 are brought into contact with each other through the switching hole 10 of the spacer sheet 4 and hence, the switching operation is performed.

When the pushdown of the key top 21 is released, the operation opposite to the above-mentioned operation is performed based on the biasing force of the coil spring 25 and hence, the key top 21 returns to the non-pushdown position shown in FIG. 10.

With respect to the above-mentioned key switch 20, in the membrane switch 1 arranged below the holder member 22, the spring sheet 5 formed of the thin metal plate is arranged above the upper membrane sheet 3, even when a state that goods are placed on the key top 21 is held for a long time, due to the large resilient force of the spring sheet 5, there is no possibility that the upper membrane sheet 3 is plastically deformed and hence, it is possible to perform the reliable switching operation while holding the resilient restoring force over a long period.

Further, a pair of slits 11 are formed in the spring sheet 5 corresponding to both sides of the upper electrode 9 formed on the upper membrane sheet 3. Due to such a constitution, even when the pushdown load is applied to the switch portion 12 of the switch sheet 5 corresponding to the upper electrode 9 by way of a finger, a rubber spring, a key top or the like, it is possible to concentrate the pushdown load to the switch portion 12 by preventing the pushdown load from being dispersed over the entire body of the spring sheet 5. Accordingly, it is possible to rapidly perform the switching operation by bringing the upper electrode 9 of the upper membrane sheet 3 and the lower electrode 7 of the lower membrane sheet 2 into contact with each other with a small pushdown load.

Figure 13:
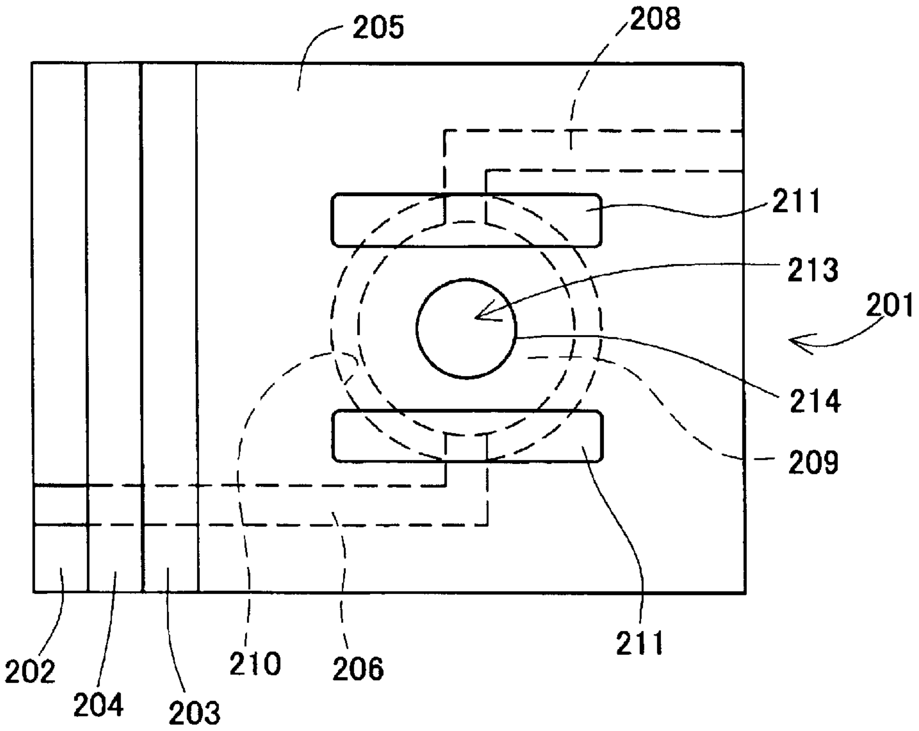
FIG. 13 is a plan view showing a portion of the membrane switch.
Figure 14:
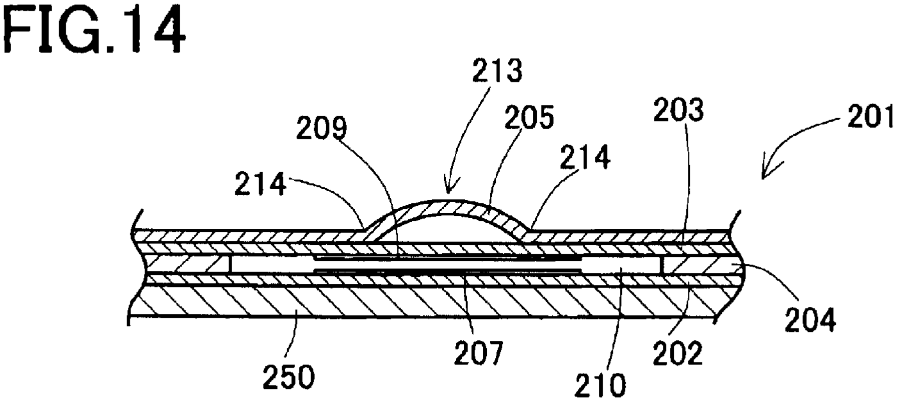
FIG. 14 is a cross-sectional side view of the membrane switch.

Subsequently, a membrane switch according to the second embodiment which is used in a key switch attached to a keyboard 105 of the above-mentioned notebook type personal computer 101 is explained in conjunction with FIG. 12 to FIG. 14. Here, FIG. 12 is an exploded perspective view showing a portion of a membrane switch according to the second embodiment in an exploded manner, FIG. 13 is a plan view showing a portion of the membrane switch, and FIG. 14 is a cross-sectional side view of the membrane switch.

Figure 12:
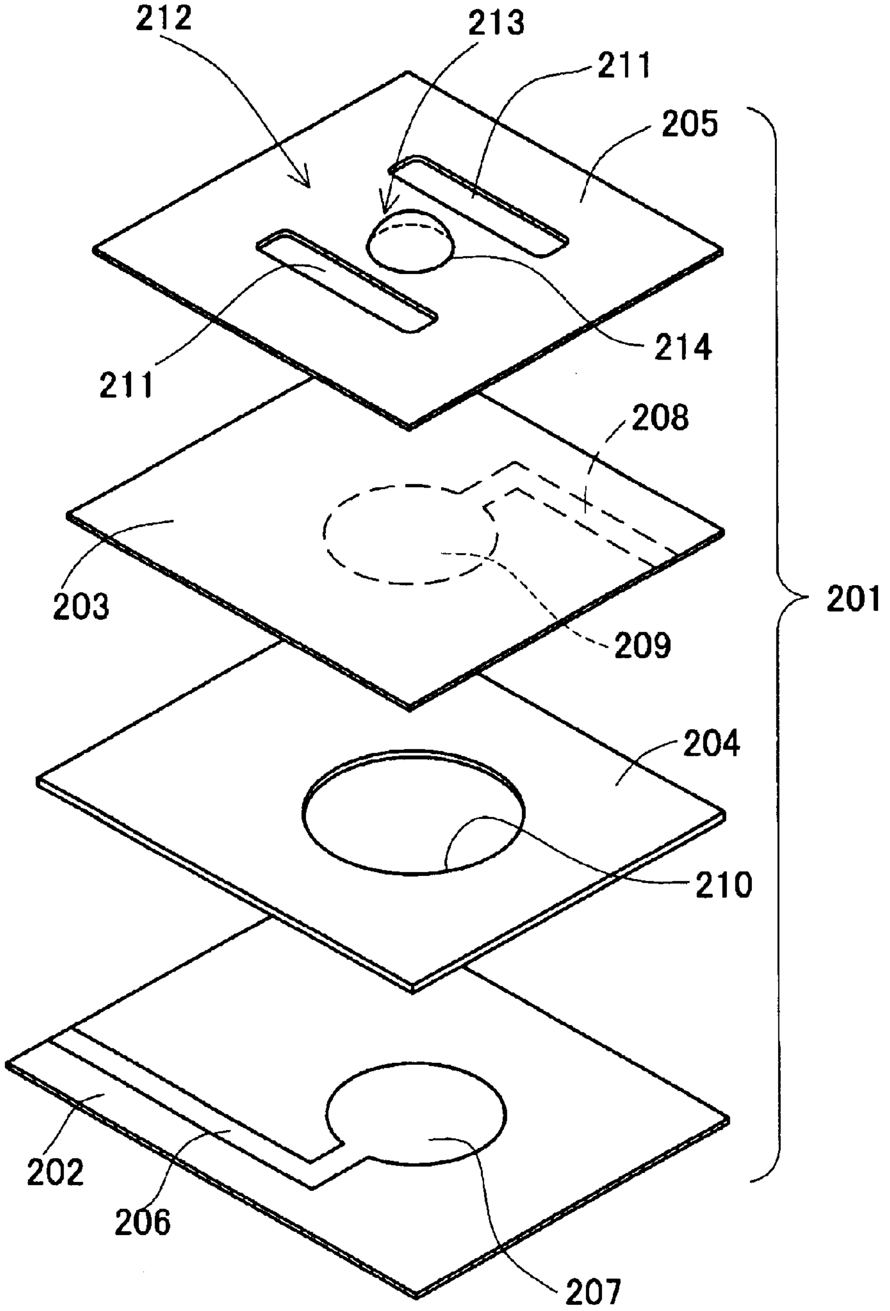
FIG. 12 is an exploded perspective view showing a portion of a membrane switch according to the second embodiment in an exploded manner.

In FIG. 12, the membrane switch 201 is basically constituted of a lower membrane sheet 202, an upper membrane sheet 203, a spacer sheet 204 which is interposed between the lower membrane sheet 202 and the upper membrane sheet 203, and a spring sheet 205 which is laminated to the upper membrane sheet 203. The membrane switch 201 is, as shown in FIG. 14, supported on a support plate 250.

Here, the lower membrane sheet 202 is formed of a film sheet made of polyethylene terephthalate (hereinafter abbreviated as "PET) and a lower switch electrode 207 which is connected to a circuit pattern 206 is formed on an upper surface of the lower membrane sheet 202. Further, the upper membrane sheet 203 is formed of a PET film sheet in the same manner as the lower membrane sheet 202. An upper switch electrode 209 which is connected to a circuit pattern 208 is formed on a lower surface of the upper membrane sheet 203 at a position corresponding to the lower switch electrode 207 of the lower membrane sheet 202.

Here, the circuit pattern 206 and the lower switch electrode 207 formed on the lower membrane sheet 202 and the circuit pattern 208 and the upper switch electrode 209 formed on the upper membrane sheet 203 can be formed by a known method. For example, they may be formed by coating into given patterns using a conductive paint containing carbon particles and silver particles or the like. Further, the circuit pattern may be formed such that a copper foil adhered to a PET film sheet is etched into a given pattern.

The spacer sheet 204 is formed of a PET film sheet in the same manner as the lower membrane sheet 202 and the upper lower membrane sheet 203. A switching hole 210 is formed in the spacer sheet 204 at a position corresponding to the lower switch electrode 207 and the upper switch electrode 209. Such a switching hole 210 is served for making the lower switch electrode 207 and the upper switch electrode 209 spaced apart from each other at the time of non-switching operation and for moving the upper switch electrode 209 when an upper surface of the upper membrane sheet 203 which corresponds to the upper switch electrode 209 is pushed thus bringing the upper switch electrode 209 into contact with the lower switch electrode 207 at the time of performing the switching operation.

The spring sheet 205 is constituted of a thin metal plate made of stainless steel or the like and has large resiliency. A pair of parallel slits 211 are formed in the spring sheet 205 and portions of respective slits 211 are, as shown in FIG. 13, overlapped to both sides of the upper electrode 209 of the upper membrane sheet 203. Further, on a switching portion 212 formed on the spring sheet 205 between respective slits 211, a semispherical bulging portion 213 is formed and the bulging portion 213 is integrally connected to the spring sheet 205 by way of a connecting portion 214 disposed around the bulging portion 213.

Respective slits 211 perform a function of concentrating a pushdown load to the connecting portion 214 of the bulging portion 213 by preventing the pushdown load from being dispersed over the entire body of the spring sheet 205 even when the pushdown load is applied to the bulging portion 213 formed on the switch portion 212 of the spring sheet 205 corresponding to the upper electrode 209 by way of a finger, a rubber spring, a key top or the like. Therefore, even when the pushdown load applied to the bulging portion 213 is small, the pushdown load is concentrated on the connecting portion 214 of the bulging portion 213. Accordingly, an upper surface of the upper electrode 209 is pushed down by way of the connecting portion 214 and hence, it is possible to rapidly perform the switching operation by bringing the upper electrode 209 of the upper membrane sheet 203 and the lower electrode 207 of the lower membrane sheet 202 into contact with each other.

In the membrane switch 201 according to the above-mentioned second embodiment, the spring sheet 205 formed of the thin metal plate is arranged above the upper membrane sheet 203 and the semispherical bulging portion 213 is formed on the spring sheet 205 corresponding to the upper electrode 209. Accordingly, when the semispherical bulging portion 213 is pushed down using the finger, the rubber spring, the key top or the like at the time of operating the switch, the upper membrane sheet 203 is pushed by way of the connecting portion 214 between the bulging portion 213 and the spring sheet 205 disposed around the bulging portion 213 and hence, the upper electrode 209 of the upper membrane sheet 203 is brought into contact with the lower electrode 207 of the lower membrane sheet 202 through the switching hole 210 formed in the spacer sheet 204 whereby the switching operation is performed. Here, since the upper membrane sheet 203 is pushed by the connecting portion 214 between the bulging portion 213 and the spring sheet 205, even when the pushing position of the bulging portion 213 due to the finger, the rubber spring, the key top or the like is disposed at a portion other than a center portion of the bulging portion 213, it is possible to bring the upper electrode 209 of the upper membrane sheet 203 and the lower electrode 207 of the lower membrane sheet 202 into contact with each other in a reliable and stable manner. Accordingly, the switching operation can be performed in a stable manner.

Particularly, sizes (diameters) of the upper electrode 209 and the lower electrode 207 are set larger than a size (diameter) of the bulging portion 213 as shown in FIG. 12 to FIG. 14. Accordingly, even when the pushdown load attributed to the finger, the rubber spring, the key top or the like is applied in an inclined direction with respect to the bulging portion 213, the upper electrode 209 and the lower electrode 207 are surely brought into contact with each other by way of a portion of the connecting portion 214 and hence, it is possible to ensure the stable switching operation.

Further, since a pair of slits 211 are formed in the spring sheet 205 at both sides of the bulging portion 213, it is possible to concentrate the pushdown load to the connecting portion 214 between the bulging portion 213 and the spring sheet 205 by preventing the pushdown load from being dispersed over the entire body of the spring sheet 205 even when the pushdown load is applied to the bulging portion 213 of the spring sheet 205 corresponding to the upper electrode 209 by way of the finger, the rubber spring, the key top or the like. Accordingly, it is possible to rapidly perform the switching operation by bringing the upper electrode 209 of the upper membrane sheet 203 and the lower electrode 207 of the lower membrane sheet 202 into contact with each other with a small pushdown load.

Figure 15:
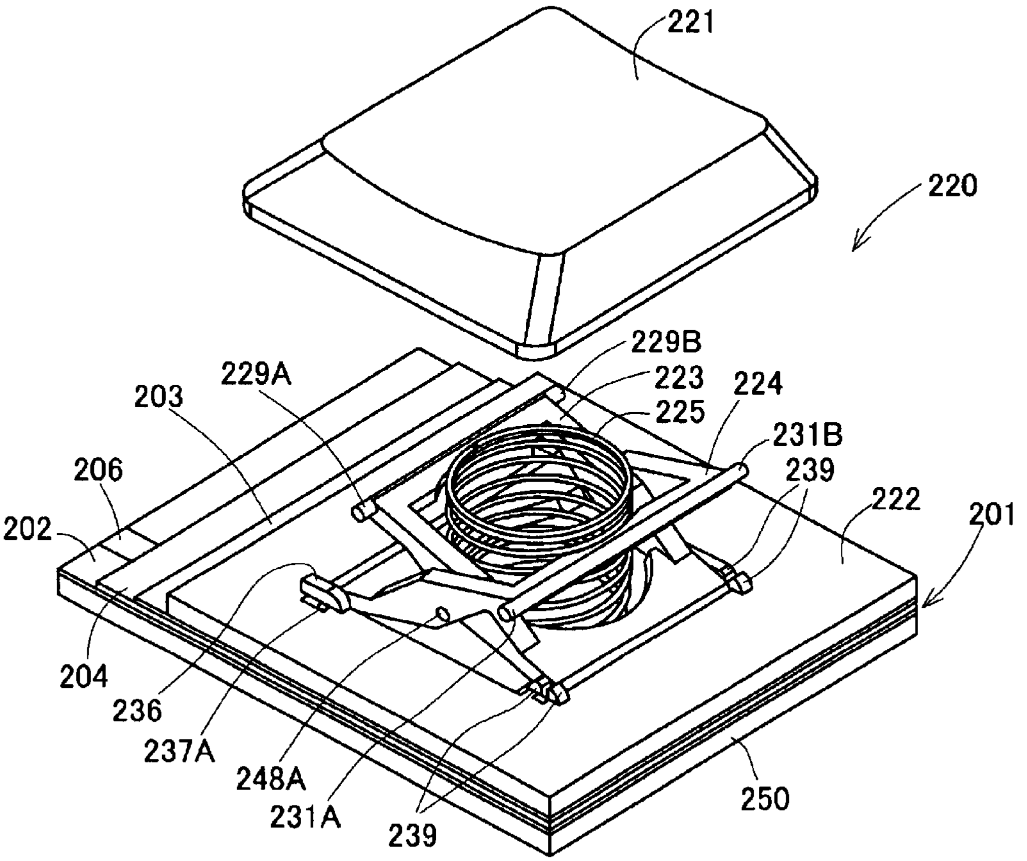
FIG. 15 is a perspective view of a key switch in a state that a key top is removed.
Figure 16:
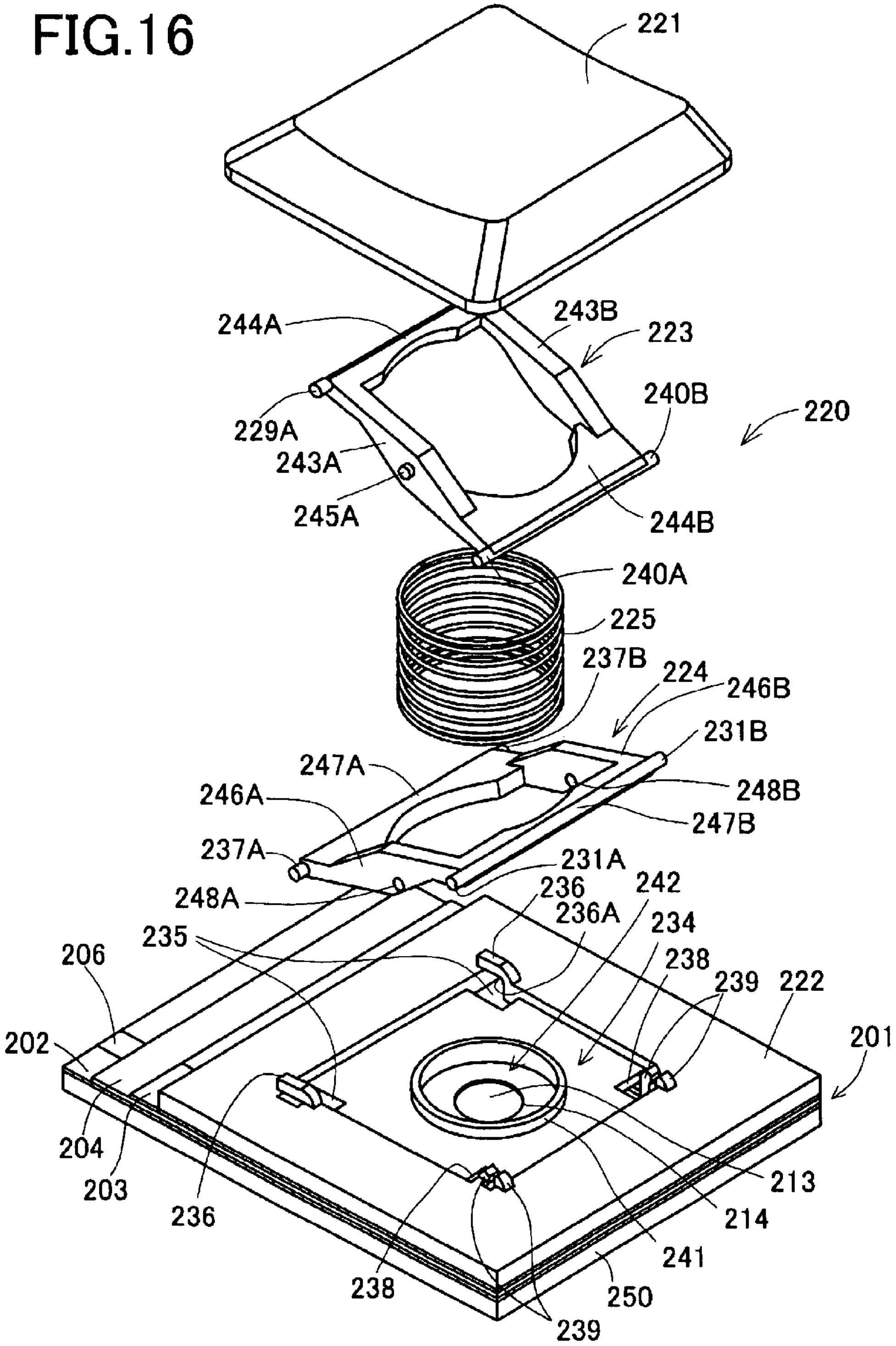
FIG. 16 is an exploded perspective view of the key switch.
Figure 17:
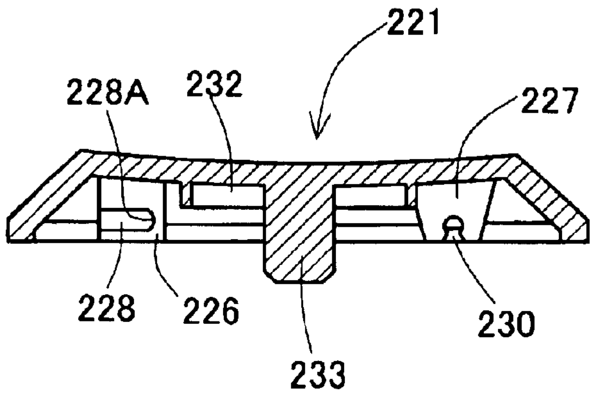
FIG. 17 is a cross-sectional side view of the key top.
Figure 18:
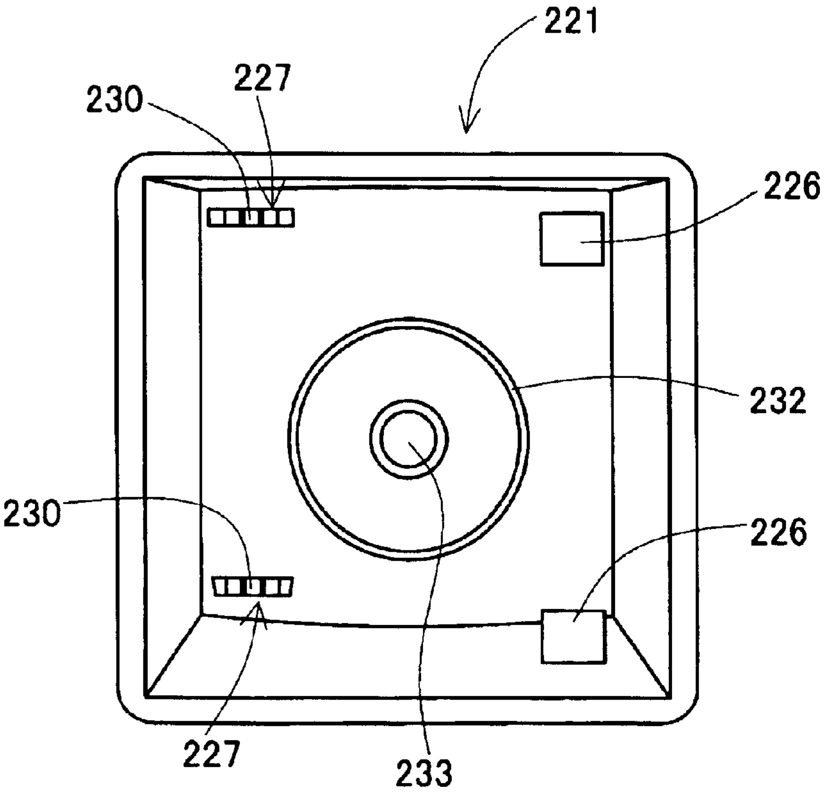
FIG. 18 is a rear view of the key top.
Figure 19:
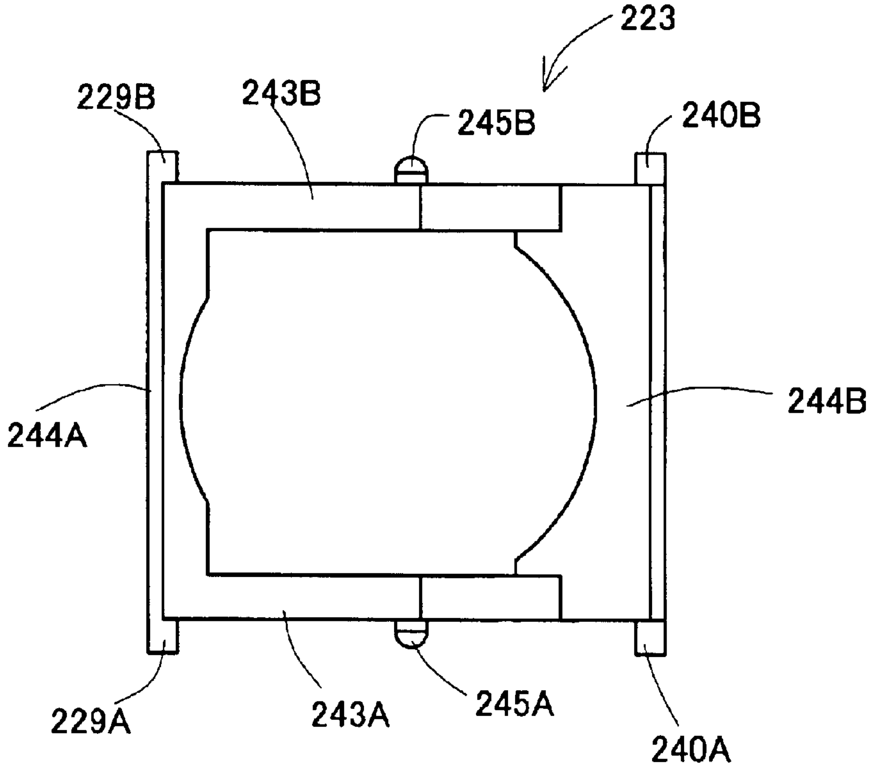
FIG. 19 is a plan view of a first link member.
Figure 20:
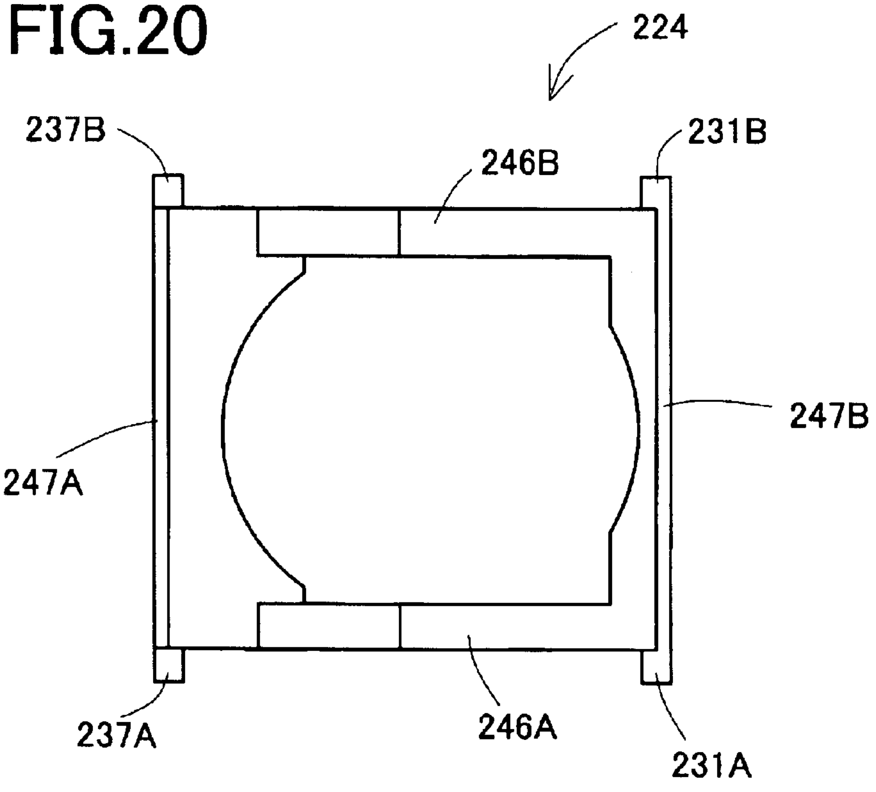
FIG. 20 is a plan view of a second link member.

Then, the key switch which uses the membrane switch 201 according to the second embodiment having the above-mentioned constitution is explained in conjunction with FIG. 15 to FIG. 20. Here, FIG. 15 is a perspective view of the key switch in a state that the key top is removed, FIG. 16 is an exploded perspective view of the key switch, FIG. 17 is a cross-sectional side view of the key top, FIG. 18 is a rear view of the key top, FIG. 19 is a plan view of a first link member, and FIG. 20 is a plan view of a second link member.

First of all, the schematic constitution of the key switch is explained in conjunction with FIG. 15 and FIG. 16. In FIG. 15 and FIG. 16, the key switch 220 is substantially constituted of a key top 221, a holder member 222 disposed below the key top 221, a first link member 223 and a second link member 224 which are connected to and engaged with a back surface of the key top 221 and the holder member 222 and guide the vertical movement of the key top 221, a coil spring 225 which biases the key top 221 upwardly, a membrane switch 201 which is arranged below the holder member 222, and a support plate 250 disposed below the membrane switch 201 for supporting the whole key switch 220.

Here, the key top 221 is formed of synthetic resin such as ABS resin or the like, and characters, symbols and the like are formed on an upper surface there of by a known method such as printing. Further, on the back surface of the key top 221, as shown in FIG. 17 and FIG. 18, a pair of slide engaging portions 226 and a pair of rotary engaging portions 227 are integrally formed. Slide grooves 228 are formed in respective slide engaging portions 226 and respective engaging pins 229A, 229B of the first link member 223 which will be explained later are slidably engaged in respective slide grooves 228. Here, closed end faces 228A are formed in the slide grooves 228. Further, rotary grooves 230 which open downwardly are formed in respective rotary engaging portions 227. Respective engaging pins 231A, 231B of the second link member 224 which will be explained later are rotatably engaged with these rotary grooves 230.

Further, on the back surface of the key top 221 and at a position surrounded by respective slide engaging portions 226 and the rotary engaging portions 227 present at four corners of the back surface, a cylindrical spring holding portion 232 (see FIG. 21, FIG. 22) which is fitted on an upper end portion of the coil spring 225 and holds the coil spring 225 is formed. Further, at an approximately center position of the spring holding portion 232, a pushdown projection 233 which pushes down the bulging portion 213 of the switch portion 212 formed on the spring sheet 205 in the membrane switch 201 is provided such that the pushdown projection 233 extends downwardly. As shown in FIG. 18, the pushdown projection 233 has a length larger than a thickness of the key top 221 and extends downwardly from a lower end face of the key top 221. As will be explained later, the pushdown projection 233 performs an action to push down the bulging portion 213 of the switch portion 12 formed on the spring sheet 205 of the membrane switch 201 at the time of pushing down the key top 221.

The holder member 222 disposed below the key top 221 is made of synthetic resin such as ABS resin or the like. In such a holder member 222, a key station portion 234 is formed for every key switch 220, wherein the key station portion 234 has a film thickness smaller than a film thickness of a peripheral portion around the key station portion 234. Corner holes 235 are respectively formed in two corner portions at one side (left side in FIG. 16) of the key station portion 234. Slide engaging lugs 236 are integrally formed with the holder member 222 in such a manner that the slide engaging lugs 236 project from side ends of respective corner holes 235 and overhang above respective corner holes 235. Engaging pins 237A, 237B of the second link member 224 which will be explained later are slidably engaged with respective slide engaging lugs 236. Here, closed end faces 236A are formed on the slide engaging lugs 236. Further, corner holes 238 are respectively formed in two corner portions at another side (right side in FIG. 16) of the key station portion 234. A pair of sandwiching walls 239 are formed in the vicinity of each corner hole 238. Engaging pins 240A and 240B of the first link member 223 which will be explained later are rotatably engaged with the respective sandwiching walls 239.

Further, at an approximately center position of the key station portion 234, a cylindrical spring holding portion 241 (see FIG. 21, FIG. 22) which is fitted on and holds a lower end portion of the coil spring 225 is formed. Inside the spring holding portion 241, an opening 242 which penetrates the holder member 222 is formed. The opening 242 corresponds to the pushdown projection 233 of the key top 221. At the time of pushing down the key top 221, the pushdown projection 233 moves downwardly through the opening 242 and pushes down the bulging portion 213 of the switch portion 212 formed on the spring sheet 205 in the membrane switch 201 so as to bring the upper electrode 209 of the upper membrane sheet 203 and the lower electrode 207 of the lower membrane sheet 202 into contact with each other.

As shown in FIG. 19, the first link member 223 is formed in an approximately "square" shape in a plan view and includes a pair of plate-like portions 243A, 243B and connecting portions 244A, 244B which respectively connect both end portions of the respective plate-like portions 243A, 243B. Further, the engaging pins 229A, 229B are extended outwardly from corner portions of one connecting portion 244A (left-side connecting portion in FIG. 19), while the engaging pins 240A, 240B are extended outwardly from corner portions of another connecting portion 244B (right-side connecting portion in FIG. 19). Respective engaging pins 229A, 229B are slidably engaged with the slide grooves 228 formed in respective slide engaging portions 226 of the key top 221, while respective engaging pins 240A, 240B are rotatably engaged in a pair of sandwiching walls 239, 239 of the holder member 222. Further, shaft portions 245A, 245B are formed on approximately center portions of respective plate-like portions 243A, 243B in a projected manner.

As shown in FIG. 20, the second link member 224 is formed in an approximately "square" shape in a plan view in the same manner as the first link member 223 and includes a pair of plate-like portions 246A, 246B and connecting portions 247A, 247B which respectively connect both end portions of the respective plate-like portions 246A, 246B. Further, the engaging pins 237A, 237B are extended outwardly from corner portions of one connecting portion 247A (left-side connecting portion in FIG. 20), while the engaging pins 231A, 231B are extended outwardly from corner portions of another connecting portion 247B (right-side connecting portion in FIG. 20). Respective engaging pins 231A, 231B are rotatably engaged with the rotary grooves 230 formed in respective rotary engaging portions 227 of the key top 221, while respective engaging pins 237A, 237B are slidably engaged with respective slide engaging lugs 236 of the holder member 222. Further, shaft holes 248A, 248B are formed in approximately center portions of respective plate-like portions 246A, 246B (see FIG. 16). The shaft portions 245A, 245B of the first link member 223 are respectively rotatably pivoted in respective shaft holes 248A, 248B. Accordingly, the first link member 223 and the second link member 224 are connected in a relatively rotatable manner based on the pivotal relationship between the shaft portions 245A, 245B and the shaft holes 248A, 248B.

The coil spring 225 is provided for performing a function of biasing the key top 221 upwardly. The upper end portion of the coil spring 225 is fitted on and held by the outside of the spring holding portion 232 formed on the key top 221, while the lower end portion of the coil spring 225 is fitted on and held by the outside of the spring holding portion 241 formed on a key station portion 234 of the holder member 222.

Figure 21:
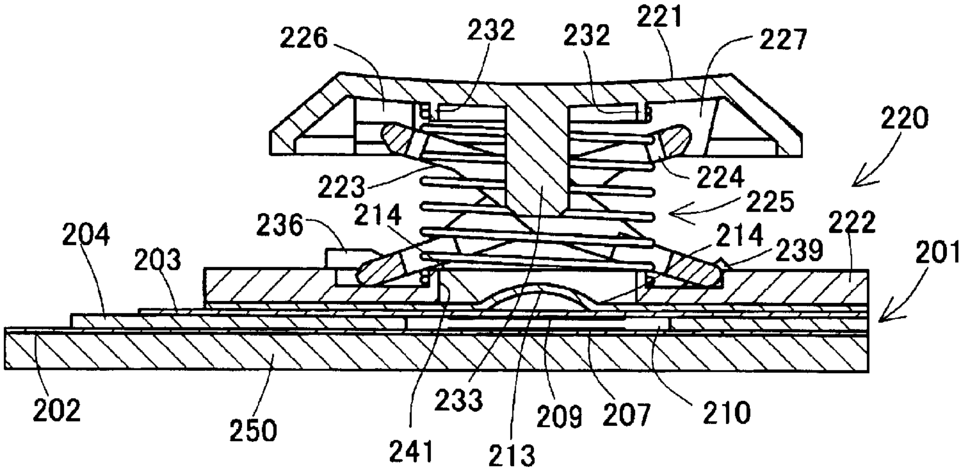
FIG. 21 is a cross-sectional side view of the key switch when the key top is in a non-pushdown state.
Figure 22:
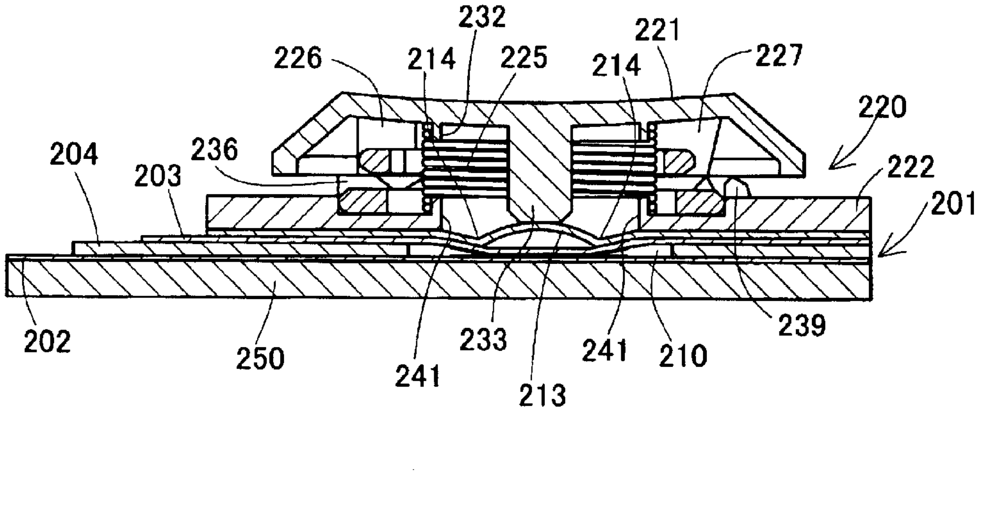
FIG. 22 is a cross-sectional side view of the key switch when the key top is in a pushdown state.

The manner of operation of the key switch 220 having the above-mentioned constitution is explained in conjunction with FIG. 21 and FIG. 22. FIG. 21 is a cross-sectional side view of the key switch in a state that the key top is not pushed down and FIG. 22 is a cross-sectional side view of the key switch in a state that the key top is pushed down.

In the state that the key top 221 is not pushed down, as shown in FIG. 21, the key top 221 is biased upwardly based on a biasing force of the coil spring 225 so that the key top 221 is held at the non-pushdown position. In such a non-pushdown position, respective engaging pins 229A, 229B of the first link member 223 which are engaged with the slide grooves 228 of slide engaging portions 226 in the key top 221 are brought into contact with the closed end faces 228A of the slide grooves 228, while respective engaging pins 237A, 237B of the second link member 224 which are engaged with the slide engaging lugs 236 in the holder member 222 are brought into contact with the closed end faces 236A of the slide engaging lugs 236. Accordingly, the upward movement of the key top 221 is restricted.

When the key top 221 is pushed downwardly against the biasing force of the coil spring 225, respective engaging pins 229A, 229B of the first link member 223 are made to gradually slide in the right direction in the inside of the slide grooves 228 of slide engaging portions 226 and respective engaging pins 240A, 240B are rotated in a counterclockwise direction in the inside of sandwiching walls 239, 239. Simultaneously, respective engaging pins 237A, 237B of the second link member 224 are made to gradually slide in the right direction in the inside of the slide engaging lugs 236 and respective engaging pins 231A, 231B are rotated in the clockwise direction in the inside of the rotary grooves 230 of the rotary engaging portions 227 of the key top 221. Corresponding to such rotation, the pushdown projection 233 of the key top 221 is gradually moved downwardly.

When the key top 221 is further pushed down, the pushdown projection 233 of the key top 221 passes the opening 242 in the inside of the spring holding portion 241 formed in the key station portion 234 and pushes down the bulging portion 213 formed on the switch portion 212 of the spring sheet 205 of the membrane switch 201. Accordingly, as shown in FIG. 22, the pushdown load applied to the bulging portion 213 by way of the pushdown projection 233 is concentrated on the connecting portion 214 between the bulging portion 213 and the spring sheet 205. As a result, an upper surface of the upper electrode 209 of the upper membrane sheet 203 is pushed down by the connecting portion 214 and hence, the upper electrode 209 and the lower electrode 207 of the lower membrane sheet 202 are brought into contact with each other through the switching hole 210 of the spacer sheet 204 whereby the switching operation is performed.

When the pushdown of the key top 221 is released, the operation opposite to the above-mentioned operation is performed based on the biasing force of the coil spring 225 and hence, the key top 221 returns to the non-pushdown position shown in FIG. 21.

With respect to the above-mentioned key switch 220, in the membrane switch 201 arranged below the holder member 222, the switching operation is performed such that by pushing down the key top 221 against the biasing force of the coil spring 225, the upper electrode 209 of the upper membrane sheet 203 and the lower electrode 207 of the lower membrane sheet 202 are brought into contact with each other by way of the pushdown projection 233 which penetrates the opening 242. Here, the spring sheet 205 formed of the thin metal plate is arranged above the upper membrane sheet 203 and the semispherical bulging portion 213 is formed on the spring sheet 205 corresponding to the upper electrode 209. Accordingly, when the bulging portion 213 is pushed down by the pushdown projection 233 of the key top 221 at the time of performing the switching operation, the upper membrane sheet 203 is pushed by way of the connecting portion 214 between the bulging portion 213 and the spring sheet 205 disposed around the bulging portion 213 and hence, the upper electrode 209 of the upper membrane sheet 203 is brought into contact with the lower electrode 207 of the lower membrane sheet 202 through the switching hole 210 formed in the spacer sheet 204 whereby the switching operation is performed. Here, since the upper membrane sheet 203 is pushed by the connecting portion 214 between the bulging portion 213 and the spring sheet 205, even when the pushing position of the bulging portion 213 due to the pushdown projection 233 of the key top 221 is disposed at a portion other than a center portion of the bulging portion 213, it is possible to bring the upper electrode 209 of the upper membrane sheet 203 and the lower electrode 207 of the lower membrane sheet 202 into contact with each other in a reliable and stable manner. Accordingly, the switching operation can be performed in a stable manner.

Further, with respect to the membrane switch 201 disposed below the holder member 222, since a pair of slits 211 are formed in the spring sheet 205 at both sides of the bulging portion 213 formed on the spring sheet 205, it is possible to concentrate the pushdown load to the connecting portion 214 between the bulging portion 213 and the spring sheet 205 by preventing the pushdown load from being dispersed over the entire body of the spring sheet 205 even when the pushdown load is applied to the bulging portion 213 of the spring sheet 205 corresponding to the upper electrode 209 by way of the pushdown projection 233 of the key top 221. Accordingly, it is possible to rapidly perform the switching operation by bringing the upper electrode 209 of the upper membrane sheet 203 and the lower electrode 207 of the lower membrane sheet 202 into contact with each other with a small pushdown load.

Subsequently, a membrane switch according to the third embodiment is explained in conjunction with FIG. 23 to FIG. 25. Here, FIG. 23 is an exploded perspective view showing a portion of the membrane switch according to the third embodiment in an exploded manner, FIG. 24 is a plan view showing a portion of the membrane switch, and FIG. 25 is a cross-sectional side view of the membrane switch.

Hereinafter, with respect to elements, members and the like which are identical with those of the membrane switch of the above-mentioned second embodiment, they are explained by giving the same numerals. Further, the explanation is made by focusing of the constitutions which feature the membrane switch of the third embodiment, while the explanation of the constitution of the membrane switch according to this embodiment identical with that of membrane switch of the second embodiment is omitted.

Figure 23:
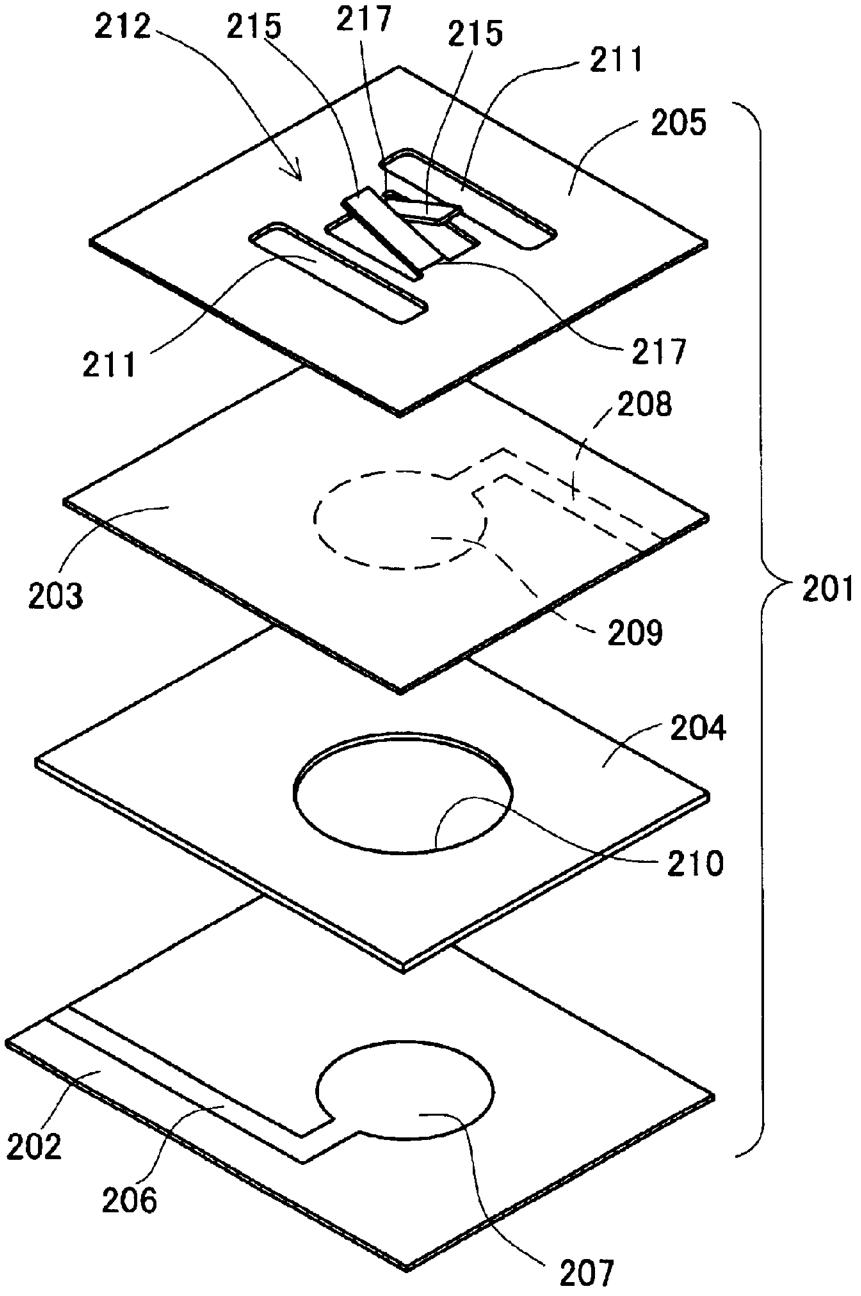
FIG. 23 is an exploded perspective view showing a portion of a membrane switch according to the third embodiment in an exploded manner.
Figure 24:
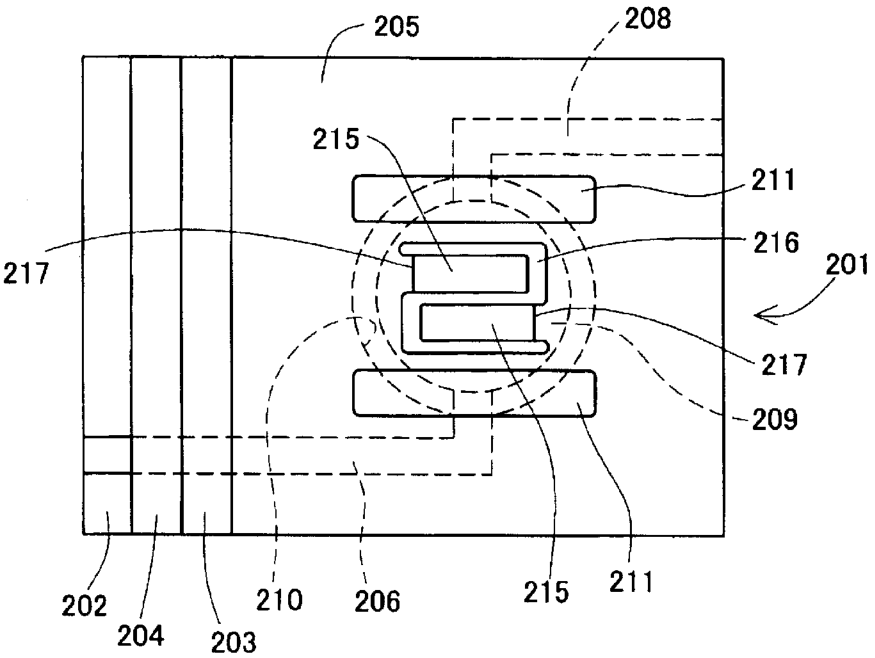
FIG. 24 is a plan view showing a portion of the membrane switch.
Figure 25:
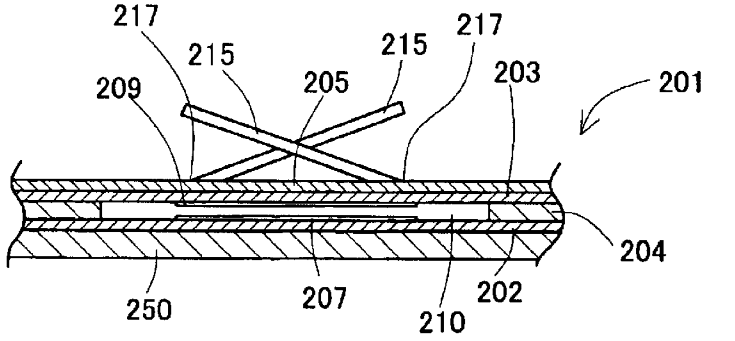
FIG. 25 is a cross-sectional side view of the membrane switch.

In FIG. 23 to FIG. 25, the spring sheet 205 which constitutes a portion of the membrane switch 1 is formed of a thin metal plate made of stainless steel or the like and has large resiliency. A pair of parallel slits 211 are formed in the spring sheet 205 and portions of respective slits 211 are, as shown in FIG. 24, overlapped to both sides of the upper electrode 209 of the upper membrane sheet 203. Further, in a switch portion 212 which is formed between respective slits 211, a pair of resilient cut-and-raised lugs 215 are formed corresponding to the upper electrode of the upper membrane sheet 203. As shown in FIG. 24, respective resilient cut-and-raised lugs 215 are formed by forming an inverted S-shaped blank portion 216 in the spring sheet 205 and, thereafter, by bending connecting portions 217 of respective resilient cut-and-raised lugs 215 with the spring sheet 205 as bending-starting points in an oblique upward direction. In this manner, respective resilient cut-and-raised lugs 215 are integrally connected with the spring sheet 205 by way of the connecting portions 217.

In this embodiment, with respect to the membrane switch 201, since the constitution other than the spring sheet 205 is identical with the corresponding constitution of the second embodiment, their explanation is omitted.

In the membrane switch 201 according to the above-mentioned third embodiment, the spring sheet 205 formed of the thin metal plate is arranged above the upper membrane sheet 203 and a pair of resilient cut-and-raised lugs 215 are formed in the spring sheet 205 corresponding to the upper electrode 209. Accordingly, when the respective resilient cut-and-raised lugs 215 are pushed by a finger, a rubber spring, a key top or the like at the time of performing the switching operation, the upper membrane sheet 203 is pushed byway of the connecting portions 217 between the resilient cut-and-raised lugs 215 and the spring sheet 205 and hence, the upper electrode 209 of the upper membrane sheet 203 is brought into contact with the lower electrode 207 of the lower membrane sheet 202 through the switching hole 210 formed in the spacer sheet 204 whereby the switching operation is performed. Here, since the upper membrane sheet 203 is pushed by the connecting portion 217 between resilient cut-and-raised lugs 215 and the spring sheet 205, even when both of the resilient cut-and-raised lugs 215 are simultaneously pushed or only one resilient cut-and-raised lug 215 is pushed due to the finger, the rubber spring, the key top or the like, it is possible to bring the upper electrode 209 of the upper membrane sheet 203 and the lower electrode 207 of the lower membrane sheet 202 into contact with each other in a reliable and stable manner. Accordingly, the switching operation can be performed in a stable manner.

Particularly, sizes (diameters) of the upper electrode 209 and the lower electrode 207 are set larger than a length of the resilient cut-and-raised lugs 215 from the connecting portions 217 as shown in FIG. 23 to FIG. 25 and hence, the connecting portions 217 of respective resilient cut-and-raised lugs 215 are present within ranges of the upper electrode 209 and the lower electrode 207 respectively. Accordingly, even when the pushdown load attributed to the finger, the rubber spring, the key top or the like is applied to both of the resilient cut-and-raised lugs 215 or only one of these resilient cut-and-raised lugs 215, the upper electrode 209 and the lower electrode 207 are surely brought into contact with each other by way of at least one connecting portion 217 and hence, it is possible to ensure the stable switching operation.

Further, since a pair of slits 211 are provided at both sides of the respective resilient cut-and-raised lugs 215 formed on the spring sheet 205, it is possible to concentrate the pushdown load to the connecting portions 217 between the resilient cut-and-raised lugs 215 and the spring sheet 205 by preventing the pushdown load from being dispersed over the entire body of the spring sheet 205 even when the pushdown load is applied to respective resilient cut-and-raised lugs 215 of the spring sheet 205 corresponding to the upper electrode 209 by way of the finger, the rubber spring, the key top or the like. Accordingly, it is possible to rapidly perform the switching operation by bringing the upper electrode 209 of the upper membrane sheet 203 and the lower electrode 207 of the lower membrane sheet 202 into contact with each other with a small pushdown load.

Figure 26:
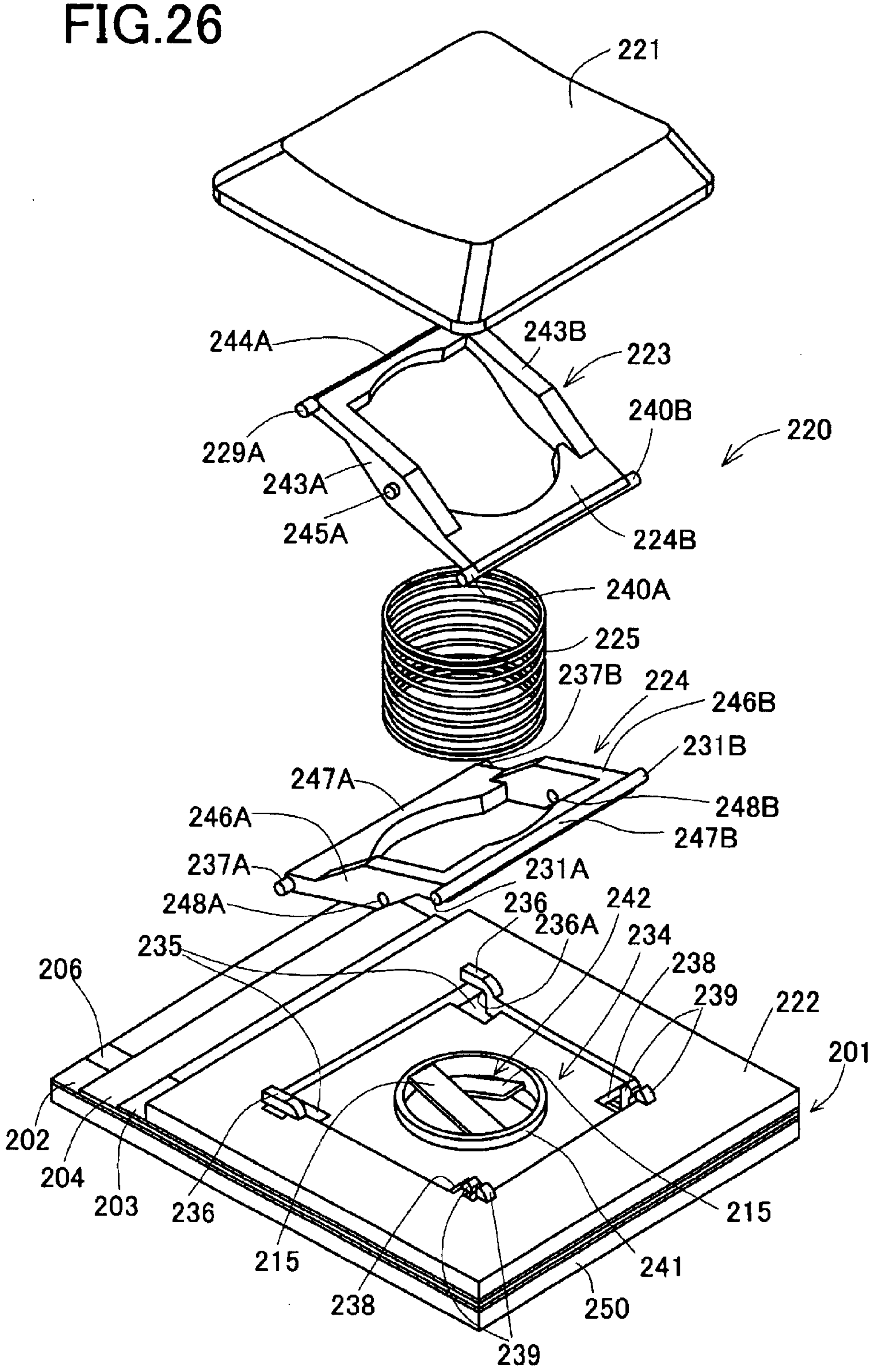
FIG. 26 is an exploded perspective view of the key switch.

Then, a key switch which uses the membrane switch 201 according to the above-mentioned third embodiment is shown in FIG. 26. FIG. 26 is an exploded perspective view of the key switch.

The key switch 220 which uses the membrane switch 201 according to the above-mentioned third embodiment differs from the key switch of the second embodiment only with respect to a following constitution. That is, in this embodiment, respective resilient cut-and-raised lugs 215 of the spring sheet 205 are exposed through the opening 242 formed at the inside of the spring holding portion 241 formed at the approximately center portion of the key station portion 234 and, at the time of pushing down the key top 221, the pushdown projection 233 moves downwardly through the opening 242 and pushes down respective resilient cut-and-raised lugs 215 so as to bring the upper electrode 209 of the upper membrane sheet 203 and the lower electrode 207 of the lower membrane sheet 202 into contact with each other. With respect to other constitutions, they are identical with the corresponding constitutions the key switch which uses the membrane switch of the second embodiment.

Figure 27:
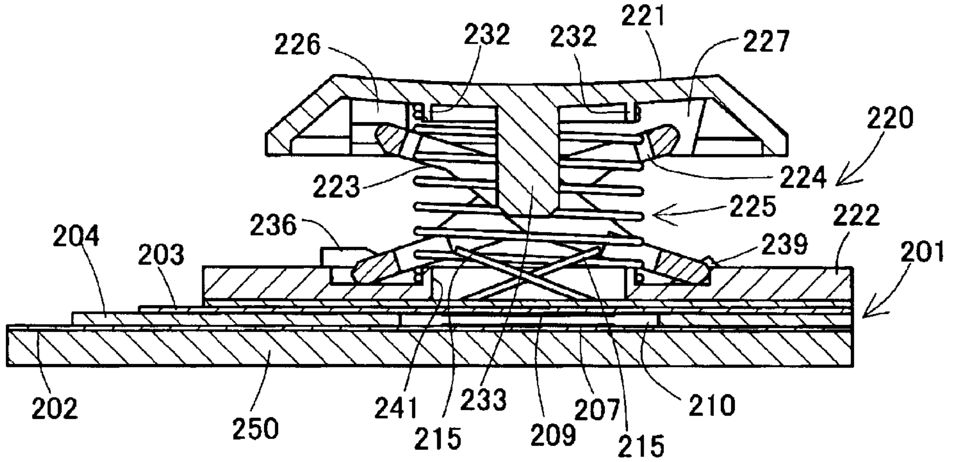
FIG. 27 is a cross-sectional side view of the key switch when the key top is in a non-pushdown state.
Figure 28:
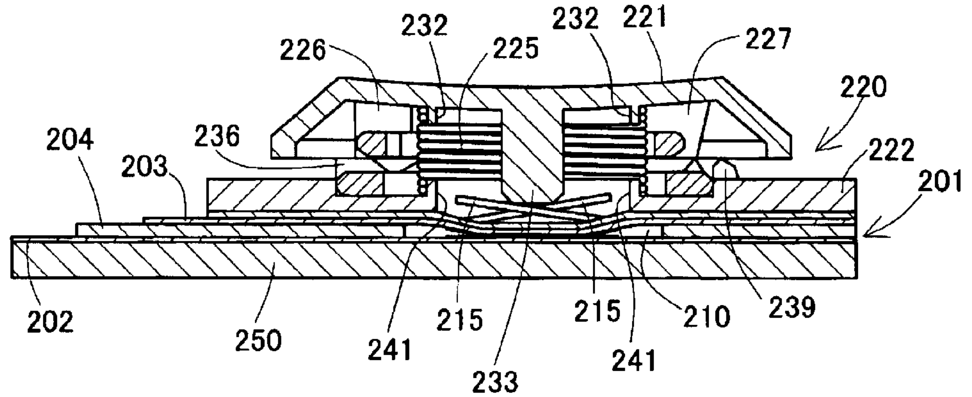
FIG. 28 is a cross-sectional side view of the key switch when the key top is in a pushdown state.

The manner of operation of the key switch 220 having the above-mentioned constitution is explained in conjunction with FIG. 27 and FIG. 28. FIG. 27 is a cross-sectional side view of the key switch in a state that the key top is not pushed down and FIG. 28 is a cross-sectional side view of the key switch in a state that the key top is pushed down.

In the state that the key top 221 is not pushed down, as shown in FIG. 27, the key top 221 is biased upwardly based on a biasing force of the coil spring 225 so that key top 221 is held in the non-pushdown position. In such a non-pushdown position, respective engaging pins 229A, 229B of the first link member 223 which are engaged with the slide grooves 228 of slide engaging portions 226 in the key top 221 are brought into contact with the closed end faces 228A of the slide grooves 228, while respective engaging pins 237A, 237B of the second link member 224 which are engaged with the slide engaging lugs 236 in the holder member 222 are brought into contact with the closed end faces 236A of the slide engaging lugs 236. Accordingly, the upward movement of the key top 221 is restricted.

When the key top 221 is pushed downwardly against the biasing force of the coil spring 225, respective engaging pins 229A, 229B of the first link member 223 are made to gradually slide in the right direction in the inside of the slide grooves 228 of slide engaging portions 226 and respective engaging pins 240A, 240B are rotated in a counterclockwise direction in the inside of sandwiching walls 239, 239. Simultaneously, respective engaging pins 237A, 237B of the second link member 224 are made to gradually slide in the right direction in the inside of the slide engaging lugs 236 and respective engaging pins 231A, 231B are rotated in the clockwise direction in the inside of the rotary grooves 230 of the rotary engaging portions 227 of the key top 221. Corresponding to such rotation, the pushdown projection 233 of the key top 221 is gradually moved downwardly.

When the key top 221 is further pushed down, the pushdown projection 233 of the key top 221 passes the opening 242 in the inside of the spring holding portion 241 formed in the key station portion 234 and pushes down respective resilient cut-and-raised lugs 215 formed on the switch portion 212 of the spring sheet 205 of the membrane switch 201. Accordingly, as shown in FIG. 28, the pushdown load applied to the respective resilient cut-and-raised lugs 215 by way of the pushdown projection 233 is concentrated on the connecting portions 217 between the respective resilient cut-and-raised lugs 215 and the spring sheet 205. As a result, an upper surface of the upper electrode 209 of the upper membrane sheet 203 is pushed down by the connecting portions 217 and hence, the upper electrode 209 and the lower electrode 207 of the lower membrane sheet 202 are brought into contact with each other through the switching hole 210 of the spacer sheet 204 whereby the switching operation is performed. In this manner, the respective resilient cut-and-raised lugs 215 can be resiliently deformed downwardly after such a switching operation and hence, it is possible to perform a proper over-travelling operation in the pushdown operation of the key top 221.

When the pushdown of the key top 221 is released, the operation opposite to the above-mentioned operation is performed based on the biasing force of the coil spring 225 and hence, the key top 221 returns to the non-pushdown position shown in FIG. 21.

With respect to the above-mentioned key switch 220, the switching operation is performed such that by pushing down the key top 221 against the biasing force of the coil spring 225, the upper electrode 209 of the upper membrane sheet 203 and the lower electrode 207 of the lower membrane sheet 202 are brought into contact with each other by way of the pushdown projection 233 which penetrates the opening 242. Here, the spring sheet 205 formed of the thin metal plate is arranged above the upper membrane sheet 203 and a pair of resilient cut-and-raised lugs 215 are formed on the spring sheet 205 corresponding to the upper electrode 209. Accordingly, when the respective resilient cut-and-raised lugs 215 are pushed down by the pushdown projection 233 of the key top 221 at the time of performing the switching operation, the upper membrane sheet 203 is pushed by way of the connecting portions 217 between the respective resilient cut-and-raised lugs 215 and the spring sheet 205 and hence, the upper electrode 209 of the upper membrane sheet 203 is brought into contact with the lower electrode 207 of the lower membrane sheet 202 through the switching hole 210 formed in the spacer sheet 204 whereby the switching operation is performed. Here, since the upper membrane sheet 203 is pushed by the connecting portions 217 between the resilient cut-and-raised lugs 215 and the spring sheet 205, even when both of resilient cut-and-raised lugs 215 are simultaneously pushed or only one resilient cut-and-raised lug 215 is pushed by the pushdown projection 233 of the key top 221, it is possible to bring the upper electrode 209 of the upper membrane sheet 203 and the lower electrode 207 of the lower membrane sheet 202 into contact with each other in a reliable and stable manner. Accordingly, the switching operation can be performed in a stable manner. Further, by bringing the upper electrode 209 and the lower electrode 207 into contact with each other by pushing respective resilient cut-and-raised lugs 215 by means of the pushdown projection 233 of the key top 221, the respective resilient cut-and-raised lugs 215 can be resiliently deformed downwardly even after the switching operation is performed and hence, it is possible to realize a proper over-travelling operation in the pushdown operation of the key top 221.

Further, since a pair of slits 211 are formed in the spring sheet 205 at both sides of the respective resilient cut-and-raised lugs 215 formed on the spring sheet 205, it is possible to concentrate the pushdown load to the connecting portions 217 between the resilient cut-and-raised lugs 215 and the spring sheet 205 by preventing the pushdown load from being dispersed over the entire body of the spring sheet 205 even when the pushdown load is applied to the respective resilient cut-and-raised lugs 215 of the spring sheet 205 corresponding to the upper electrode 209 by way of the pushdown projection 233 of the key top 221. Accordingly, it is possible to rapidly perform the switching operation by bringing the upper electrode 209 of the upper membrane sheet 203 and the lower electrode 207 of the lower membrane sheet 202 into contact with each other with a small pushdown load.

Figure 29:
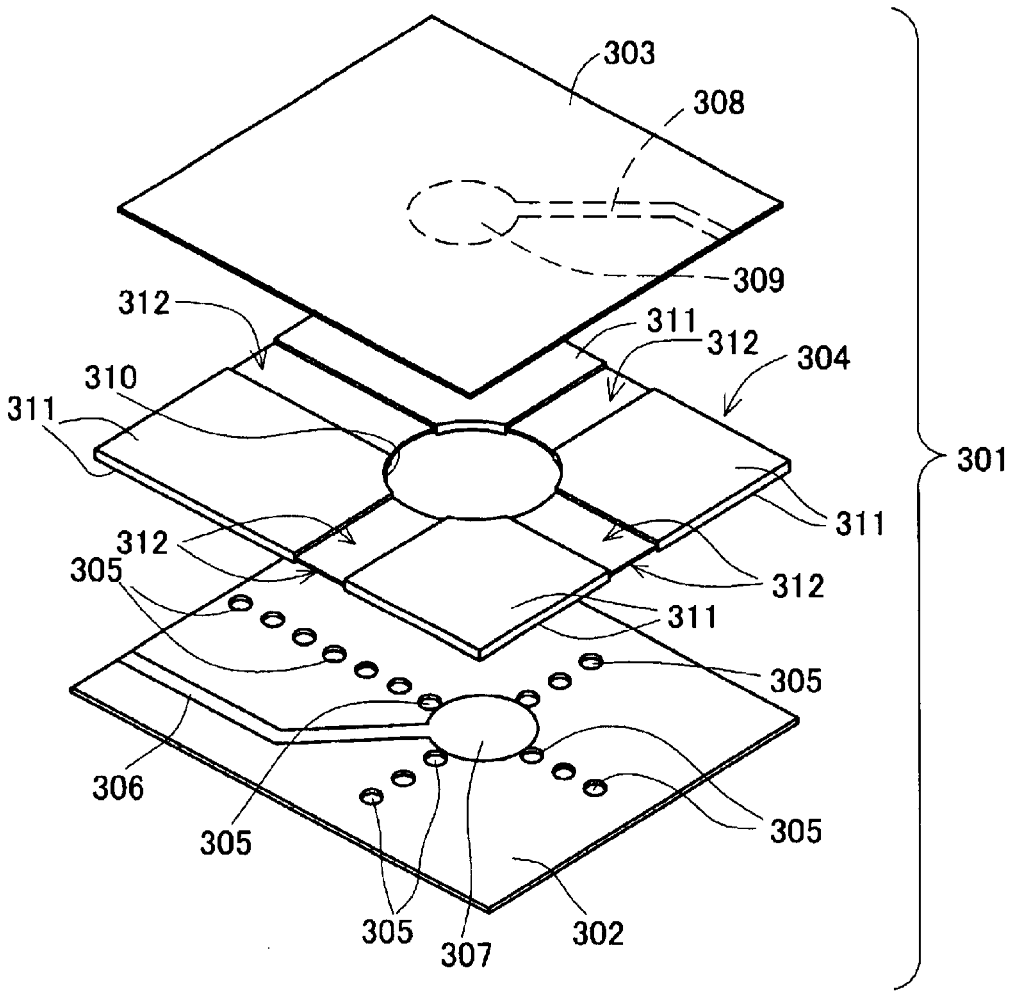
FIG. 29 is an exploded perspective view showing a portion of a membrane switch according to the fourth embodiment in an exploded manner.
Figure 30A:
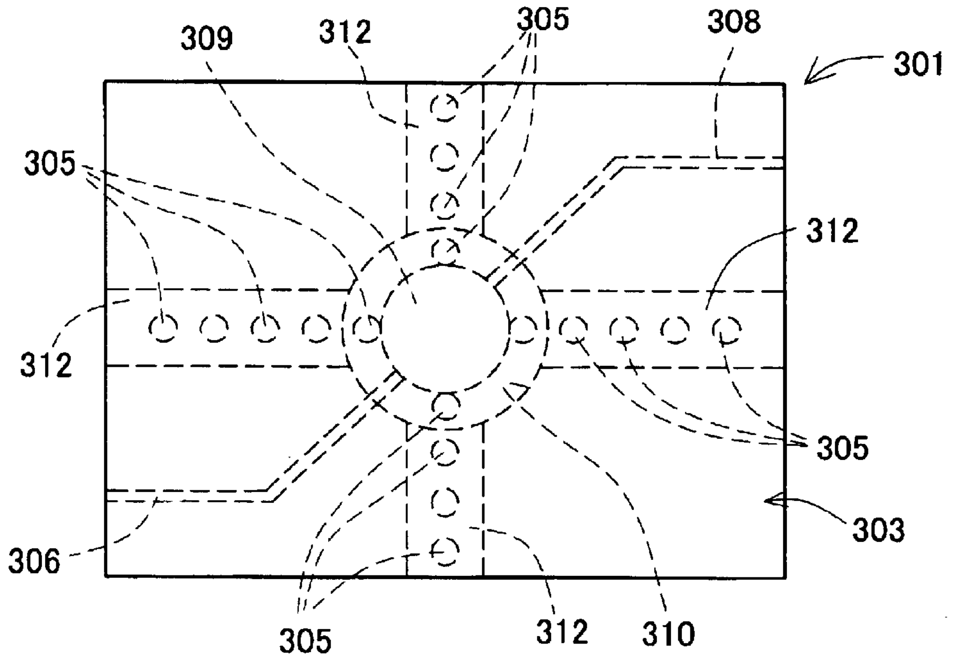
FIG. 30(A) is a plan view of the membrane switch and FIG. 30(B) is a rear view of the membrane switch.
Figure 30B:
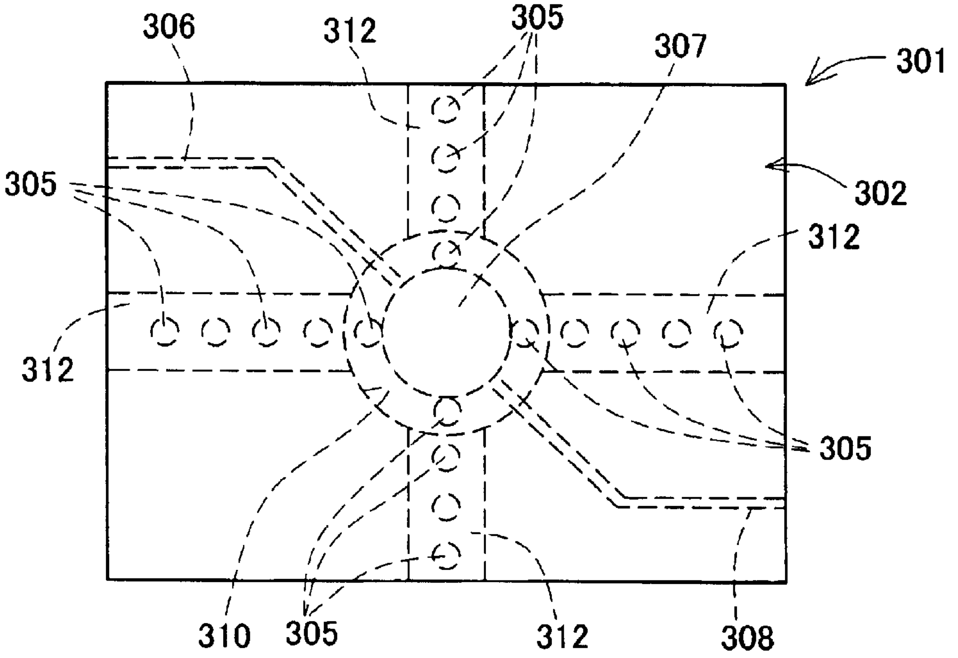
Figure 31:
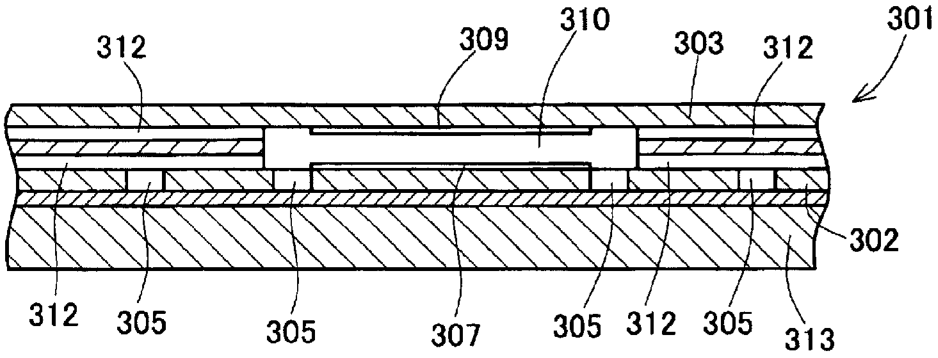
FIG. 31 is a cross-sectional side view of the membrane switch.

Subsequently, a membrane switch according to the fourth embodiment which is used in a key switch attached to a keyboard 105 of the above-mentioned notebook type personal computer 101 is explained in conjunction with FIG. 29 to FIG. 31. Here, FIG. 29 is an exploded perspective view showing a portion of a membrane switch in an exploded manner. FIG. 30 shows a portion of the membrane switch, wherein FIG. 30(A) is a plan view of the membrane switch and FIG. 30(B) is a rear view of the membrane switch. FIG. 31 is a cross-sectional side view of the membrane switch.

In FIG. 29, the membrane switch 301 is basically constituted of a lower membrane sheet 302, an upper membrane sheet 303, and a spacer sheet 304 which is interposed between the lower membrane sheet 302 and the upper membrane sheet 303.

Here, the lower membrane sheet 302 is formed of a film sheet made of polyethylene terephthalate (hereinafter abbreviated as "PET) and a lower switch electrode 307 which is connected to a circuit pattern 306 is formed on an upper surface of the lower membrane sheet 302. Further, using a lower switch electrode 307 as a start point, a plurality of air bleeding holes 305 are formed in the lower membrane sheet 302 such that the air bleeding holes 305 are continuously arranged in four rows in the longitudinal and lateral directions.

Further, the upper membrane sheet 303 is formed of a PET film sheet in the same manner as the lower membrane sheet 302. An upper switch electrode 309 which is connected to a circuit pattern 308 is formed on a lower surface of the upper membrane sheet 303 at a position corresponding to the lower switch electrode 307 of the lower membrane sheet 302.

Here, the circuit pattern 306 and the lower switch electrode 307 formed on the lower membrane sheet 302 and the circuit pattern 308 and the upper switch electrode 309 formed on the upper membrane sheet 303 can be formed by a known method. For example, they may be formed into given patterns by coating using a conductive paint containing carbon particles and silver particles or the like. Further, they ma by formed by etching a copper foil adhered to a PET film sheet into given patterns.

The spacer sheet 304 is formed of a PET film sheet in the same manner as the lower membrane sheet 302 and the upper lower membrane sheet 303. A switching hole 310 is formed in the spacer sheet 304 at a position corresponding to the lower switch electrode 307 and the upper switch electrode 309. Such a switching hole 310 is served for making the lower switch electrode 307 and the upper switch electrode 309 spaced apart from each other at the time of non-switching operation and for moving the upper switch electrode 309 when an upper surface of the upper membrane sheet 303 which corresponds to the upper switch electrode 309 is pushed thus bringing the upper switch electrode 309 into contact with the lower switch electrode 307 at the time of performing the switching operation. Further, by forming adhesive agent layers 311 on both surfaces of the spacer sheets 304 by coating, four rows of air grooves 312 which are communicated with the switching hole 310 and the outside of the membrane switch 301 are formed. Respective air grooves 312 are formed in the longitudinal direction as well as in the lateral direction using the switching hole 310 as a start point. Here, respective air grooves 312 which are formed on the lower surface of the spacer sheet 304 by means of the adhesive agent layers 311 correspond to respective air bleeding holes 305 which are formed in the lower membrane sheet 302 in four rows in the longitudinal direction as well as in the lateral direction using the lower electrode 307 as a start point. As shown in FIG. 30(A) and FIG. 30(B), respective air bleeding holes 305 are arranged such that the air bleeding holes 305 are positioned inside respective air grooves 312. Further, as shown in FIG. 29 to FIG. 31, the switching hole 310 formed in the spacer sheet 304 is formed larger than the upper electrode 309 and the lower electrode 307. Further, the air bleeding holes 305 are formed such that out of a plurality of air bleeding holes 305 in each of four rows which are formed in the lower membrane sheet 302, each air bleeding hole 305 which constitutes the innermost port is arranged in the inside of the switching hole 310.

Here, as shown in FIG. 31, the membrane switch 301 having the above-mentioned constitution is fixed by adhesion to the switch support plate 313 using an adhesive agent or a pressure sensitive adhesive double-sided tape.

In the above-mentioned membrane switch 301 according to the above-mentioned embodiment, by adhering the upper membrane sheet 303 and the lower membrane sheet 302 to both surfaces of the spacer sheet 304 by way of the adhesive agent layers 311 formed on both surfaces of the spacer sheet 304 by coating, four rows of air grooves 312 which are communicated with the outside of the membrane switch 301 are formed between the spacer sheet 304 and the upper membrane sheet 303 and the lower membrane sheet 302, and more particularly between the spacer sheet 304 and the lower membrane sheet 302. Further, a plurality of air bleeding holes 305 are formed in four rows in the lower membrane sheet 302 such that the air bleeding holes 305 are arranged in the inside of respective air grooves 312. Therefore, at the time of fixing the lower membrane sheet 302 of the membrane switch 301 to the switch support plate 313 by adhesion using an adhesive agent or a pressure sensitive adhesive double-sided tape, even when bubbles remain between the lower surface of the lower membrane sheet 302 and the adhesive surface of the support plate 313, it is possible to leak the bubbles to the outside through respective air bleeding holes 305 and air grooves 312. Accordingly, it is possible to surely fix the membrane switch 301 to the adhesive surface of the support plate 313 always in a flat state.

Further, four rows of respective air grooves 312 which are communicated with the outside of the membrane switch 301 and are communicated with the switching hole 310 formed in the spacer sheet 304 are formed using the switching hole 310 as a starting point. Still further, respective air bleeding holes 305 are formed continuously in a plural number along each air groove 312. Therefore, at the time of fixing the lower membrane sheet 302 of the membrane switch 301 to the switch support plate 313 by adhesion using an adhesive agent or a pressure sensitive adhesive double-sided tape, even when bubbles remain between the lower surface of the lower membrane sheet 302 and the adhesive surface of the support plate 313 in a broad range, it is possible to leak the bubbles to the outside through respective air bleeding holes 305 and air grooves 312. Further, at the time of performing the switching operation by pushing the upper surface of the upper electrode 309 of the upper membrane sheet 303, it is possible to leak air inside the switching hole 310 to the outside through respective air grooves 312 and hence, it is possible to always perform the stable switching operation.

Further, the switching hole 310 formed in the spacer sheet 304 are formed larger than the lower electrode 307 of the lower membrane sheet 302 and out of a plurality of air bleeding holes 305 in each row of four rows which are formed in the lower membrane sheet 302, each air bleeding hole 305 which constitutes the innermost port is arranged in the inside of the switching hole 310. Accordingly, at the time of fixing the lower membrane sheet 302 of the membrane switch 301 to the switch support plate 313 by adhesion using an adhesive agent or a pressure sensitive adhesive double-sided tape, even when bubbles remain between the lower surface of the lower membrane sheet 302 and the adhesive surface of the support plate 313 at a position corresponding to the switching hole 310, it is possible to rapidly and surely leak the bubbles to the outside through the air bleeding holes 305 arranged in the inside of the switching hole 310, the switching hole 310 and the air grooves 312.

Figure 32:
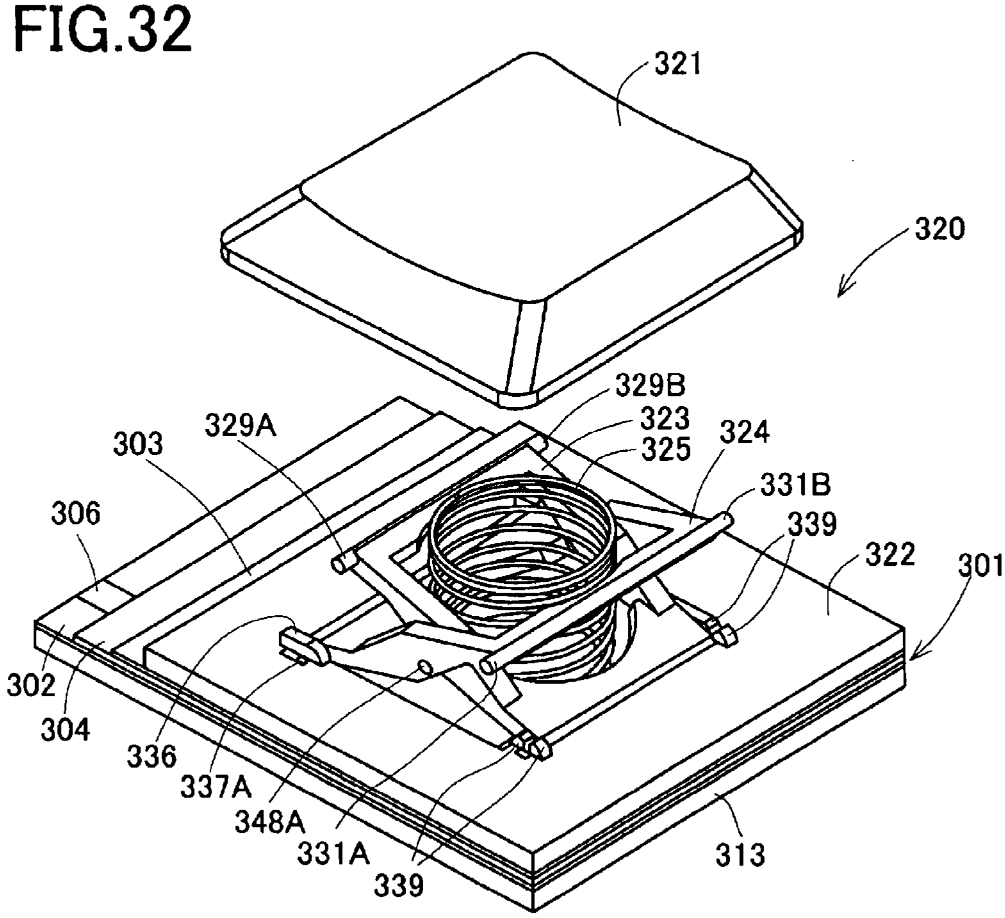
FIG. 32 is a perspective view of the key switch in a state that a key top is removed.
Figure 33:
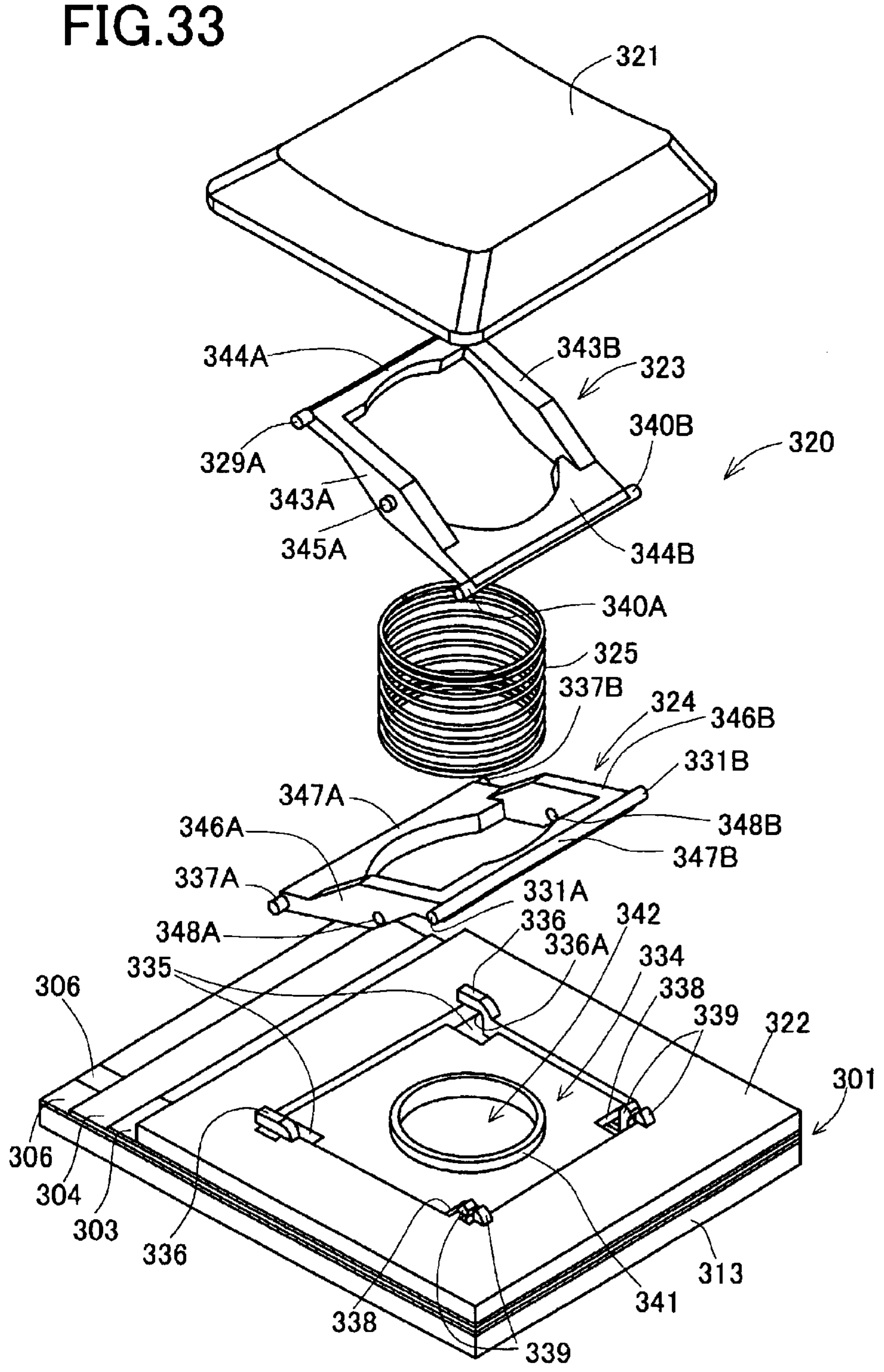
FIG. 33 is an exploded perspective view of the key switch.
Figure 34:
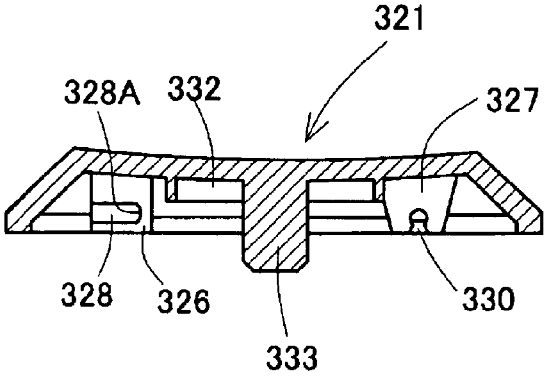
FIG. 34 is a cross-sectional side view of the key top.
Figure 35:
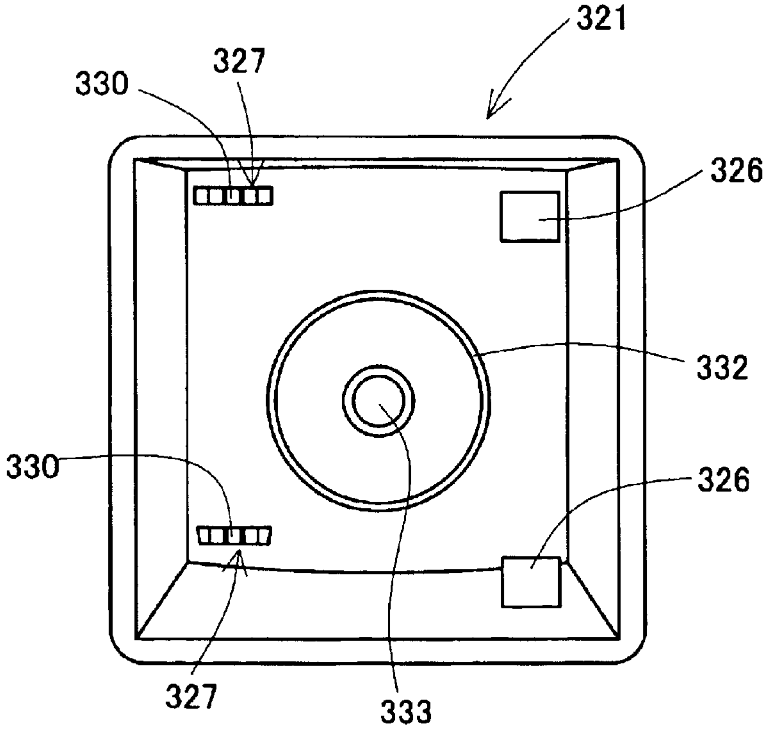
FIG. 35 is a rear view of the key top.
Figure 36:
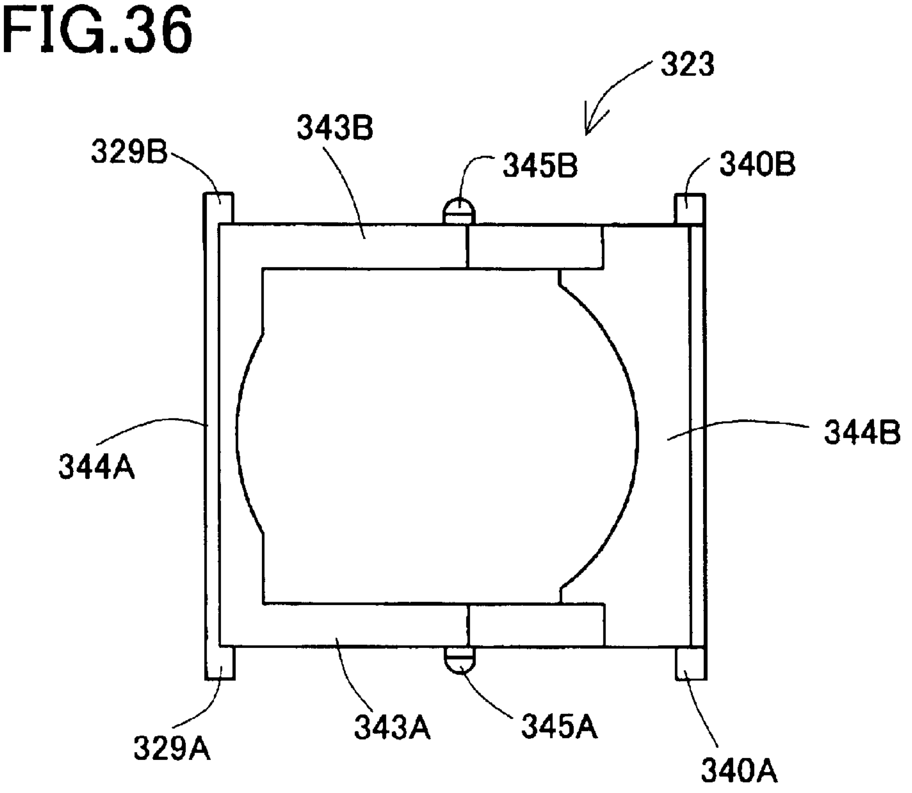
FIG. 36 is a plan view of a first link member.
Figure 37:
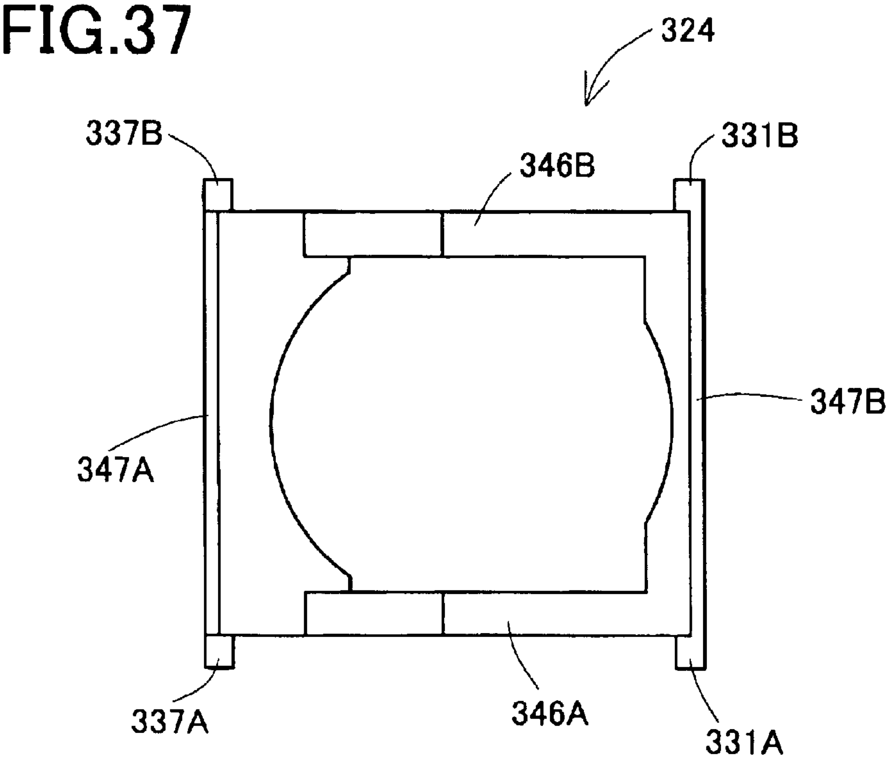
FIG. 37 is a plan view of a second link member.

Then, the key switch which uses the membrane switch 301 having the above-mentioned constitution is explained in conjunction with FIG. 32 to FIG. 37. Here, FIG. 32 is a perspective view of the key switch in a state that the key top is removed, FIG. 33 is an exploded perspective view of the key switch, FIG. 34 is a cross-sectional side view of the key top, FIG. 35 is a rear view of the key top, FIG. 36 is a plan view of a first link member, and FIG. 37 is a plan view of a second link member.

First of all, the schematic constitution of the key switch is explained in conjunction with FIG. 32 and FIG. 33. In FIG. 32 and FIG. 33, the key switch 320 is substantially constituted of a key top 321, a holder member 322 disposed below the key top 321, a first link member 323 and a second link member 324 which are connected to and engaged with a back surface of the key top 321 and the holder member 321 and guide the vertical movement of the key top 321, a coil spring 325 which biases the key top 321 upwardly, a membrane switch 301 which is arranged below the holder member 322, and a support plate 313 disposed below the membrane switch 301 for supporting the whole key switch 320.

Here, the key top 321 is formed of synthetic resin such as ABS resin or the like, and characters, symbols and the like are formed on an upper surface there of by a known method such as printing. Further, on the back surface of the key top 321, as shown in FIG. 34 and FIG. 35, a pair of slide engaging portions 326 and a pair of rotary engaging portions 327 are integrally formed. Slide grooves 328 are formed in respective slide engaging portions 326 and respective engaging pins 329A, 329B of the first link member 323 which will be explained later are slidably engaged in respective slide grooves 328. Here, closed end faces 328A are formed in the slide grooves 328. Further, rotary grooves 330 which open downwardly are formed in respective rotary engaging portions 327. Respective engaging pins 331A, 331B of the second link member 334 which will be explained later are rotatably engaged with these rotary grooves 330.

Further, on the back surface of the key top 321 and at a position surrounded by respective slide engaging portions 326 and the rotary engaging portions 327 present at four corners of the back surface, a cylindrical spring holding portion 332 (see FIG. 38, FIG. 39) which is fitted on an upper end portion of the coil spring 325 and holds the coil spring 325 is formed. Further, at an approximately center position of the spring holding portion 332, a pushdown projection 333 which pushes down the upper electrode 309 of the upper membrane sheet 303 in the membrane switch 301 is provided such that the pushdown projection 333 extends downwardly. As shown in FIG. 34, the pushdown projection 333 has a length larger than a thickness of the key top 321 and extends downwardly from a lower end face of the key top 321. As will be explained later, the pushdown projection 333 performs an action to push down an upper surface of the upper electrode 309 formed on the upper membrane sheet 303 of the membrane switch 301 at the time of pushing down the key top 321.

The holder member 322 disposed below the key top 321 is made of synthetic resin such as ABS resin or the like. In such a holder member 322, a key station portion 334 is formed for every key switch 320, wherein the key station portion 334 has a film thickness smaller than a film thickness of a peripheral portion around the key station portion 334. Corner holes 335 are respectively formed in two corners at one side (left side in FIG. 33) of the key station portion 334. Slide engaging lugs 336 are integrally formed with the holder member 322 in such a manner that the slide engaging lugs 336 project from side ends of respective corner holes 335 and overhang above respective corner holes 335. Engaging pins 337A, 337B of the second link member 324 which will be explained later are slidably engaged with respective slide engaging lugs 336. Here, closed end faces 336A are formed on the slide engaging lugs 336. Further, corner holes 338 are respectively formed in two corners at another side (right side in FIG. 33) of the key station portion 334. A pair of sandwiching walls 339 are formed in the vicinity of each corner hole 338. Engaging pins 340A and 340B of the first link member 323 which will be explained later are rotatably engaged with the respective sandwiching walls 339.

Further, at an approximately center position of the key station portion 334, a cylindrical spring holding portion 341 (see FIG. 38, FIG. 39) which is fitted on and holds a lower end portion of the coil spring 325 is formed. Inside the spring holding portion 341, an opening 342 which penetrates the holder member 322 is formed. The opening 342 corresponds to the pushdown projection 333 of the key top 321. At the time of pushing down the key top 321, the pushdown projection 333 moves downwardly through the opening 342 and pushes down the upper surface of the upper electrode 309 formed on the upper membrane sheet 303 in the membrane switch 301 so as to bring the upper electrode 309 of the upper membrane sheet 303 and the lower electrode 307 of the lower membrane sheet 302 into contact with each other.

As shown in FIG. 36, the first link member 223 is formed in an approximately "square" shape in a plan view and includes a pair of plate-like portions 343A, 343B and connecting portions 344A, 344B which respectively connect both end portions of the respective plate-like portions 343A, 343B. Further, the engaging pins 329A, 329B are extended outwardly from corner portions of one connecting portion 344A (left-side connecting portion in FIG. 36), while the engaging pins 340A, 340B are extended outwardly from corner portions of another connecting portion 344B (right-side connecting portion in FIG. 36). Respective engaging pins 329A, 329B are slidably engaged with the slide grooves 328 formed in respective slide engaging portions 326 of the key top 321, while respective engaging pins 340A, 340B are rotatably engaged in a pair of sandwiching walls 339, 339 of the holder member 322. Further, shaft portions 345A, 345B are formed on approximately center portions of respective plate-like portions 343A, 343B in a projected manner.

As shown in FIG. 37, the second link member 324 is formed in an approximately "square" shape in a plan view in the same manner as the first link member 323 and includes a pair of plate-like portions 346A, 346B and connecting portions 347A, 347B which respectively connect both end portions of the respective plate-like portions 346A, 346B. Further, the engaging pins 337A, 337B are extended outwardly from corner portions of one connecting portion 347A (left-side connecting portion in FIG. 37), while the engaging pins 331A, 331B are extended outwardly from corner portions of another connecting portion 347B (right-side connecting portion in FIG. 37). Respective engaging pins 331A, 331B are rotatably engaged with the rotary grooves 330 formed in respective rotary engaging portions 327 of the key top 321, while respective engaging pins 337A, 337B are slidably engaged with respective slide engaging lugs 336 of the holder member 322. Further, shaft holes 348A, 348B are formed in approximately center portions of respective plate-like portions 346A, 346B (see FIG. 33). The shaft portions 345A, 345B of the first link member 323 are respectively rotatably pivoted in respective shaft holes 348A, 348B. Accordingly, the first link member 323 and the second link member 324 are connected in a relatively rotatable manner based on the pivotal relationship between the shaft portions 345A, 345B and the shaft holes 348A, 348B.

The coil spring 325 is provided for performing a function of biasing the key top 321 upwardly. The upper end portion of the coil spring 325 is fitted on and held by the outside of the spring holding portion 332 formed on the key top 321, while the lower end portion of the coil spring 325 is fitted on and held by the outside of the spring holding portion 341 formed on a key station portion 334 of the holder member 322.

Figure 38:
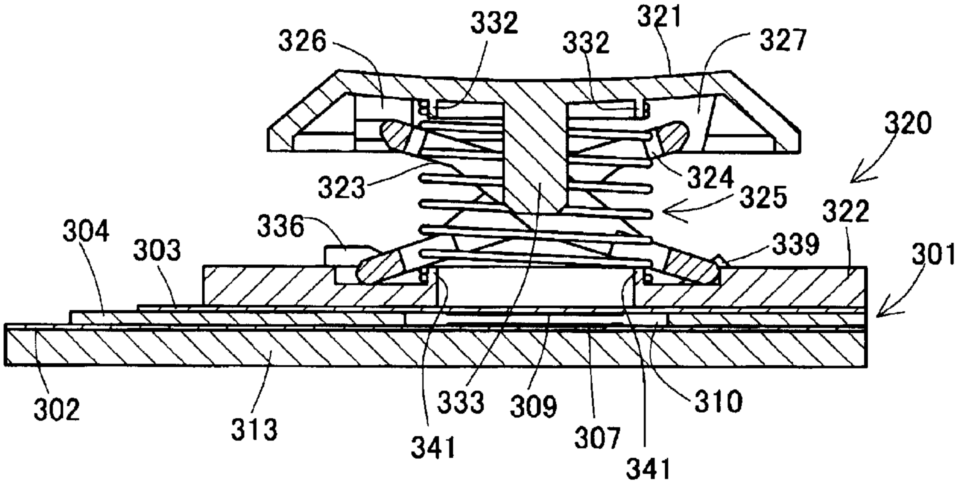
FIG. 38 is a cross-sectional side view of the key switch when the key top is in a non-pushdown state.
Figure 39:
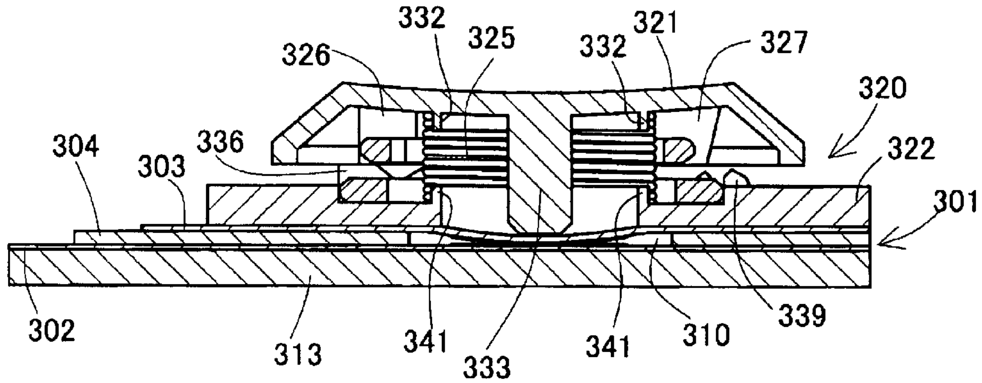
FIG. 39 is a cross-sectional side view of the key switch when the key top is in a pushdown state.

The manner of operation of the key switch 320 having the above-mentioned constitution is explained in conjunction with FIG. 38 and FIG. 39. FIG. 38 is a cross-sectional side view of the key switch in a state that the key top is not pushed down and FIG. 39 is a cross-sectional side view of the key switch in a state that the key top is pushed down. In FIG. 38 and FIG. 39, the air grooves 312 which are formed on both surfaces of the spacer sheet 304 in the membrane switch 301 are omitted.

In the state that the key top 321 is not pushed down, as shown in FIG. 38, the key top 321 is biased upwardly based on a biasing force of the coil spring 325 so that the key top 321 is held at the non-pushdown position. In such a non-pushdown position, respective engaging pins 329A, 329B of the first link member 323 which are engaged with the slide grooves 328 of slide engaging portions 326 in the key top 321 are brought into contact with the closed end faces 328A of the slide grooves 328, while respective engaging pins 337A, 337B of the second link member 324 which are engaged with the slide engaging lugs 336 in the holder member 322 are brought into contact with the closed end faces 336A of the slide engaging lugs 336. Accordingly, the upward movement of the key top 321 is restricted.

When the key top 321 is pushed downwardly against the biasing force of the coil spring 325, respective engaging pins 329A, 329B of the first link member 323 are made to gradually slide in the right direction in the inside of the slide grooves 328 of slide engaging portions 326 and respective engaging pins 340A, 340B are rotated in a counterclockwise direction in the inside of sandwiching walls 339, 339. Simultaneously, respective engaging pins 337A, 337B of the second link member 324 are made to gradually slide in the right direction in the inside of the slide engaging lugs 336 and respective engaging pins 331A, 331B are rotated in the clockwise direction in the inside of the rotary grooves 330 of the rotary engaging portions 327 of the key top 321. Corresponding to such rotation, the pushdown projection 333 of the key top 321 is gradually moved downwardly.

When the key top 321 is further pushed down, the pushdown projection 333 of the key top 321 passes the opening 342 in the inside of the spring holding portion 341 formed in the key station portion 334 and pushes down the upper electrode 309 formed on the upper membrane sheet 303 of the membrane switch 301. Accordingly, as shown in FIG. 39, the upper electrode 309 of the upper membrane sheet 303 and the lower electrode 307 of the lower membrane sheet 302 are brought into contact with each other through the switching hole 310 of the spacer sheet 304 whereby the switching operation is performed.

Here, in the above-mentioned pushing operation of the membrane switch 301, at the time of performing the switching operation by pushing the upper surface of the upper electrode 309 of the upper membrane sheet 303, air inside the switching hole 310 can be leaked to the outside through respective air grooves 312 and hence, it is possible to always perform the stable switching operation.

When the pushdown of the key top 321 is released, the operation opposite to the above-mentioned operation is performed based on the biasing force of the coil spring 325 and hence, the key top 321 returns to the non-pushdown position shown in FIG. 38.

As has been explained above, according to the above-mentioned key switch 320, in the membrane switch 301 which is arranged below the holder member 322, by adhering the upper membrane sheet 303 and the lower membrane sheet 302 to both surfaces of the spacer sheet 304 by way of the adhesive agent layers 311 formed on both surfaces of the spacer sheet 304 by coating, four rows of air grooves 312 which are communicated with the outside are formed between the spacer sheet 304 and the upper membrane sheet 303 and the lower membrane sheet 302, and more particularly between the spacer sheet 304 and the lower membrane sheet 302. Further, a plurality of air bleeding holes 305 are formed in four rows in the lower membrane sheet 302 such that the air bleeding holes 305 are arranged in the inside of respective air grooves 312. Therefore, at the time of fixing the lower membrane sheet 302 of the membrane switch 301 to the support plate 313 by adhesion using an adhesive agent or a pressure sensitive adhesive double-sided tape, even when bubbles remain between the lower surface of the lower membrane sheet 302 and the adhesive surface of the support plate 313, it is possible to leak the bubbles to the outside through respective air bleeding holes 305 and air grooves 312. Accordingly, it is possible to surely fix the membrane switch 301 to the adhesive surface of the support plate 313 always in a flat state.

Further, four rows of respective air grooves 312 which are communicated with the outside of the membrane switch 301 and are communicated with the switching hole 310 formed in the spacer sheet 304 are formed using the switching hole 310 as a starting point. Still further, respective air bleeding holes 305 are formed continuously in a plural number along each air groove 312. Therefore, at the time of fixing the lower membrane sheet 302 of the membrane switch 301 to the support plate 313 by adhesion using an adhesive agent or a pressure sensitive adhesive double-sided tape, even when bubbles remain between the lower surface of the lower membrane sheet 302 and the adhesive surface of the support plate 313 in a broad range, it is possible to leak the bubbles to the outside through respective air bleeding holes 305 and air grooves 312. Further, at the time of performing the switching operation by pushing the upper surface of the upper electrode 309 of the upper membrane sheet 303, it is possible to leak air inside the switching hole 310 through respective air grooves 312 and hence, it is possible to always perform the stable switching operation.

Further, the switching hole 310 formed in the spacer sheet 304 is formed larger than the lower electrode 307 of the lower membrane sheet 302 and out of a plurality of air bleeding holes 305 in each row of four rows which are formed in the lower membrane sheet 302, each air bleeding hole 305 which constitutes the innermost port is arranged in the inside of the switching hole 310. Accordingly, at the time of fixing the lower membrane sheet 302 of the membrane switch 301 to the switch support plate 313 by adhesion using an adhesive agent or a pressure sensitive adhesive double-sided tape, even when bubbles remain between the lower surface of the lower membrane sheet 302 and the adhesive surface of the support plate 313 at a portion thereof corresponding to the switching hole 310, it is possible to rapidly and surely leak the bubbles to the outside through the air bleeding holes 305 arranged in the inside of the switching hole 310, the switching hole 310 and the air grooves 312.

Figure 40:
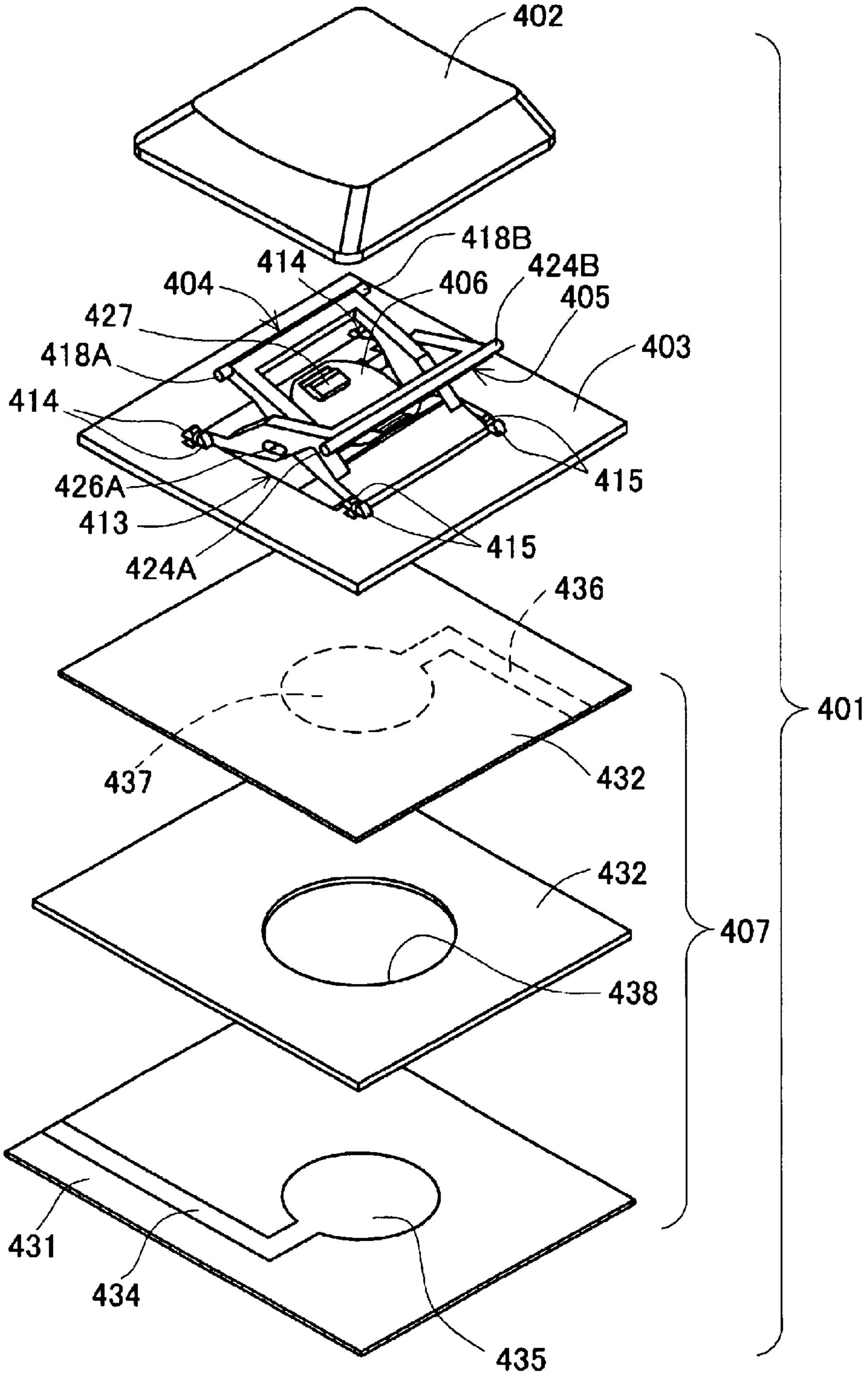
FIG. 40 is an exploded perspective view of a key switch according to the fifth embodiment.
Figure 41:
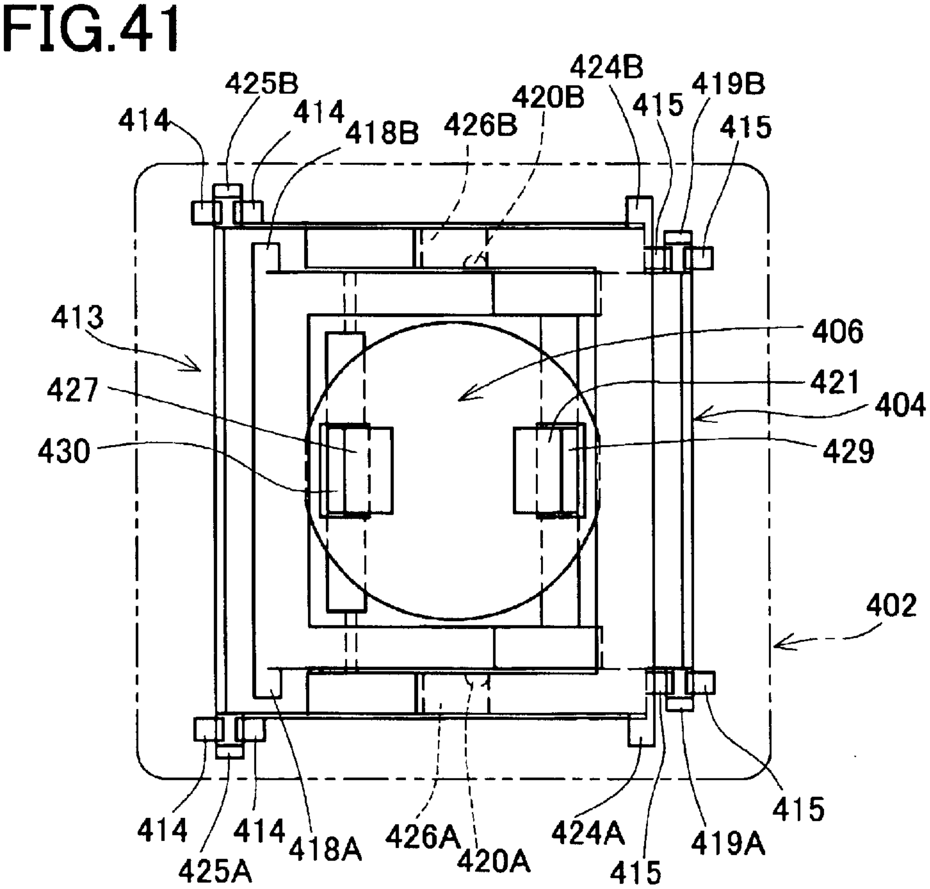
FIG. 41 is a plan view of the key switch in a state that a key top is removed.
Figure 42:
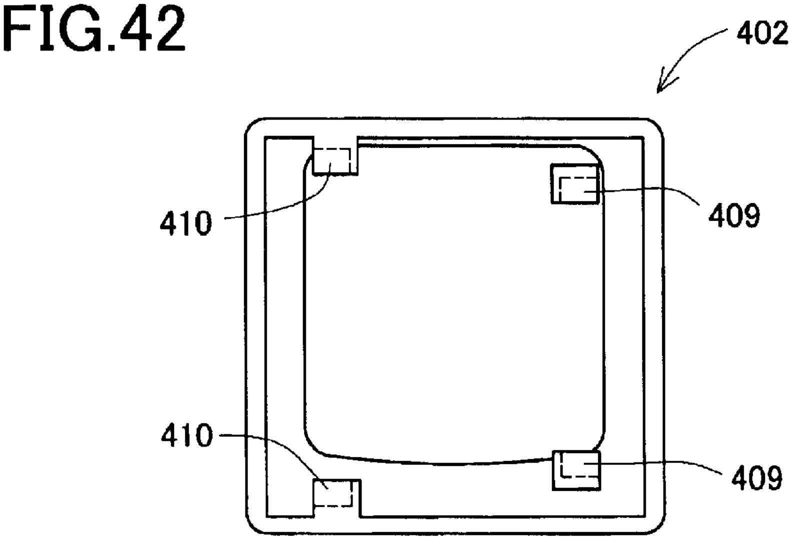
FIG. 42 is a rear view of the key top.
Figure 43:
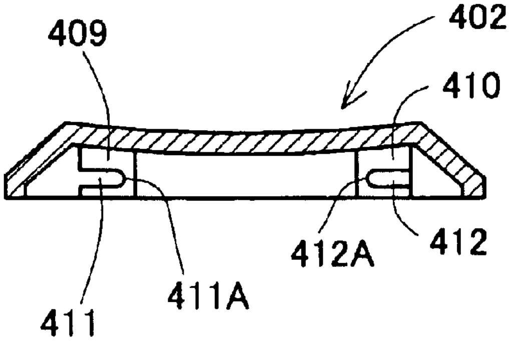
FIG. 43 is a cross-sectional side view of the key top.
Figure 44:
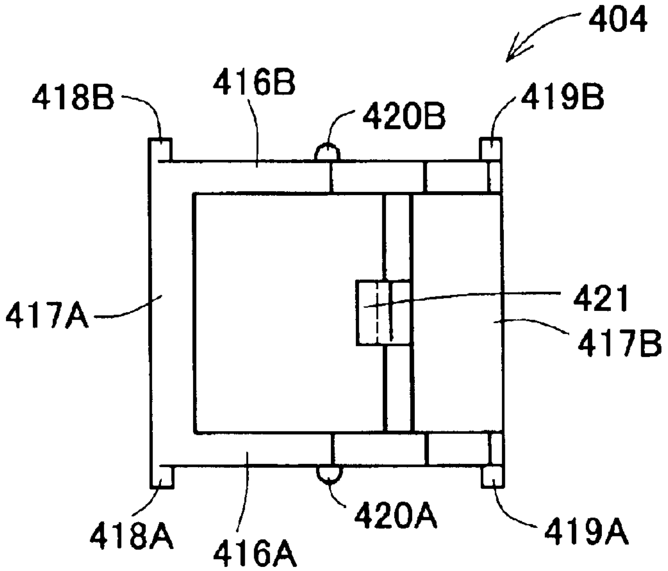
FIG. 44 is a plan view of a first link member.
Figure 45:
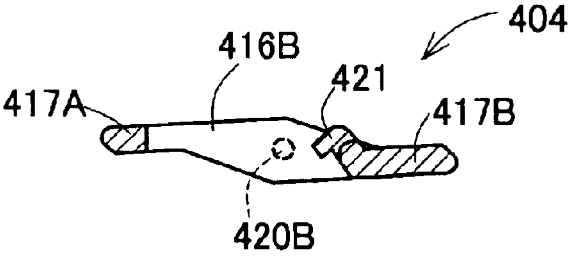
FIG. 45 is a cross-sectional side view of the first link member.
Figure 46:
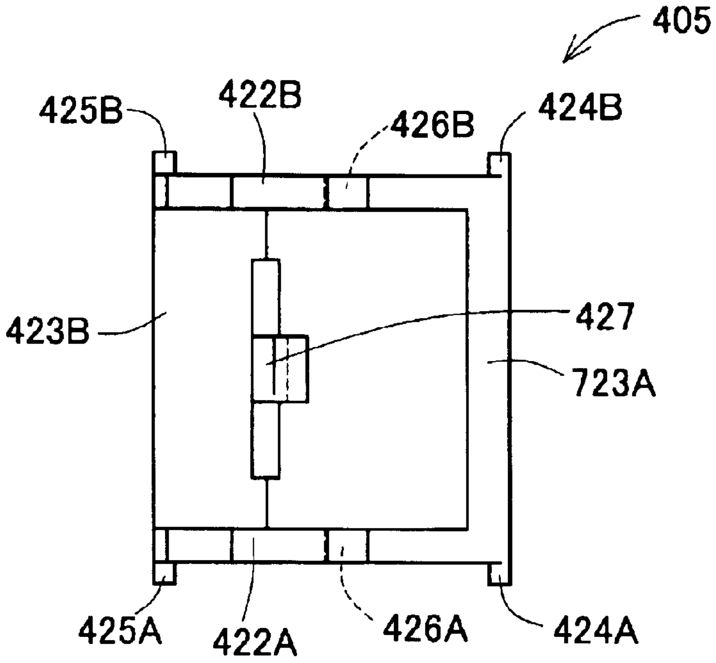
FIG. 46 is a plan view of a second link member.
Figure 47:
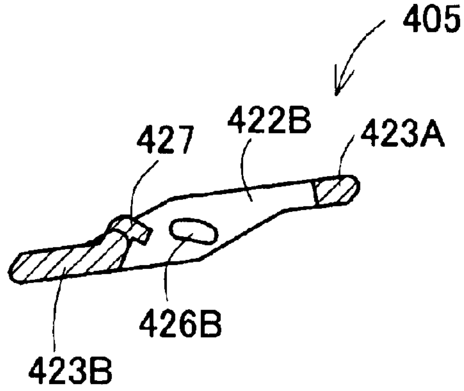
FIG. 47 is a cross-sectional side view of the second link member.
Figure 48:
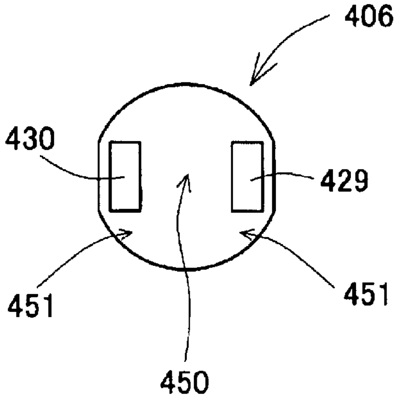
FIG. 48 is a plan view of a spring member.

Then, the key switch according to the fifth embodiment which is attached to the keyboard 105 of the above-mentioned notebook type personal computer 101 is explained in conjunction with FIG. 40 to FIG. 48. Here, FIG. 40 is an exploded perspective view of a key switch according to the fifth embodiment, FIG. 41 is a plan view of a key switch in a state that the key top is removed, FIG. 42 is a rear view of the key top, FIG. 43 is a cross-sectional side view of the key top, FIG. 44 is a plan view of a first link member, FIG. 45 is a cross-sectional side view of the first link member, FIG. 46 is a plan view of a second link member, FIG. 47 is a cross-sectional side view of the second link member, and FIG. 48 is a plan view of the spring member.

First of all, the schematic constitution of the key switch is explained in conjunction with FIG. 40 and FIG. 41. In FIG. 40 and FIG. 41, the key switch 401 is substantially constituted of a key top 402, a holder member 403 disposed below the key top 402, a first link member 404 and a second link member 405 which are connected and engaged with a back surface of the key top 402 and the holder member 403 and guide the vertical movement of the key top 402, a spring member 406 which biases the key top 402 upwardly, a membrane switch 407 which is arranged below the holder member 403, and a support plate 408 (see FIG. 49, FIG. 50) disposed below the membrane switch 407 for supporting the whole key switch 401.

Here, the key top 402 is formed of synthetic resin such as ABS resin or the like, and characters, symbols and the like are formed on an upper surface there of by a known method such a sprinting. Further, on the back surface of the key top 402, as shown in FIG. 42 and FIG. 43, a pair of slide engaging portions 409 are integrally formed at one side (right side in FIG. 42 and left side in FIG. 43) and a pair of slide engaging portions 410 are integrally formed at another side (left side in FIG. 42 and right side in FIG. 43). Further, slide grooves 411 are formed in respective slide engaging portions 409 and respective engaging pins 418A, 418B of the first link member 404 which will be explained later are slidably engaged in respective slide grooves 411. Here, closed end faces 411A are formed in the slide grooves 411. Further, slide grooves 412 are also formed in respective slide engaging portions 410 and respective engaging pins 424A, 424B of the second link member 405 which will be explained later are slidably engaged in respective slide grooves 412. Here, closed end faces 412A are formed in the slide grooves 412.

The holder member 403 disposed below the key top 402 is made of synthetic resin such as ABS resin or the like. In such a holder member 403, a key station portion 413 is formed for every key switch 401, wherein a rectangular through hole is formed in the key station portion 413. A pair of sandwiching walls 414 are formed at two corner portions at one side (left side in FIG. 40, FIG. 41) of the key station portion 413. Between respective sandwiching walls 414, engaging pins 425A, 425B of the second link member 405 which will be explained later are rotatably engaged. Further, a pair of sandwiching walls 415 are formed at two corner portions at another side (right side in FIG. 40, FIG. 41) of the key station portion 413. At respective sandwiching walls 415, engaging pins 419A, 419B of the first link member 404 which will be explained later are rotatably engaged.

As shown in FIG. 44, the first link member 404 is formed in an approximately "square" shape in a plan view and includes a pair of plate-like portions 416A, 416B and connecting portions 417A, 417B which respectively connect both end portions of the respective plate-like portions 416A, 416B. Further, the engaging pins 418A, 419B are extended outwardly from corner portions of one connecting portion 417A (left-side connecting portion in FIG. 44), while the engaging pins 419A, 419B are extended outwardly from corner portions of another connecting portion 417B (right-side connecting portion in FIG. 44). Respective engaging pins 418A, 418B are slidably engaged with the slide grooves 411 formed in respective slide engaging portions 409 of the key top 402, while respective engaging pins 419A, 419B are rotatably engaged in a pair of sandwiching walls 415, 415 of the holder member 403. Further, shaft portions 420A, 420B are formed on approximately center portions of respective plate-like portions 416A, 416B in a projected manner. Further, a spring holding portion 421 is integrally formed on an inner side (left side in FIG. 44) of a connecting portion 417B in a bent shape. The spring holding portion 421 is loosely held in a holding hole 429 formed in the spring member 406 which will be explained later.

As shown in FIG. 46, the second link member 405 is formed in an approximately "square" shape in a plan view in the same manner as the first link member 404 and includes a pair of plate-like portions 422A, 422B and connecting portions 423A, 423B which respectively connect both end portions of the respective plate-like portions 422A, 422B. Further, the engaging pins 424A, 424B are extended outwardly from corner portions of one connecting portion 423A (right-side connecting portion in FIG. 46), while the engaging pins 425A, 425B are extended outwardly from corner portions of another connecting portion 423B (left-side connecting portion in FIG. 46). Respective engaging pins 424A, 424B are slidably engaged with the slide grooves 412 formed in respective slide engaging portions 410 of the key top 402, while respective engaging pins 425A, 425B are rotatably engaged with respective sandwiching walls 414 of the holder member 403. Further, shaft holes 426A, 426B having an elongated curved shape are formed in approximately center portions of respective plate-like portions 422A, 422B (see FIG. 47). The shaft portions 420A, 420B of the first link member 404 are respectively rotatably and slidably pivoted by respective shaft holes 426A, 426B. Accordingly, the first link member 404 and the second link member 405 are connected in a relatively rotatable manner as well as in a relatively movable manner based on the pivotal relationship between the shaft portions 420A, 420B and the shaft holes 426A, 426B. Further, a spring holding portion 427 is integrally formed on an inner side (right side in FIG. 46) of a connecting portion 423B in a bent shape. The spring holding portion 427 is loosely fitted into and held in a holding hole 430 formed in the spring member 406 which will be explained later.

Figure 49:
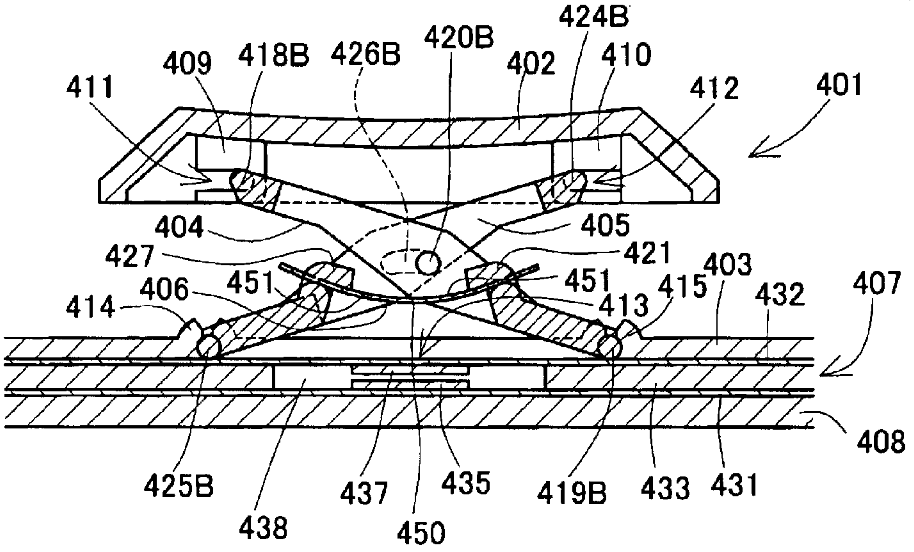
FIG. 49 is a cross-sectional side view of the key switch when the key top is in a non-pushdown state.

As shown in FIG. 48, the spring member 406 is formed of a thin resilient metal plate made of steel material or stainless steel and having an approximately circular shape in a plan view. The spring member 406 has a pushing portion 450 at an approximately center portion thereof and a peripheral portion 451 is defined by the periphery of the pushing portion 450. The holding holes 429, 430 are formed in both sides of the spring member 406, wherein a spring holding portion 421 of the first link member 404 is loosely fitted into the holding hole 429 and a spring holding portion 427 of the second link member 405 is loosely fitted into the holding hole 430. In a state that the spring holding portion 421 is loosely fitted into the holding hole 429 and the spring holding portion 427 is loosely fitted into the holding hole 430, as shown in FIG. 49, the spring member 406 performs a function of biasing the key top 402 upwardly in a state that the spring member 406 is slightly curved downwardly due to a resilient force thereof. Here, although the spring member 406 is formed in an approximately circular shape, any shape can be adopted provided that the shape gradually increases a width thereof toward the center portion thereof. In this manner, the reason that the width of the spring member 406 is gradually increased from respective holding holes 429, 430 to the center portion is that, as will be explained later, a stress which is generated in the spring member 406 due to the pushdown operation of the key top 402 can be dispersed at the center portion which has a large width and hence, it is possible to prevent the pushdown stress from being concentrated on the center portion of the spring member 406. Due to such a constitution, the durability of the spring member 406 can be enhanced. Here, when the spring member 406 is formed in an approximately circular shape as described above, a stress which is generated in the spring member 406 due to the pushdown operation of the key top 402 can be most uniformly dispersed over the whole spring member 406 and hence, the durability of the spring member 406 can be remarkably enhanced.

The membrane switch 407 which is arranged below the holder member 403 is, as shown in FIG. 40, basically constituted of a lower membrane sheet 431, an upper membrane sheet 432, a spacer sheet 433 which is interposed between the lower membrane sheet 431 and the upper membrane sheet 432.

Here, the lower membrane sheet 431 is formed of a film sheet made of polyethylene terephthalate (hereinafter abbreviated as "PET") and a lower switch electrode 435 which is connected to a circuit pattern 434 is formed on an upper surface of the lower membrane sheet 435. Further, the upper membrane sheet 432 is formed of a PET film sheet in the same manner as the lower membrane sheet 431. An upper switch electrode 437 which is connected to a circuit pattern 436 is formed on a lower surface of the upper membrane sheet 432 at a position corresponding to the lower switch electrode 435 of the lower membrane sheet 431.

Here, the circuit pattern 434 and the lower switch electrode 435 formed on the lower membrane sheet 431 and the circuit pattern 436 and the upper switch electrode 437 formed on the upper membrane sheet 432 can be formed by a known method. For example, they may be formed by coating into given patterns using a conductive paint containing carbon particles and silver particles or the like. Further, a copper foil adhered to a PET film sheet may be etched into given patterns.

The spacer sheet 433 is formed of a PET film sheet in the same manner as the lower membrane sheet 431 and the upper membrane sheet 432. A switching hole 438 is formed in the spacer sheet 433 at a position corresponding to the lower switch electrode 435 and the upper switch electrode 437. Such a switching hole 438 is served for making the lower switch electrode 435 and the upper switch electrode 437 spaced apart from each other at the time of non-switching operation and for moving the upper switch electrode 437 when an upper surface of the upper membrane sheet 432 which corresponds to the upper switch electrode 437 is pushed thus bringing the upper switch electrode 437 into contact with the lower switch electrode 435 at the time of performing the switching operation.

Figure 50:
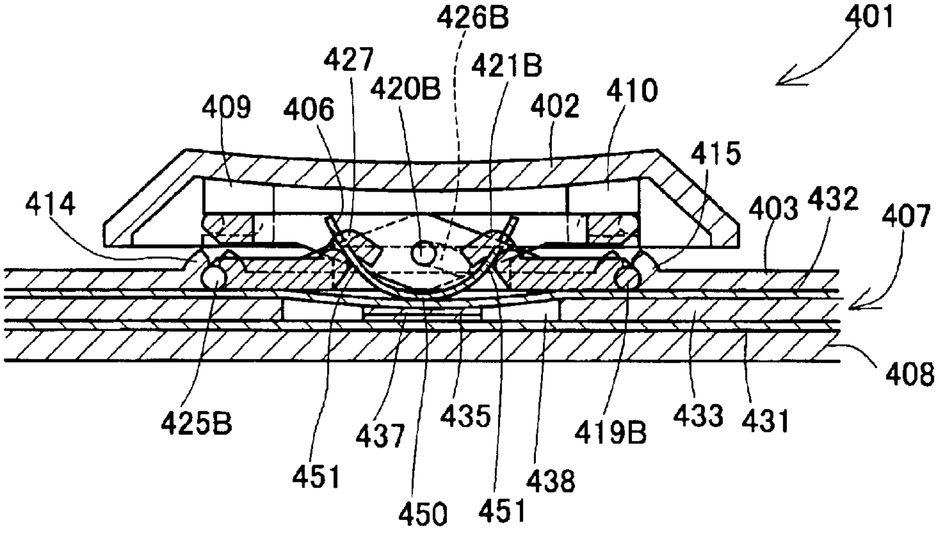
FIG. 50 is a cross-sectional side view of the key switch when the key top is in a pushdown state.

The manner of operation of the key switch 401 having the above-mentioned constitution is explained in conjunction with FIG. 49 and FIG. 50. FIG. 49 is a cross-sectional side view of the key switch in a state that the key top is not pushed down and FIG. 50 is a cross-sectional side view of the key switch in a state that the key top is pushed down.

In the state that the key top 402 is not pushed down, as shown in FIG. 49, the key top 402 is biased upwardly based on a resilient force of the spring member 406 so that key top 402 is held in the non-pushdown position. In such a non-pushdown position, respective engaging pins 418A, 418B of the first link member 404 which are engaged with the slide grooves 411 of slide engaging portions 409 in the key top 402 are brought into contact with the closed end faces 411A of the slide grooves 411, while respective engaging pins 424A, 424B of the second link member 405 which are engaged with the slide grooves 412 of respective slide engaging portions 410 are brought into contact with the closed end faces 412A of the slide grooves 412. Accordingly, the upward movement of the key top 402 is restricted. Here, as shown in FIG. 49, the spring member 406 is in a slightly downwardly curved state and hence, the pushing portion 450 and the peripheral portion 451 are held in a concave shape.

When the key top 402 is pushed downwardly against the biasing force of the spring member 406, respective engaging pins 418A, 418B of the first link member 404 are made to gradually slide in the right direction in the inside of the slide grooves 411 of slide engaging portions 409 and respective engaging pins 419A, 419B are rotated in a counterclockwise direction in the inside of sandwiching walls 415, 415. Simultaneously, respective engaging pins 424A, 424B of the second link member 405 are made to gradually slide in the right direction in the inside of the slide grooves 412 of the slide engaging portions 410 and respective engaging pins 425A, 425B are rotated in the clockwise direction in the inside of the sandwiching walls 414, 414. Corresponding to such rotation, the spring member 406 is gradually moved downwardly and the curved state of the spring member 406 is gradually increased.

When the key top 402 is further pushed down, the curved state of the spring member 406 is grown. Then, at a point of time that the pushing portion 450 which constitutes a lowermost end of the curved spring member 406 goes downwardly exceeding a line segment which connects the center of rotation of the respective engaging pins 419A, 419B of the first link member 404 which is engaged with the sandwiching walls 415, 415 and the center of rotation of the respective engaging pins 425A, 425B of the second link member 405 which is engaged with the sandwiching walls 414, 414, the pushing portion 450 which is positioned at the lowermost end of the curved spring member 406 pushes the upper electrode 437 of the upper membrane sheet 432 of the membrane switch 407 from an upper surface thereof with a clear click feeling. Accordingly, as shown in FIG. 50, the upper electrode 437 of the upper membrane sheet 432 and the lower electrode 435 of the lower membrane sheet 431 are brought into contact with each other through the switching hole 438 of the spacer sheet 433 whereby the switching operation is performed.

When the pushdown of the key top 402 is released, the operation opposite to the above-mentioned operation is performed based on the biasing force of the spring member 406 and hence, the key top 402 returns to the non-pushdown position shown in FIG. 49.

As has been explained above, in the key switch 401 according to the fifth embodiment, with respect to the spring member 406 formed of the thin resilient metal plate which biases the key top 402 upwardly, at least the pushing portion 450 and the peripheral portion 451 are arranged in a convex shape as viewed from a side. Accordingly, the deformation direction of the spring member 406 can be ensured. Further, since the spring holding portions 421, 427 which function as deformation action portions are respectively formed on portions of the first link member 404 and the second link member 405 located at sides closer to the sandwiching walls 414, 415 of the holder member 403 than a crossing portion of both link members 404, 405 as viewed from a side, when the key top 402 is pushed down, the spring member 406 is deformed in a U-shape due to the spring holding portions 421, 427 of the link members 404, 405 and, at the same time, the pushing portion 450 of the spring member 406 is lowered whereby the switching operation can be surely performed.

Further, the spring member 406 which is formed of the thin resilient metal plate is extended between the spring holding portion 421 of the first link member 404 and the spring holding member 427 of the second link member 405 which guide the vertical movement of the key top 402, and the key top 402 is biased upwardly by means of such a spring member 406. Accordingly, it is possible to ensure the stable characteristics such as key operability over a long period without receiving the influence attributed to the use environment due to the high durability that the thin resilient metal plate has.

Further, the circular spring member 406 is formed such that a width thereof is increased toward the center portion from the spring holding holes 429 and 430 and hence, a stress which is generated in the spring member 406 due to the pushdown operation of the key top 402 can be dispersed at the center portion which has a large width. Accordingly, it is possible to surely prevent the pushdown stress from being concentrated on the center portion of the spring member 406. Due to such a constitution, the durability of the spring member 406 can be enhanced.

Here, the spring member 406 is formed in an approximately circular shape in a plan view in this embodiment and hence, a stress which is generated in the spring member 406 due to the pushdown operation of the key top 402 can be uniformly dispersed over the whole spring member 406 whereby the durability of the spring member 406 can be remarkably enhanced.

Further, the membrane switch 407 is configured to be operated by means of the spring member 406 which is curved downwardly along with the pushdown operation of the key top 402, it is no more necessary to form a pushdown projection for pushing the membrane switch 407 on the key top and hence, the thickness of the key switch 401 can be easily reduced.

Figure 51:
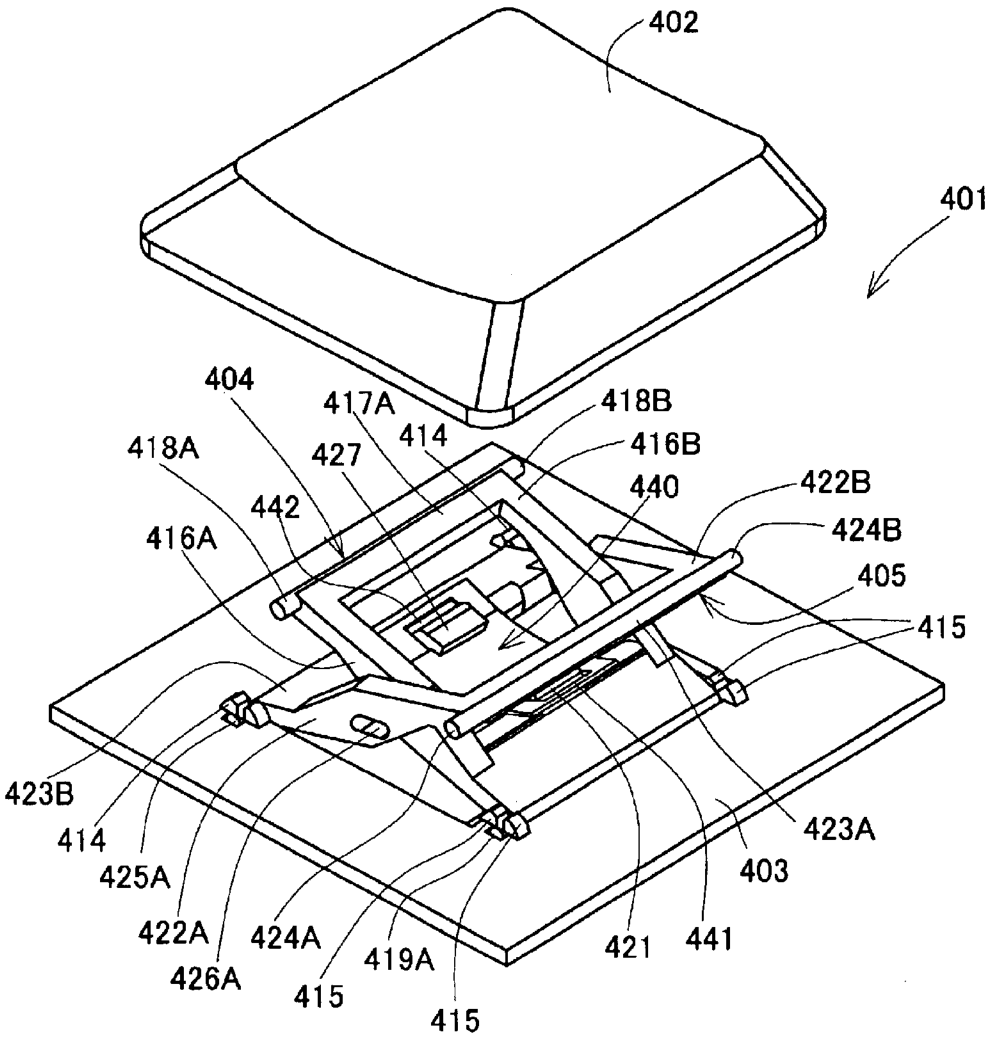
FIG. 51 is a perspective view of a key switch according to the sixth embodiment in a state that a key top is removed.
Figure 52:
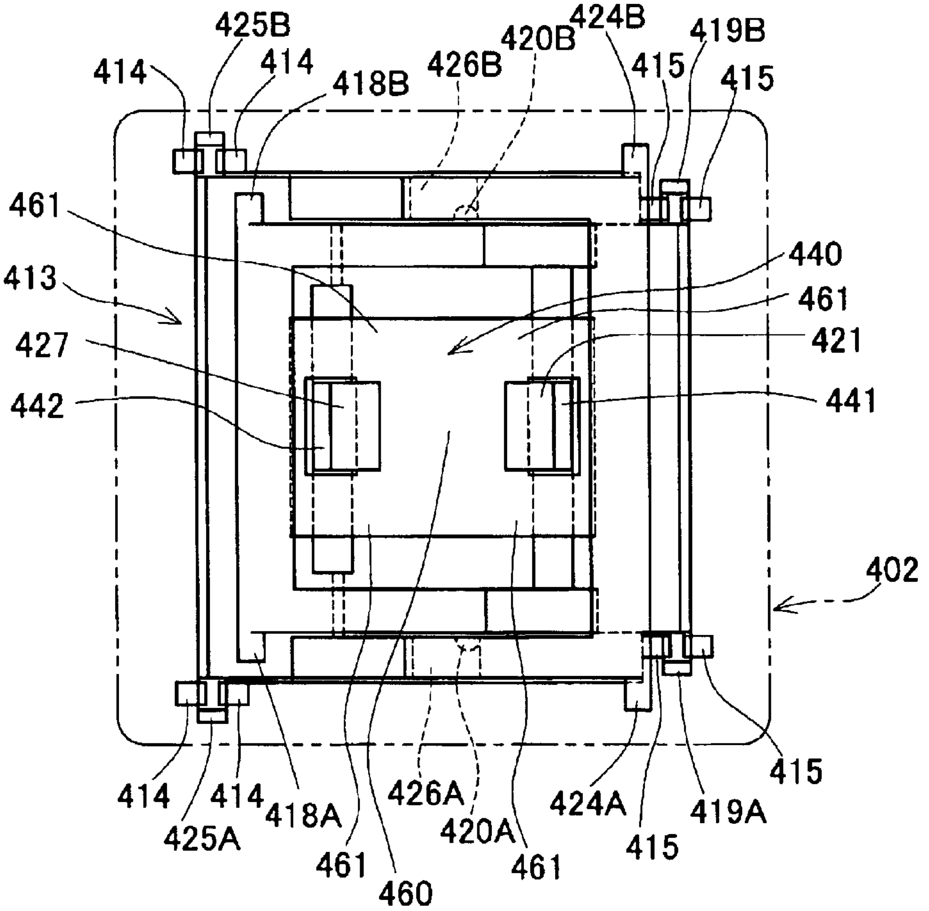
FIG. 52 is a plan view of the key switch in a state that the key top is removed.

Subsequently, a key switch according to the sixth embodiment is explained in conjunction with FIG. 51 to FIG. 54. FIG. 51 is a perspective view of the key switch according to the sixth embodiment in a state that a key top is removed, FIG. 52 is a plan view of the key switch in a state that the key top is removed, FIG. 53 is a cross-sectional side view of the key switch in a state that the key top is not pushed, and FIG. 54 is a cross-sectional side view of the key switch in a state that the key top is pushed down.

Here, the key switch according to the sixth embodiment is substantially identical with the key switch 401 according to the fifth embodiment. In the key switch 401 of the fifth embodiment, as the spring member which is extended between the spring holding portion 421 of the first link member 403 and the spring holding portion 427 of the second link member 405, the spring member 406 formed in an approximately circular shape is used. The key switch according to the sixth embodiment differs from the fifth embodiment only with respect to a point that the key switch according to the sixth embodiment uses the spring member having a rectangular shape. Accordingly, in the explanation made hereinafter, elements, parts and the like which are identical to those of the key switch 401 of the fifth embodiment are given same numerals and their explanation is omitted. That is, only the constitution peculiar to the key switch of the sixth embodiment is explained hereinafter.

The spring member 440 which is used in the key switch 401 of the sixth embodiment is, in the same manner as the fifth embodiment, formed of a thin resilient metal plate made of steel material or stainless steel and having an approximately rectangular shape in a plan view. As shown in FIG. 52, the spring member 440 has a pushing portion 460 at an approximately center portion thereof and a peripheral portion 461 is defined by the periphery of the pushing portion 460. The holding holes 441, 442 are formed in both sides of the spring member 440, wherein a spring holding portion 421 of the first link member 404 is loosely fitted into the holding hole 441 and a spring holding portion 427 of the second link member 405 is loosely fitted into the holding hole 442. In a state that the spring holding portion 421 is loosely fitted into the holding hole 441 and the spring holding portion 427 is loosely fitted into the holding hole 442, as shown in FIG. 53, the spring member 440 performs a function of biasing the key top 402 upwardly in a state that the spring member 440 is slightly curved downwardly due to a resilient force thereof.

Figure 53:
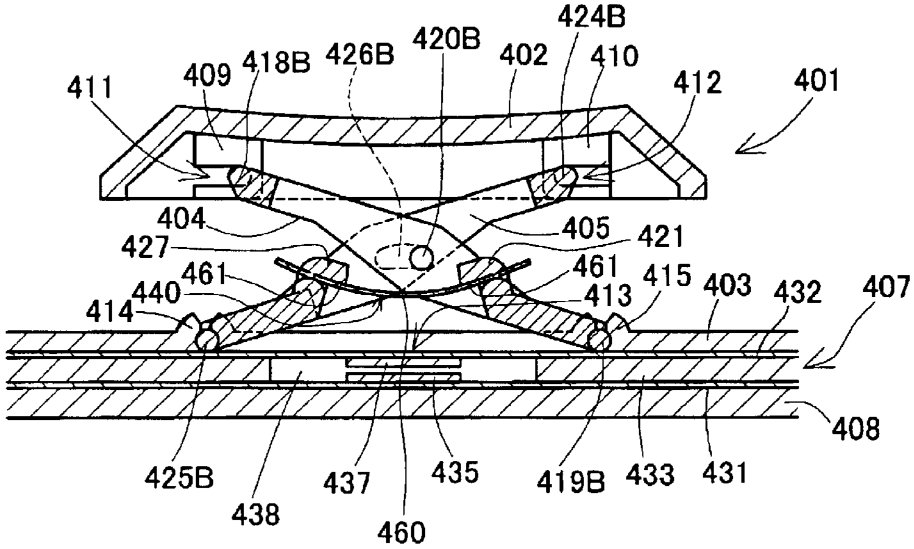
FIG. 53 is a cross-sectional side view of the key switch when the key top is in a non-pushdown state.
Figure 54:
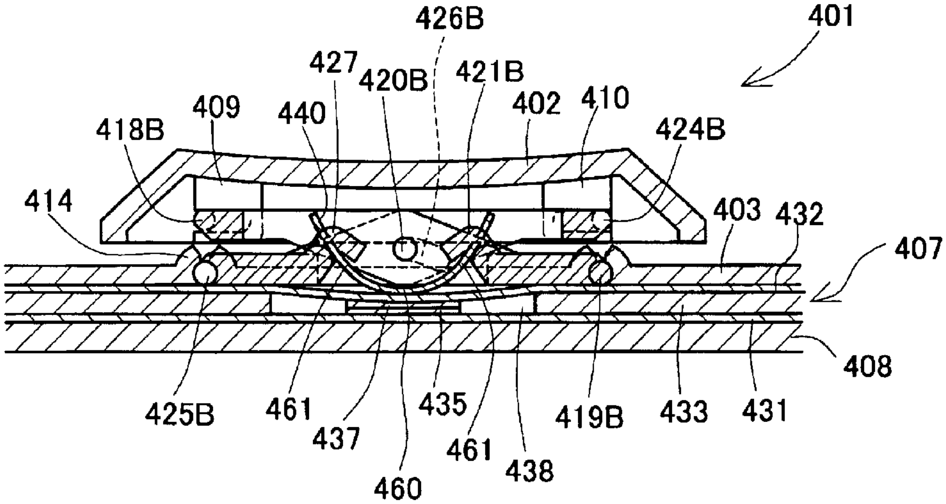
FIG. 54 is a cross-sectional side view of the key switch when the key top is in a pushdown state.

The manner of operation of the key switch 401 having the above-mentioned constitution is explained in conjunction with FIG. 53 and FIG. 54. In the state that the key top 402 is not pushed down, as shown in FIG. 53, the key top 402 is biased upwardly based on a resilient force of the spring member 440 so that the key top 402 can be held at the non-pushdown position. In such a non-pushdown position, respective engaging pins 418A, 418B of the first link member 404 which are engaged with the slide grooves 411 of slide engaging portions 409 in the key top 402 are brought into contact with the closed end faces 411A of the slide grooves 411, while respective engaging pins 424A, 424B of the second link member 405 which are engaged with the slide grooves 412 of respective slide engaging portions 410 are brought into contact with the closed end portions 412A of the slide grooves 412. Accordingly, the upward movement of the key top 402 is restricted. Here, as shown in FIG. 53, the spring member 440 is in a slightly downwardly curved state and hence, the pushing portion 460 and the peripheral portion 461 are held in a concave shape.

When the key top 402 is pushed downwardly against the biasing force of the spring member 440, respective engaging pins 418A, 418B of the first link member 404 are made to gradually slide in the right direction in the inside of the slide grooves 411 of slide engaging portions 409 and respective engaging pins 419A, 419B are rotated in a counterclockwise direction in the inside of sandwiching walls 415, 415. Simultaneously, respective engaging pins 424A, 424B of the second link member 405 are made to gradually slide in the right direction in the inside of the slide grooves 412 of the slide engaging portions 410 and respective engaging pins 425A, 425B are rotated in the clockwise direction in the inside of the sandwiching walls 414, 414. Corresponding to such rotation, the spring member 440 is gradually moved downwardly and the curved state of the spring member 440 is gradually increased.

When the key top 402 is further pushed down, the curved state of the spring member 440 is enlarged. Then, at a point of time that the pushing portion 460 which constitutes a lowermost end of the curved spring member 440 goes downwardly exceeding a line segment which connects the center of rotation of the respective engaging pins 419A, 419B of the first link member 404 which are engaged with the sandwiching walls 415, 415 and the center of rotation of the respective engaging pins 425A, 425B of the second link member 405 which are engaged with the sandwiching walls 414, 414, the pushing portion 460 which is positioned at the lowermost end of the curved spring member 440 pushes the upper electrode 437 of the upper membrane sheet 432 of the membrane switch 407 from an upper surface thereof with a clear click feeling. Accordingly, as shown in FIG. 54, the upper electrode 437 of the upper membrane sheet 432 and the lower electrode 435 of the lower membrane sheet 431 are brought into contact with each other through the switching hole 438 of the spacer sheet 433 whereby the switching operation is performed.

When the pushdown of the key top 402 is released, the operation opposite to the above-mentioned operation is performed based on the biasing force of the spring member 440 and hence, the key top 402 returns to the non-pushdown position shown in FIG. 53.

As has been explained above, in the key switch 401 according to the sixth embodiment, in the same manner as the fifth embodiment, with respect to the spring member 440 formed of the thin resilient metal plate which biases the key top 402 upwardly, at least the pushing portion 460 and the peripheral portion 461 are arranged in a convex shape as viewed from a side. Accordingly, the deformation direction of the spring member 440 can be ensured. Further, since the spring holding portions 421, 427 which function as deformation action portions are respectively formed on portions of the first link member 404 and the second link member 405 located at sides closer to the sandwiching walls 414, 415 of the holder member 403 than a crossing portion of both link members 404, 405 as viewed from a side, when the key top 402 is pushed down, the spring member 440 is deformed in a U-shape due to the spring holding portions 421, 427 of the link members 404, 405 and, at the same time, the pushing portion 460 of the spring member 440 is lowered whereby the switching operation can be surely performed.

Further, the spring member 440 which is formed of the thin resilient metal plate is extended between the spring holding portion 421 of the first link member 404 and the spring holding member 427 of the second link member 405 which guide the vertical movement of the key top 402, and the key top 402 is biased upwardly by means of such a spring member 440. Accordingly, it is possible to ensure the stable characteristics such as key operability over a long period without receiving the influence attributed to the use environment due to the high durability that the thin resilient metal plate has.

It is needless to say that the present invention is not limited to the above-mentioned respective embodiment and various improvements and modifications can be made without departing from the gist of the present invention.

For example, the membrane switches 1, 201, 401 according to the above-mentioned first, second, third, fifth and sixth embodiments are configured such that, between the upper membrane sheet 3, 203, 403 and the lower membrane sheet 2, 202, 402, the spacer sheet 4, 204, 404 which is formed of the PET film sheet in the same manner as both membrane sheets 3, 203, 403, 2, 202, 402 is inserted. However, in place of the spacer sheet 4, 204, 404, the spacer sheet may be constituted of an adhesive agent layer which is formed between the upper membrane sheet 3, 203, 403 and the lower membrane sheet 2, 202, 402 and adheres both membrane sheets 3, 203, 403, 2, 202, 402 thereto in a laminated manner. In this case, it is not necessary to form the adhesive agent layer on the whole adhesive surface of the upper membrane sheet 3, 203, 403 or the lower membrane sheet 2, 202, 402 and the adhesive agent layer may be formed of dot spacers which are dispersed in a dot pattern.

Further, in the membrane switch 201 of the above-mentioned second embodiment, the semispherical bulging portion 213 is formed on the spring sheet 205. However, the bulging portion 213 may be formed in a shape other than the semispherical shape such as a dome shape, a dish shape or the like.

Further, in the membrane switch 201 of the above-mentioned third embodiment, a pair of strip-like resilient cut-and-raised lugs 215 are formed on the spring sheet 205. However, the number of the resilient cut-and-raised lugs 215 is not limited to a pair and one or three or more resilient cut-and-raised lugs 215 may be formed. Further, the shape of the resilient cut-and-raised lugs 215 can be varied.

Still further, respective key switches 220 according to the second and third embodiments are configured such that the pushdown projection 233 is formed on the lower surface of the key top 221 and the bulging portion 213 or the resilient cut-and-raised portion 215 of the spring sheet 205 in the membrane switch 201 is pushed by way of the pushdown projection 233. However, the present invention is not limited to such a configuration. That is, a pushing portion may be formed on the first link member 223 or the second link member 224 and the bulging portion 213 or the resilient cut-and-raised lug 215 may be pushed by way of such a pushing portion.

Further, in the membrane switch 301 of the fourth embodiment, between the upper membrane sheet 303 and the lower membrane sheet 302, the spacer sheet 304 which is formed of the PET film sheet in the same manner as the upper membrane sheet 303 and the lower membrane sheet 302 is inserted and, at the same time, the air grooves 312 are formed by means of the adhesive agent layers 311 formed on the spacer sheet 304 by coating. However, without using the spacer sheet 304, the air grooves 312 may be formed using only the adhesive agent layer 311 which is formed between the upper membrane sheet 303 and the lower membrane sheet 302 by coating. Further, between the upper membrane sheet 303 and the lower membrane sheet 302, the adhesive agent layers 311 may be formed in a strip shape in plural rows and a slit-like groove formed between respective strip-like adhesive agent layers 311 may be used as the air groove 312.

What is claimed is:

1. A membrane switch comprising:

a lower membrane sheet which forms a lower electrode on an upper surface thereof;

an upper membrane sheet which forms an upper electrode on a lower surface thereof corresponding to the lower electrode; and a spacer layer which is provided between the lower membrane sheet and the upper membrane sheet and in which a switching hole is formed corresponding to the lower electrode and the upper electrode, and makes the lower electrode and the upper electrode spaced apart from each other by way of the switching hole, wherein a spring sheet formed of a thin metal plate is arranged over the upper membrane sheet, the spring sheet having a switching portion corresponding to the upper electrode, and wherein a pair of slits are discontinuously formed in the spring sheet corresponding to both sides of the upper electrode of the upper membrane sheet so that a pushdown load applied to the switching portion of the spring sheet is concentrated thereto based on a function of the slits.

2. A membrane switch according to claim 1, wherein a semispherical bulging portion is formed between the slits in the spring sheet corresponding to the upper electrode, the semispherical bulging portion being connected to the spring sheet through a connecting portion existing therebetween, and wherein the connecting portion becomes the switching portion and pushes the upper membrane sheet when a pushdown load is applied to the semispherical bulging portion.

3. A membrane switch according to claim 1, wherein a pair of resilient cut-and-raised lugs are formed between the slits in the spring sheet corresponding to the upper electrode.

4. A key switch comprising:

a key top which forms a pushdown projection on a lower surface thereof;

a holder member which is arranged below the key top and forms an opening therein corresponding to the pushdown projection;

a first link member and a second link member which are movably engaged with and connected to a lower surface of the key top and the holder member and guide the vertical movement of the key top;

a spring member which biases the key top upwardly; and a membrane switch including a lower membrane sheet which is arranged below the holder member and forms a lower electrode on an upper surface thereof corresponding to the opening, an upper membrane sheet which forms an upper electrode on a lower surface thereof corresponding to the lower electrode, and a spacer layer which is disposed between the lower membrane sheet and the upper membrane sheet, forms a switching hole corresponding to the lower electrode and the upper electrode spaced apart from each other by way of the switching hole;

wherein the key switch performs a switching operation such that by pushing down the key top against a biasing force of the spring member, the upper electrode and the lower electrode are brought into contact with each other by way of the pushdown projection through the opening, wherein a spring sheet formed of a thin metal plate is arranged over the upper membrane sheet, the spring sheet having a switching portion corresponding to the upper electrode, and wherein a pair of slits are discontinuously formed in the spring sheet corresponding to both sides of the upper electrode of the upper membrane sheet so that a pushdown load applied to the switching portion of the spring sheet is concentrated thereto based on a function of the slits.

5. A key board including at least one key switch described in claim 4.

6. A key switch according to claim 4, wherein a semispherical bulging portion is formed between the slits in the spring sheet corresponding to the upper electrode, the semispherical bulging portion being connected to the spring sheet through a connecting portion existing therebetween, and wherein the connecting portion becomes the switching portion and pushes the upper membrane sheet when a pushdown load is applied to the semispherical bulging portion.

7. A keyboard including at least one key switch described in claim 6.

8. A key switch according to claim 4, wherein a pair of resilient cut-and raised lugs are formed between the slits in the spring sheet corresponding to the upper electrode.

9. A keyboard including at least one key switch described in claim 8.

10. A personal computer comprising:

a keyboard which inputs various data such as characters, symbols or the like, the keyboard including key switches, each of key switches comprising, a key top which forms a pushdown projection on a lower surface thereof, a holder member which is arranged below the key top and forms an opening therein corresponding to the pushdown projection, a first link member and a second link member which are movably engaged with and connected to a lower surface of the key top and the holder member and guide the vertical movement of the key top, a spring member which biases the key top upwardly, and a membrane switch including a lower membrane sheet which is arranged below the holder member and forms a lower electrode on an upper surface thereof corresponding to the opening, an upper membrane sheet which forms an upper electrode on a lower surface thereof corresponding to the lower electrode, and a spacer layer which is disposed between the lower membrane sheet and the upper membrane sheet, forms a switching hole corresponding to the lower electrode and the upper electrode, and makes the lower electrode and the upper electrode spaced apart from each other by way of the switching hole, the key switch performing a switching operation such that by pushing down the key top against a biasing force of the spring member, the upper electrode and the lower electrode are brought into contact with each other by way of the pushdown projection through the opening, and the key switch further including a spring sheet made of a thin metal plate which is arranged over the upper membrane sheet, the spring sheet having a switching portion corresponding to the upper electrode, and a pair of slits are discontinuously formed in the spring sheet corresponding to both sides of the upper electrode of the upper membrane sheet so that a pushdown load applied to the switching portion of the spring sheet is concentrated thereto based on a function of the slits, display means which displays characters and symbols or the like, and control means which makes the display means display the characters, symbols or the like based on input data from the keyboard.

11. A personal computer according to claim 10, wherein a semispherical bulging portion is formed between the slits in the spring sheet corresponding to the upper electrode, the semispherical bulging portion being connected to the spring sheet through a connecting portion existing therebetween, and wherein the connecting portion becomes the switching portion and pushes the upper membrane sheet when a pushdown load is applied to the semispherical bulging portion.

12. A membrane switch comprising:

a lower membrane sheet which forms a lower electrode on an upper surface thereof;

an upper membrane sheet which forms an upper electrode on a lower surface thereof corresponding to the lower electrode; and a spacer layer which is disposed between the lower membrane sheet and the upper membrane sheet, forms a switching hole therein corresponding to the lower electrode and the upper electrode, and makes the lower electrode and the upper electrode spaced apart from each other by way of the switching hole, wherein air grooves are formed in the spacer layer and air bleeding holes are formed in the lower membrane sheet such that the air bleeding holes are positioned inside the air grooves, and wherein the switching hole is formed larger than the lower electrode and at least one of a plurality of air bleeding holes is arranged in the inside of the switching hole.

13. A membrane switch according to claim 12, wherein the air grooves are communicated with the outside and the switching hole and, at the same time, the air grooves are formed in a plural number using the switching hole as a start point, and the air bleeding holes are continuously formed in a plural number in and along respective air grooves.

14. A key switch comprising:

a key top which forms a pushdown projection on a lower surface thereof;

a holder member which is arranged below the key top and forms an opening therein corresponding to the pushdown projection;

a first link member and a second link member which are movably engaged with and connected to a lower surface of the key top and the holder member and guide the vertical movement of the key top;

a spring member which biases the key top upwardly;

a membrane switch including a lower membrane sheet which is arranged below the holder member and forms a lower electrode on an upper surface thereof corresponding to the opening, an upper membrane sheet which forms an upper electrode on a lower surface thereof corresponding to the lower electrode, and a spacer layer which is disposed between the lower membrane sheet and the upper membrane sheet, forms a switching hole corresponding to the lower electrode and the upper electrode, and makes the lower electrode and the upper electrode spaced apart from each other by way of the switching hole, wherein the key switch performs a switching operation such that by pushing down the key top against a biasing force of the spring member, the upper electrode and the lower electrode are brought into contact with each other by way of the pushdown projection through the opening, and wherein air grooves are formed in the spacer layer, and air bleeding holes are formed in the lower membrane sheet such that the air bleeding holes are arranged in the inside of the air grooves.

15. A key switch according to claim 14, wherein the air grooves are communicated with the outside and the switching hole and, at the same time, the air grooves are formed in a plural number using the switching hole as a start point, and the air bleeding holes are continuously formed in a plural number in and along respective air grooves.

16. A key switch according to claim 15, wherein the switching hole is formed larger than the lower electrode and at least one of a plurality of air bleeding holes is arranged in the inside of the switching hole.

17. A key board including at least one of the key switches described in claim 14.

18. A personal computer comprising:

a keyboard which inputs various data such as characters, symbols or the like, the keyboard including key switches, each of key switches comprising:

a key top which forms a pushdown projection on a lower surface thereof, a holder member which is arranged below the key top and forms an opening therein corresponding to the pushdown projection, a first link member and a second link member which are movably engaged and connected to a lower surface of the key top and the holder member and guide the vertical movement of the key top, a spring member which biases the key top upwardly, and a membrane switch including a lower membrane sheet which is arranged below the holder member and forms a lower electrode on an upper surface thereof corresponding to the opening, an upper membrane sheet which forms an upper electrode on a lower surface thereof corresponding to the lower electrode, and a spacer layer which is disposed between the lower membrane sheet and the upper membrane sheet, forms a switching hole corresponding to the lower electrode and the upper electrode, and makes the lower electrode and the upper electrode spaced apart from each other by way of the switching hole, the key switch performing a switching operation such that by pushing down the key top against a biasing force of the spring member, the upper electrode and the lower electrode are brought into contact with each other by way of the pushdown projection through the opening, and air grooves are formed in the spacer layer and air bleeding holes are formed in the lower membrane sheet such that the air bleeding holes are positioned in the inside of the air grooves, display means which displays characters and symbols or the like, and control means which makes the display means display the characters, symbols or the like based on input data from the keyboard.

19. A key switch comprising:

a key top which forms a plurality of slide engaging portions on a lower surface thereof, a holder member which is arranged below the key top and forms a plurality of rotary engaging portions thereon, first and second link members which are engaged with the slide engaging portions of the key top and the rotary engaging portions of the holder member respectively, cross each other in an X shape as viewed from a side, and guides a vertical movement of the key top, a switching portion which performs a switching operation based on a pushdown operation of the key top, and a spring member which is formed of a thin resilient metal plate, biases the key top upwardly, and includes a pushing portion which performs the switching operation by acting on the switch portion at the time of pushing down the key top at a center portion thereof, wherein at least a pushing portion of the spring member and a peripheral portion thereof are arranged in a concave shape as viewed from a side, and deformation action portions which deforms the spring member in a U-shape at the time of pushing down the key top are provided to portions of the first link member and the second link member at sides thereof disposed closer to the rotary engaging portion sides than a crossing portion of both link members as viewed from a side.

20. A key switch according to claim 19, wherein a first holding portion is formed an the first link member and a second holding portion is formed on the second link member, and the spring member is extended between the first holding portion and the second holding portion so as to form the first holding portion and the second holding portion into the deformation action portions.

21. A key switch according to claim 20, wherein a first holding hole into which the first holding portion is loosely fitted and a second holding hole into which the second holding portion is loosely fitted are formed in the spring member, and the spring member is formed such that a width thereof is gradually increased toward a center portion thereof from the first holding hole and the second holding hole.

22. A key switch according to claim 19, wherein the above-mentioned spring member is formed in an approximately circular shape in a plan view.

23. A key switch according to claim 19, wherein the switching portion is constituted of a membrane switch which is arranged below the holder member and the spring member is curved downwardly along with the pushdown operation of the key top so as to operate the membrane switch.

24. A keyboard including at least one key switch described in claim 19.

25. A personal computer comprising:

a keyboard which inputs various data such as characters, symbols or the like, the keyboard including key switches, each of the key switches comprising:

a key top which forms a plurality of slide engaging portions on a lower surface thereof, a holder member which is arranged below the key top and forms a plurality of rotary engaging portions thereon, first and second link members which are engaged with the slide engaging portions of the key top and the rotary engaging portions of the holder member respectively, cross each other in an X shape as viewed from a side, and guides a vertical movement of the key top, a switching portion which performs a switching operation based on a pushdown operation of the key top, and a spring member which is formed of a thin resilient metal plate, biases the key top upwardly, and includes a pushing portion which performs the switching operation by acting on the switch portion at the time of pushing down the key top at a center portion thereof, wherein at least the pushing portion of the spring member and a peripheral portion thereof are arranged in a concave shape as viewed from a side, and deformation action portions which deform the spring member in a U-shape at the time of pushing down the key top are provided to portions of the first link member and the second link member at sides thereof disposed closer to the rotary engaging portion sides than a crossing portion of both link members as viewed from a side, display means which displays characters and symbols or the like; and control means which makes the display means display the characters, symbols or the like based on input data from the keyboard.

* * * * *